(12) United States Patent
Lee et al.

(10) Patent No.: US 12,486,429 B2
(45) Date of Patent: Dec. 2, 2025

(54) CERIUM OXIDE PARTICLES, CHEMICAL MECHANICAL POLISHING SLURRY COMPOSITION COMPRISING SAME, AND METHOD FOR MANUFACTURING SEMICONDUCTOR DEVICE

(71) Applicant: SOULBRAIN CO., LTD., Seongnam-si (KR)

(72) Inventors: Jeong Ho Lee, Seongnam-si (KR); Seok Joo Kim, Seongnam-si (KR)

(73) Assignee: SOULBRAIN CO., LTD., Seongnam-si (KR)

( * ) Notice: Subject to any disclaimer, the term of this patent is extended or adjusted under 35 U.S.C. 154(b) by 186 days.

(21) Appl. No.: 18/022,929

(22) PCT Filed: Aug. 30, 2021

(86) PCT No.: PCT/KR2021/011621
§ 371 (c)(1),
(2) Date: Feb. 23, 2023

(87) PCT Pub. No.: WO2022/045856
PCT Pub. Date: Mar. 3, 2022

(65) Prior Publication Data
US 2023/0348753 A1    Nov. 2, 2023

(30) Foreign Application Priority Data

Aug. 31, 2020 (KR) .................. 10-2020-0110237
Mar. 25, 2021 (KR) .................. 10-2021-0039098

(Continued)

(51) Int. Cl.
  C09G 1/02    (2006.01)
  C01F 17/235  (2020.01)
  (Continued)

(52) U.S. Cl.
  CPC .............. *C09G 1/02* (2013.01); *C01F 17/235* (2020.01); *C09K 3/1409* (2013.01);
  (Continued)

(58) Field of Classification Search
  None
  See application file for complete search history.

(56) References Cited

U.S. PATENT DOCUMENTS

| | | | |
|---|---|---|---|
| 6,372,003 B1 | 4/2002 | Kasai et al. | |
| 2010/0058671 A1* | 3/2010 | Ogura | B82Y 30/00 51/309 |
| 2012/0322346 A1* | 12/2012 | Iwano | H01L 21/31053 451/36 |

FOREIGN PATENT DOCUMENTS

| | | |
|---|---|---|
| CN | 101550318 B | 11/2012 |
| KR | 10-2008-0045326 A | 5/2008 |

(Continued)

*Primary Examiner* — Roberts P Culbert
(74) *Attorney, Agent, or Firm* — Bridgeway IP Law Group, PLLC; Jihun Kim

(57) ABSTRACT

Proposed are cerium oxide particles for chemical mechanical polishing and a slurry composition for chemical mechanical polishing comprising the same. The surfaces of the cerium oxide particles comprise $Ce^{3+}$ and $Ce^{4+}$. When the cerium oxide particles are used, they may exhibit a high oxide removal rate and high oxide selectivity in a low particle content range despite their fine particle size as a result of increasing the proportion of $Ce^{3+}$ on the cerium oxide surface.

13 Claims, 44 Drawing Sheets

(30) Foreign Application Priority Data

Jun. 21, 2021 (KR) .................. 10-2021-0080091
Jul. 2, 2021 (KR) .................. 10-2021-0087353

(51) Int. Cl.
*C09K 3/14* (2006.01)
*H01L 21/306* (2006.01)

(52) U.S. Cl.
CPC .... *H01L 21/30625* (2013.01); *C01P 2002/72* (2013.01); *C01P 2002/74* (2013.01); *C01P 2002/82* (2013.01); *C01P 2002/84* (2013.01); *C01P 2002/85* (2013.01); *C01P 2002/90* (2013.01); *C01P 2004/03* (2013.01); *C01P 2004/04* (2013.01); *C01P 2004/64* (2013.01); *C01P 2006/22* (2013.01); *C01P 2006/60* (2013.01)

(56) References Cited

FOREIGN PATENT DOCUMENTS

| | | |
|---|---|---|
| KR | 10-2012-0081196 A | 7/2012 |
| KR | 10-1184734 B1 | 9/2012 |
| TW | 201710421 A | 3/2017 |
| TW | 201840804 A | 11/2018 |
| TW | 201940652 A | 10/2019 |
| WO | 2019/182061 A1 | 9/2019 |

* cited by examiner (1) Before CMP (2) After first CMP
- After bulk CMP (3) After second CMP
- After stopping CMP (4) After third CMP
- After buffing CMP

CERIUM OXIDE PARTICLES, CHEMICAL MECHANICAL POLISHING SLURRY COMPOSITION COMPRISING SAME, AND METHOD FOR MANUFACTURING SEMICONDUCTOR DEVICE

TECHNICAL FIELD

The present invention relates to cerium oxide particles for chemical mechanical polishing, a slurry composition for chemical mechanical polishing containing the same, and a method of fabricating a semiconductor device, and more particularly, to a slurry composition for chemical mechanical polishing containing cerium oxide particles that exhibit a high oxide removal rate even at a low cerium oxide particle content despite their small particle size as a result of increasing the proportion of Ce3+ on the cerium oxide surface through synthesis, unlike conventional cerium oxide particles, and a method of fabricating a semiconductor device using the same.

BACKGROUND ART

As semiconductor devices have been diversified and highly integrated, technologies for forming finer patterns have been used. Accordingly, surface structures of semiconductor devices have become more complex, and the flatness between layers in each process has acted as an important factor to improve the precision of photolithography. In fabrication of a semiconductor device, a chemical mechanical polishing (CMP) process is used as this planarization technology. For example, it is widely used in a process for removing an excessively formed dielectric layer for interlayer insulation, an interlayer dielectric (ILD) process, a process for planarizing a dielectric layer for shallow trench isolation (STI) for insulation between chips, and processes for forming metal conductive layers such as interconnects, contact plugs or via contacts.

In the CMP process, the removal rate, the flatness of a polished, and the degree of occurrence of scratches are important, which are determined by CMP process conditions, the type of slurry, the type of polishing pad, and the like. High-purity cerium oxide particles are used for cerium oxide slurries. In recent years, in semiconductor device fabrication processes, it has been required to achieve higher miniaturization of interconnects, and polishing scratches generated during polishing have become a problem.

Conventional cerium oxide slurries contain particles of 30 nm to 200 nm in size. Even if fine polishing scratches occur during polishing using the conventional slurry, they pose no problem as long as they are smaller than the conventional wire width, but become a problem in the case where higher miniaturization of interconnects is tried to be achieved. To overcome this problem, attempts have been made to reduce the average particle diameter of cerium oxide particles. However, in the case of conventional particles, if the average particle diameter is reduced, a problem arises in that the removal rate is decreased due to a decrease in the mechanical action of the particles.

Even if the polishing rate and polishing scratches are controlled by controlling the average particle diameter of cerium oxide particles as described above, it is extremely difficult to achieve the target level of polishing scratches while maintaining the removal rate.

In addition, conventional slurry compositions for chemical mechanical polishing fail to suggest an optimized level of average particle diameter while optimizing the $Ce^{3+}$ to $Ce^{4+}$ ratio in cerium oxide particles. Therefore, it is necessary to study a polishing slurry containing cerium oxide particles that exhibit a high oxide removal rate despite their small particle size as a result of increasing the proportion of $Ce^{3+}$ on the surface of cerium oxide.

DISCLOSURE

Technical Problem

The present invention has been made to solve the above-described problems, and one embodiment of the present invention provides cerium oxide particles for chemical mechanical polishing.

Another embodiment of the present invention provides a slurry composition for chemical mechanical polishing.

Still another embodiment of the present invention provides a method of fabricating a semiconductor device comprising a step of polishing using the slurry composition for chemical mechanical polishing.

Yet another embodiment of the present invention provides a semiconductor device.

Still yet another embodiment of the present invention provides a method for producing cerium oxide particles for chemical mechanical polishing.

However, technical problems to be solved by the present invention are not limited to the above-mentioned technical problems, and other technical problems not mentioned herein will be clearly understood by those of ordinary skill in the art to which the present invention pertains from the following description.

Technical Solution

As a technical means for achieving the above-described technical problems, one aspect of the present invention provides
 cerium oxide particles for chemical mechanical polishing,
  the cerium oxide particles having a light transmittance of 50% or more for light having a wavelength of 500 nm, as measured for an aqueous dispersion containing 10 wt % of the cerium oxide particles.

The cerium oxide particles may have a light transmittance of 50% or more for light having a wavelength of 450 to 800 nm, as measured for an aqueous dispersion containing 1.0 wt % of the cerium oxide particles.

When the cerium oxide particles are contained in a polishing slurry for chemical mechanical polishing, the polishing slurry for chemical mechanical may be transparent.

When the cerium oxide particles are contained in a polishing slurry for chemical mechanical polishing, they may be monodispersed.

The cerium oxide particles may have a secondary particle size of 1 to 30 nm, as measured by a dynamic light scattering (DLS) particle size analyzer.

The cerium oxide particles may have a secondary particle size of 1 to 20 nm, as measured by a dynamic light scattering (DLS) particle size analyzer.

The cerium oxide particles may have a primary particle size of 0.5 to 15 nm, as measured by X-ray diffraction (XRD) analysis.

The cerium oxide particles may have a particle size of 10 nm or less, as determined by transmission electron microscopy (TEM) analysis.

The cerium oxide particles may have a particle size of 0.5 to 15 nm, as determined by small-angle X-ray scattering (SAXS) analysis.

The cerium oxide particles may have an infrared transmittance of 90% or more in the range of 3,000 cm$^{-1}$ to 3,600 cm$^{-1}$ and an infrared transmittance of 96% or less in the range of 720 cm$^{-1}$ to 770 cm$^{-1}$, in a spectrum measured by Fourier transform infrared (FT-IR) spectroscopy.

When the surfaces of the cerium oxide particles are analyzed by X-ray photoelectron spectrometry (XPS), XPS peaks that represent the Ce—O binding energy representing Ce$^{3+}$ may include a first peak at 900.2 to 902.2 eV, a second peak at 896.4 to 898.4 eV, a third peak at 885.3 to 887.3 eV, and a fourth peak at 880.1 to 882.1 eV.

When the surfaces of the cerium oxide particles are analyzed by X-ray photoelectron spectrometry (XPS), the ratio of the sum of XPS peak areas, which represent the Ce—O binding energy representing Ce$^{3+}$, to the sum of XPS peak areas which represent the Ce—O binding energy on the surfaces, may be 0.29 to 0.70.

The cerium oxide particles may have a first Raman peak in the band range of 455 cm$^{-1}$ to 460 cm$^{-1}$.

The cerium oxide particles may have a second Raman peak in the band range of 586 cm$^{-1}$ to 627 cm$^{-1}$.

The cerium oxide particles may have a third Raman peak in the band range of 712 cm$^{-1}$ to 772 cm$^{-1}$.

The ratio (A/B) of the intensity of the first Raman peak (A) to the intensity of the second Raman peak (B) may be 25 or less.

The ratio (A/C) of the intensity of the first Raman peak (A) to the intensity of the third Raman peak (C) may be 50 or less.

The electron energy loss spectroscopy (EELS) spectrum of the cerium oxide particles may include a first peak at 876.5 to 886.5 eV and a second peak at 894.5 to 904.5 eV, wherein the maximum intensity of the first peak may be greater than the maximum intensity of the second peak.

The electron energy loss spectroscopy (EELS) spectrum of the cerium oxide particles may further include a third peak at 886.5 to 889.5 eV and a fourth peak at 904.5 to 908.5 eV, and the ratio $((P_1+P_2)/P_t)$ of the sum of the area $(P_1)$ of the third peak region and the area $(P_2)$ of the fourth peak region to the total area $(P_t)$ of the peaks in the spectrum may be 0.1 or less.

The ratio $(A_3/(A_3+A_4))$ of the area $(A_3)$ of a peak representing Ce$^{3+}$ to the sum of the area $(A_3)$ of the peak representing Ce$^{3+}$ and the area of a peak representing Ce$^{4+}$, in the X-ray absorption fine structure (XAFS) spectrum of the cerium oxide particles, may be 0.03 or more.

The ratio $(A_3/(A_3+A_4))$ of the area $(A_3)$ of a peak representing Ce$^{3+}$ to the sum of the area $(A_3)$ of the peak representing Ce$^{3+}$ and the area $(A_4)$ of a peak representing Ce$^{4+}$, in the X-ray absorption fine structure (XAFS) spectrum of the cerium oxide particles, may be 0.1 or more.

The cerium oxide particles may have a maximum light absorbance coefficient of a first peak in the range of 5,730 eV or more to less than 5,740 eV, as determined by the XAFS spectrum, wherein the maximum light absorption coefficient of the first peak may be 0.1 to 0.4.

The cerium oxide particles may have a maximum light absorbance coefficient of a second peak in the range of 5,740 eV or more to less than 5,760 eV, as determined by the XAFS spectrum, wherein the maximum light absorption coefficient of the second peak may be less than 0.6.

When the cerium oxide particles are analyzed by ultraviolet photoelectron spectroscopy (UPS), the maximum value of the number of photoelectrons (counts) emitted per second may be in a kinetic energy range of 10 eV or less.

When the cerium oxide particles are analyzed by ultraviolet photoelectron spectroscopy (UPS), the maximum value of the number of photoelectrons (counts) emitted per second may be in a kinetic energy range of 3 to 10 eV.

The cerium oxide particles may show a work function value of 3.0 eV to 10.0 eV, as determined by UPS analysis.

The cerium oxide particles may have a BET surface area of 50 m$^2$/g or less.

The cerium oxide particles may have an apparent density of 2.00 to 5.00 g/ml, as measured by a stationary method.

The cerium oxide particles may have a tap density of 2.90 to 5.00 g/ml.

When the photoluminescence (PL) intensity of the cerium oxide particles at a wavelength of 325 nm is measured for an aqueous dispersion containing 1.0 wt % of the cerium oxide particles, the maximum intensity of a first peak $(\lambda_1)$ at a wavelength of 435 to 465 nm may be in the range of 0.1 to 30.

When the photoluminescence (PL) intensity of the cerium oxide particles at a wavelength of 325 nm is measured for an aqueous dispersion containing 1.0 wt % of the cerium oxide particles, the maximum intensity of a second peak $(\lambda_2)$ at a wavelength of 510 to 540 nm may be in the range of 0.1 to 10.

The intensity ratio $(\lambda_1/\lambda_2)$ of the first peak $(\lambda_1)$ at a wavelength of 435 to 465 nm to the second peak $(\lambda_2)$ at a wavelength of 510 to 540 nm may be 5 to 15.

When the color of an aqueous solution containing 1.0 wt % of the cerium oxide particles is expressed in the L*a*b* color system, the L* value may be 95 or more, and the b* value may be 10 to 25.

(L* represents lightness, a* represents redness, and b* represents yellowness)

a* may be −12 to −3.

When an aqueous dispersion containing 1.0 wt % of the cerium oxide particles is centrifuged at a centrifugal force of 4,250 G for 30 minutes, the sedimentation rate of the cerium oxide particles may be 25 wt % or less.

Another aspect of the present invention provides
a slurry composition for chemical mechanical polishing containing: cerium oxide particles; and a solvent, wherein the cerium oxide particles have a light transmittance of 50% or more for light having a wavelength of 500 nm, as measured for an aqueous dispersion containing 1.0 wt % of the cerium oxide particles.

The cerium oxide particles may be contained in an amount of 0.01 to 5 parts by weight based on 100 parts by weight of the slurry composition.

The composition may have a pH of 2 to 10.

The slurry composition for chemical mechanical polishing may further contain at least one selected from among at least one inorganic acid selected from the group consisting of sulfuric acid, hydrochloric acid, nitric acid, and phosphoric acid, at least one organic acid selected from the group consisting of acetic acid, citric acid, glutaric acid, glycolic acid, formic acid, lactic acid, malic acid, malonic acid, maleic acid, oxalic acid, phthalic acid, succinic acid, and tartaric acid, at least one amino acid selected from the group consisting of lysine, glycine, alanine, arginine, valine, leucine, isoleucine, methionine, cysteine, proline, histidine, phenylalanine, serine, tricine, tyrosine, aspartic acid, tryptophan, and aminobutyric acid, imidazole, alkyl amines, alcohol amines, quaternary amine hydroxides, ammonia, or combinations thereof.

The solvent may be deionized water.

The slurry composition for chemical mechanical polishing may have a silicon oxide removal rate of 1,000 to 5,000 Å/min.

Still another aspect of the present invention provides a slurry composition for chemical mechanical polishing containing: cerium oxide particles; and a solvent, wherein the cerium oxide particles are produced by a wet process, and the content of precursor material in the slurry composition may be 300 ppm or less on a weight basis.

The cerium oxide particles may be contained in an amount of 0.001 to 5 wt % based on the total weight of the slurry composition for chemical mechanical polishing.

Yet another aspect of the present invention provides
a slurry composition for chemical mechanical polishing containing: cerium oxide particles; a solvent; and a cationic polymer.

The oxide removal rate of the slurry composition may increase depending on the content of the cationic polymer.

The cationic polymer may increase the oxide-to-polysilicon selectivity.

The cationic polymer may be contained in an amount of 0.001 to 1 wt % based on the total weight of the slurry composition for chemical mechanical composition.

The cationic polymer may be a polymer or copolymer containing an amine group or an ammonium group.

The cationic polymer may be selected from among polydiallyldimethyl ammonium chloride, polyallylamine, polyethyleneimine, polydiallylamine, polypropyleneimine, polyacrylamide-co-diallydimethyl ammonium chloride, polyacrylamide, poly(trimethylammonio ethyl methacrylate), a dicyandiamide-diethylenetriamine copolymer, a diallyldimethylamine/hydrochloride-acrylamide copolymer, a dicyandiamide-formaldehyde copolymer, and combinations thereof.

The slurry composition for chemical mechanical polishing may have an oxide-to-polysilicon selectivity of 200 to 2,000.

Still yet another aspect of the present invention provides
a method for fabricating a semiconductor device, the method comprising a step of polishing using the slurry composition for chemical mechanical polishing.

A further aspect of the present invention provides
a semiconductor device comprising: a substrate; and a trench filled with a dielectric material on the substrate, wherein the trench is formed by polishing at least one layer, selected from the group consisting of a silicon oxide layer, a silicon nitride layer and a polysilicon layer, by using the slurry composition for chemical mechanical polishing, the slurry composition for chemical mechanical polishing contains cerium oxide particles and a solvent, and the cerium oxide particles have a light transmittance of 50% or more for light having a wavelength of 500 nm, as measured for an aqueous dispersion containing 1.0 wt % of the cerium oxide particles.

Another further aspect of the present invention provides
a method for producing cerium oxide particles for chemical mechanical polishing, the method comprising steps of: preparing a raw material precursor; and milling or precipitating cerium oxide particles in a solution containing the raw material precursor to obtain a dispersion of cerium oxide particles for chemical mechanical polishing, wherein the cerium oxide particles have a light transmittance of 50% or more for light having a wavelength of 500 nm, as measured for an aqueous dispersion containing 1.0 wt % of the cerium oxide particles.

Advantageous Effects

The cerium oxide particles according to one embodiment of the present invention, when contained in a slurry for chemical mechanical polishing, may exhibit a high oxide removal rate even at a low cerium oxide particle content despite their small particle size as a result of increasing the proportion of $Ce^{3+}$ on the cerium oxide surface.

According to one embodiment of the present invention, it is possible to provide cerium oxide particles for chemical mechanical polishing and a slurry composition for chemical mechanical polishing, which may minimize wafer surface defects and exhibit a maximized oxide removal rate while minimizing surface defects, unlike the correlation between surface defects and oxide removal rate, which is considered a trade-off relationship in a conventional art.

In addition, according to one embodiment of the present invention, it can be confirmed that, when a cationic polymer is added, the oxide removal rate is further increased and, at the same time, the oxide-to-polysilicon selectivity is increased. Considering that it is common knowledge in the prior art that a cationic polymer is added in order to ensure other properties while sacrificing the removal rate, these effects exhibited by the addition of the cationic polymer may be regarded as unique effects of the present invention.

Effects of the present invention are not limited to the above-described effects, and should be understood to include all effects that may be deduced from the features of the present invention, described in the detailed description of the present invention or the appended claims.

BRIEF DESCRIPTION OF DRAWINGS

FIG. 41 shows the results of measuring the photoluminescence (PL) intensity of cerium oxide particles according to Comparative Example 4.

BEST MODE

Figure 1:
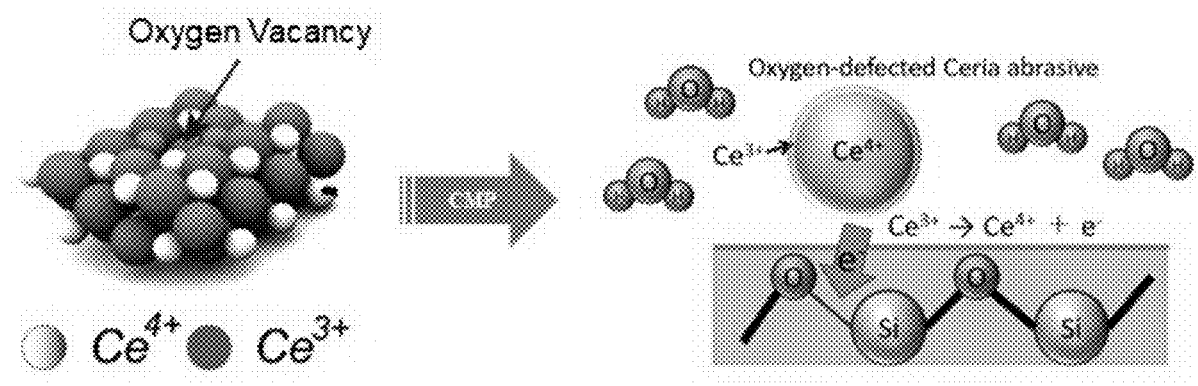
FIG. 1 illustrates an oxide removal mechanism according to one example of the present invention.

Hereinafter, examples of the present invention will be described in detail so that those skilled in the art can easily carry out the present invention. However, the present invention may be embodied in various different forms and is not limited to the embodiments described herein.

Preparation Example 1. Production of Cerium Oxide Particles

Cerium oxide particles according to one embodiment of the present invention may be chemically synthesized in a bottom-up manner. In examples of the present invention, cerium oxide particles were produced by any one method selected from the following methods for producing cerium oxide particles.

In a production method according to one example of the present application, first, about 2 to 4 kg of cerium nitrate was first added to a sufficient amount of deionized water and stirred. The precursor solution was adjusted to a pH of 1.0 or less by adding nitric acid thereto. Ammonia water was added to the resulting mixture and stirred until a precipitate was formed. It was confirmed that the pH of the stirred mixture was strongly acidic (2 or less), and the product rapidly precipitated when left after completion of stirring. After removing the supernatant except for the precipitate, a certain amount of deionized water was added to the precipitate, and a light yellow dispersion of cerium oxide particle dispersions was produced. The produced dispersion was filtered through a membrane filter to obtain a transparent yellow cerium oxide dispersion.

In a production method according to another embodiment of the present application, 150 g of cerium oxide or cerium hydroxide was first dispersed in 3 kg of deionized water and stirred to such an extent that particles did not precipitate. Nitric acid was added to the mixture until the pH reached 1.0 or less. The mixture was added to a mill filled with 0.05-mm zirconia beads and milled while circulating at 4,000 rpm. It was observed that, as the milling progressed, the white opaque cerium oxide dispersion changed gradually into a yellow transparent cerium oxide dispersion. After completion of the milling, the produced yellow transparent cerium oxide dispersion was filtered through a membrane filter to obtain a pure yellow transparent cerium oxide dispersion.

In a production method according to still another embodiment of the present invention, about 2 to 4 kg of ceric ammonium nitrate was added to a sufficient amount of ethanol and stirred. An imidazole solution was added to the precursor solution and stirred until a precipitate was formed. It was confirmed that the pH of the stirred mixture was strongly acidic (2 or less), and the product rapidly precipitated when left after completion of stirring. After removing the supernatant except for the precipitate, a certain amount of deionized water was added to the precipitate, and a dispersion of cerium oxide particles was produced. The produced dispersion was filtered through a membrane filter to obtain a transparent cerium oxide dispersion.

In a production method according to yet another embodiment of the present invention, 1.1 kg of cerium nitrate and 10 kg of deionized water were first mixed together in a reactor. The reactor was maintained at a stirring speed of 200 rpm and room temperature. A 1:1 mixture of 25% ammonia Solution and deionized water was prepared and then added to the reactor until the pH reached 7.0. After stirring for 1 hour, a 1:1 mixture of 70% nitric acid and deionized water was added to the reactor until the pH reached 1.0. The temperature of the reactor was increased to 100° C., followed by reaction for 4 hours. During the reaction, yellow transparent cerium oxide nanoparticles were produced while light purple macroparticles were dissociated. The obtained particles were filtered through a membrane filter to remove impurities, thus obtaining a dispersion of pure cerium oxide nanoparticles.

Preparation Example 2. Preparation of CMP Slurry Containing Cerium Oxide Particles The cerium oxide particles produced in Production Example 1 were added to deionized water at an abrasive concentration of 0.05 wt %, and the pH was adjusted by adding triethanolamine, thereby preparing a CMP slurry.

Figure 9:
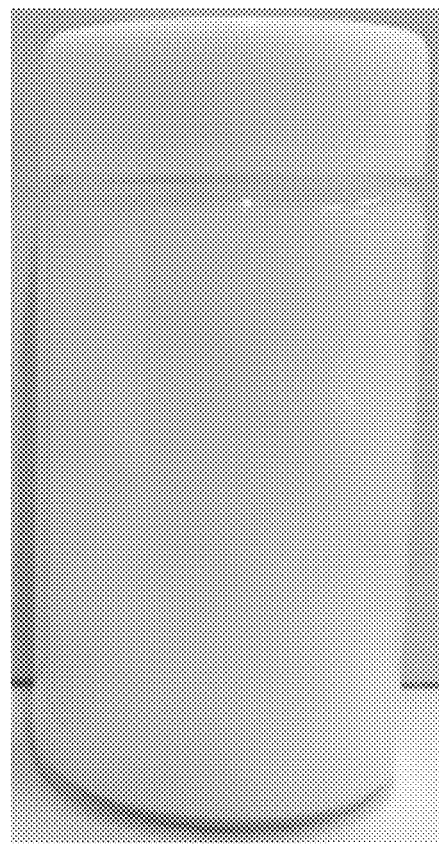
FIG. 9 is an image showing a dispersion of conventional cerium oxide particles.
Figure 10:
FIG. 10 is an image showing a dispersion of cerium oxide particles according to one example of the present invention.

Referring to FIGS. 9 and 10, it could be observed that a slurry containing conventional ceria particles had high turbidity even when viewed visually, whereas the slurry containing the cerium oxide particles of the present invention was transparent, suggesting that the cerium oxide particles of the present invention had a monodisperse property.

Comparative Examples 1 to 4. Preparation of Slurry Compositions Containing Conventional Ceria Particles Commercially available wet cerium oxide particles having average particle sizes of 10, 30, and 60 nm, respectively, and 10 to 20 nm cerium oxide particles produced by a calcination method, were prepared, and added to deionized water at an abrasive concentration of 0.05 wt %. The resulting slurries were adjusted to a final pH of 5.5 by adding ammonia as a pH adjusting agent thereto, thereby preparing CMP slurries.

Experimental Example 1. SEM and TEM Analyses of Cerium Oxide Particles

Powdery cerium oxide particles (primary particles) were prepared by drying the dispersion of Preparation Example 1 according to one embodiment of the present invention at approximately 80 to 90° C. (sample A). Meanwhile, cerium oxide particles used to prepare the dispersions of Comparative Examples 1 to 4 were prepared (samples B1, B2, B3 and B4, respectively). The prepared samples were imaged using TEM.

Figure 11:
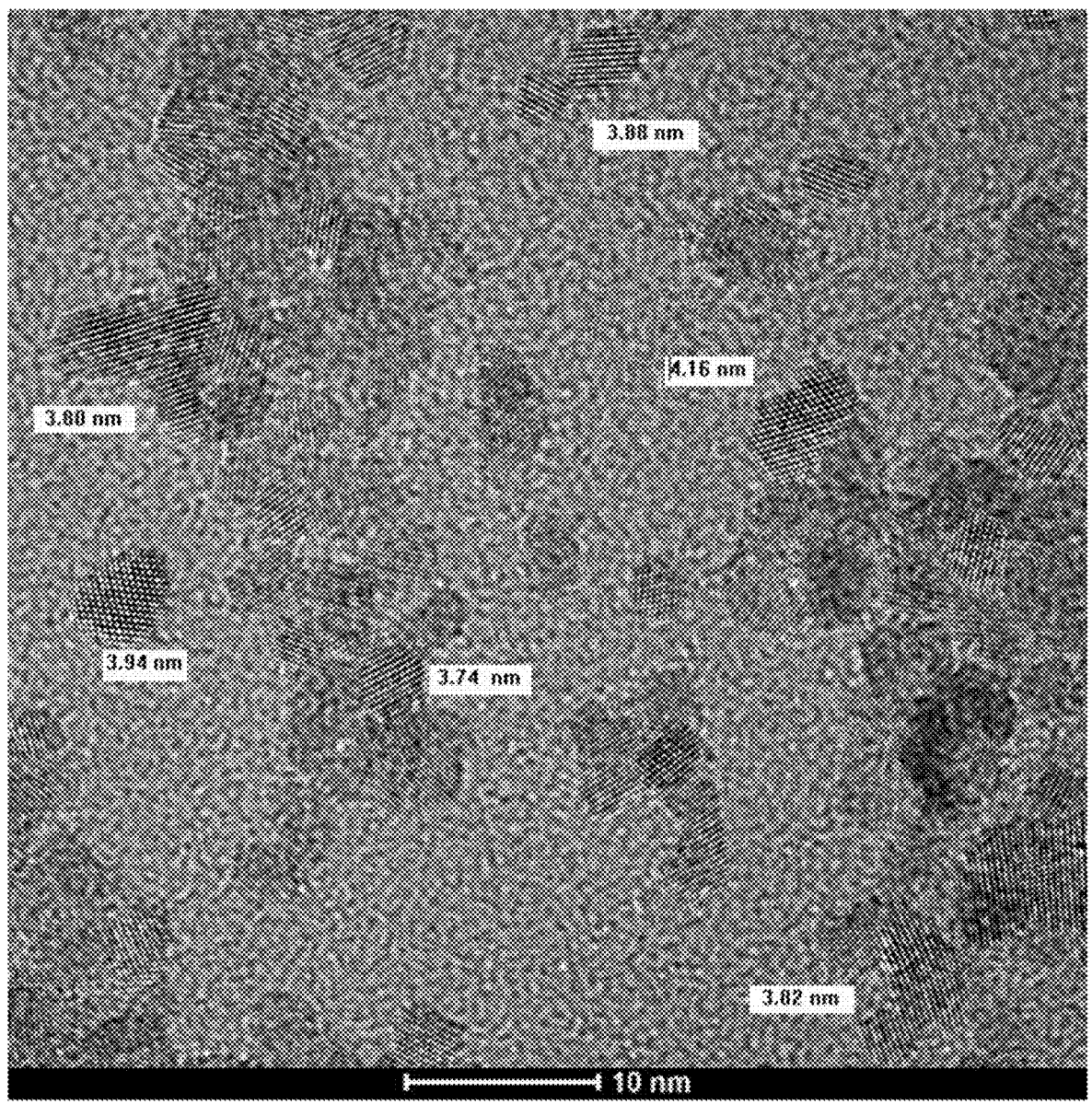
FIG. 11 to 13 are TEM images of cerium oxide particles according to one example of the present invention.
Figure 12:
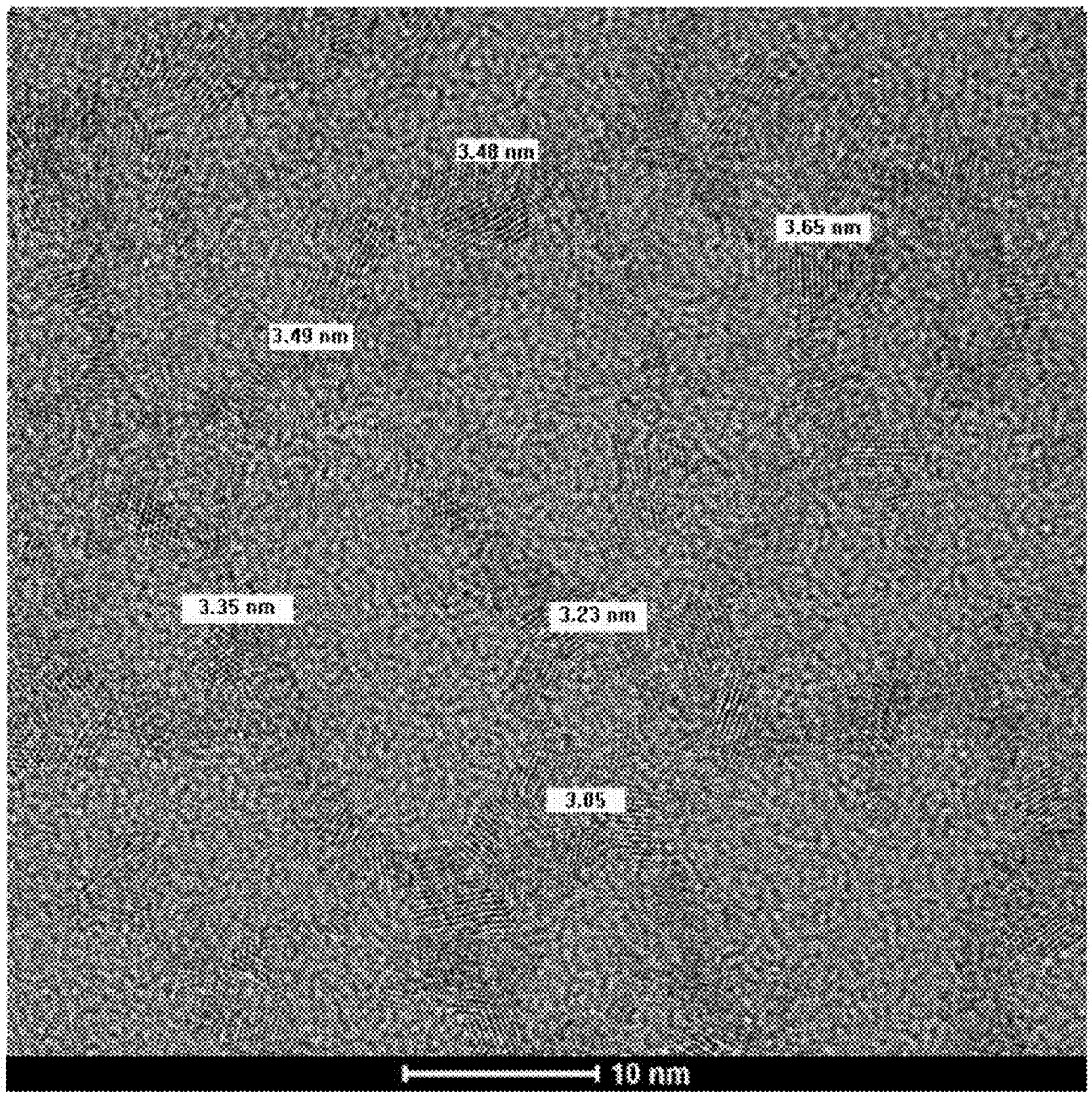
Figure 13:
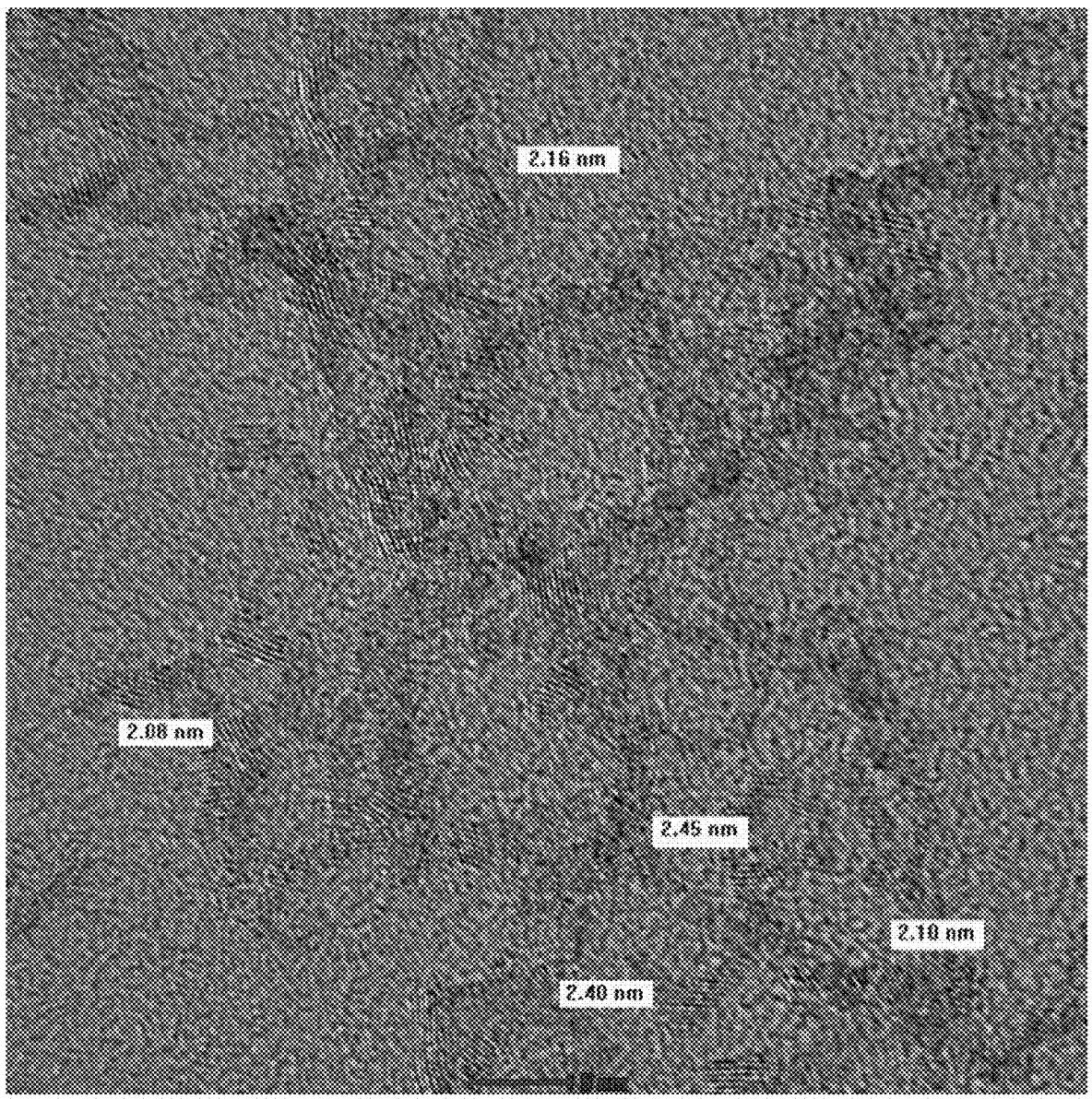
Figure 14:
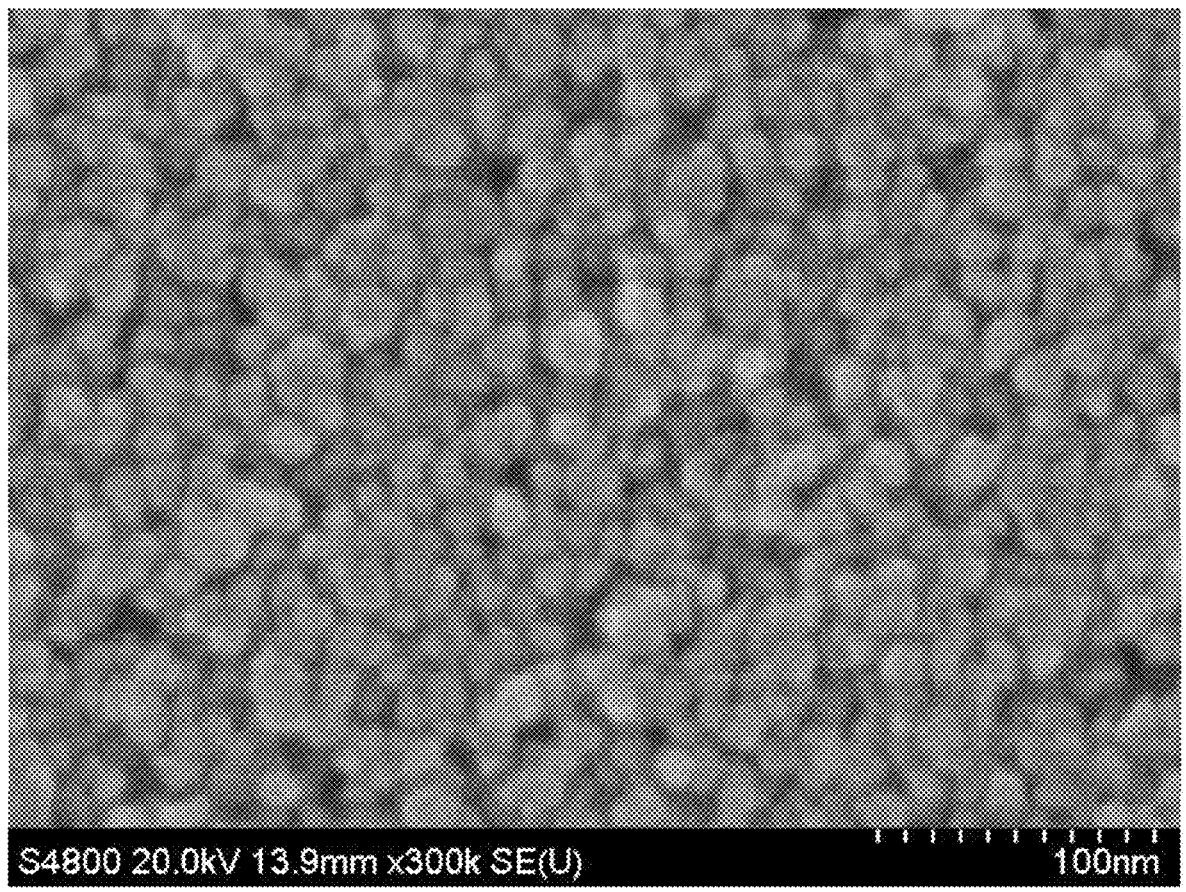
FIG. 14 is an SEM image of cerium oxide particles according to Comparative Example 1.
Figure 15:
FIG. 15 is an SEM image of cerium oxide particles according to Comparative Example 2.
Figure 16:
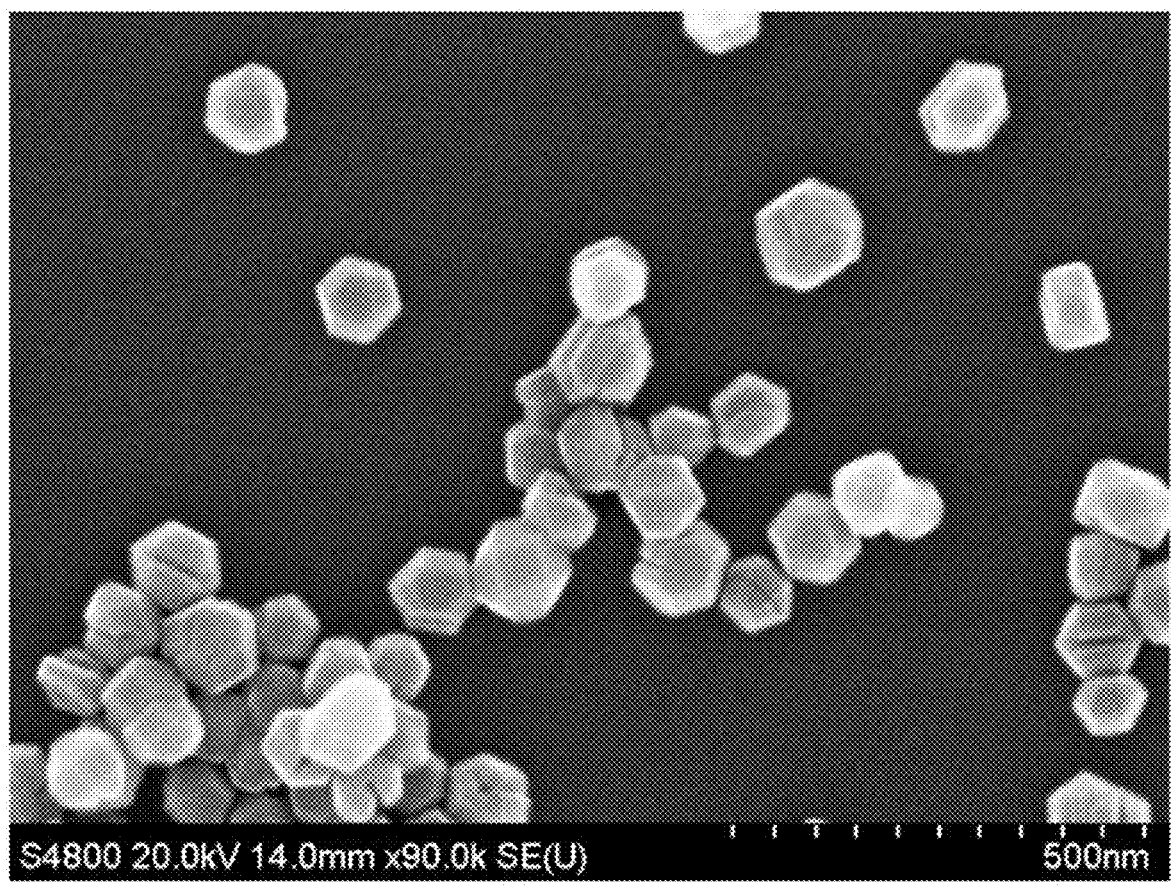
FIG. 16 is an SEM image of cerium oxide particles according to Comparative Example 3.
Figure 16:
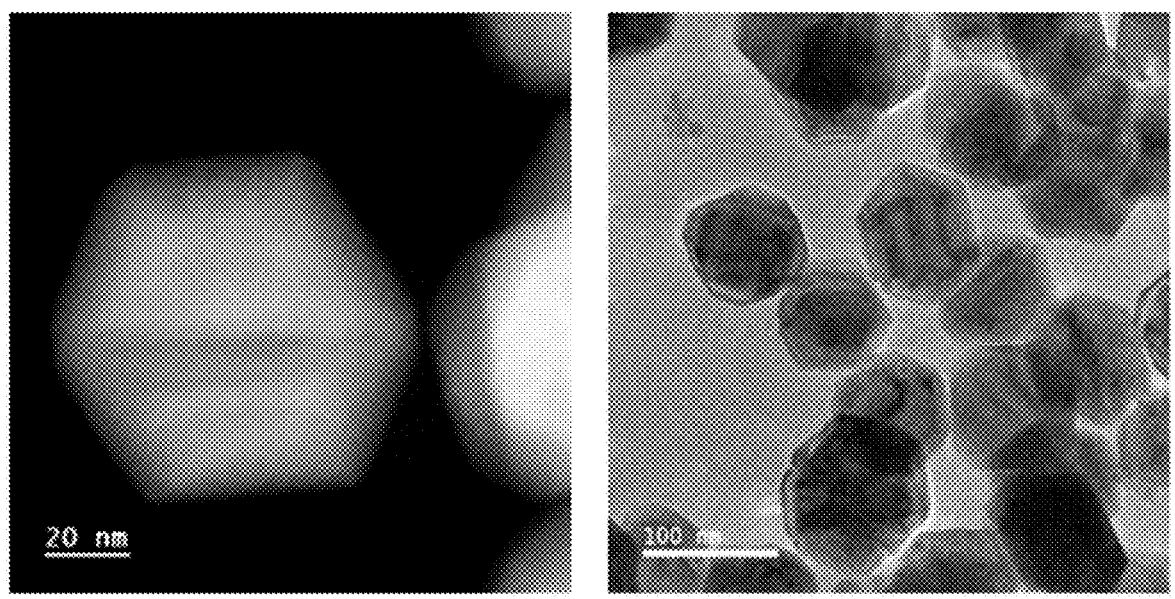
Figure 17:
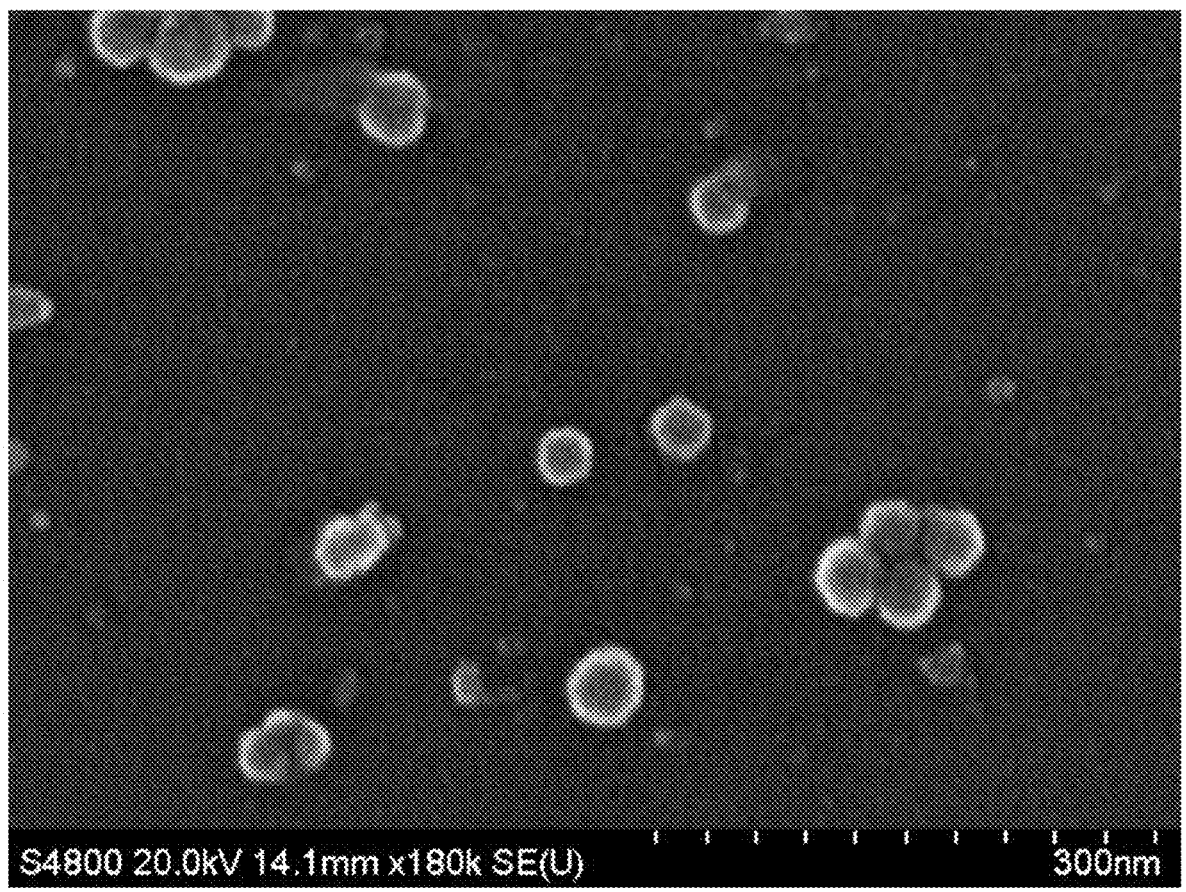
FIG. 17 is an SEM image of cerium oxide particles according to Comparative Example 4.

FIGS. 11 to 13 are TEM images of cerium oxide particles according to one example of the present invention.

Referring to FIGS. 11 to 13, it could be confirmed that the particle sizes of the cerium oxide particles produced to one example of the present invention were about 4 nm or less on average (3.9 nm, 3.4 nm, and 2.9 nm in repeated measurements, respectively), as measured by TEM. It can be seen that the average primary particle size of the cerium oxide particles according to one example of the present invention was 4 nm or less. In addition, it can be confirmed that the cerium oxide particles generally had a spherical particle shape. Spherical cerium oxide particles having a small particle size and a relatively uniform size distribution may have a large specific surface area and have excellent dispersion stability and storage stability.

FIGS. 14 to 17 show SEM images of conventional cerium oxide particles according to the Comparative Examples.

Referring to FIGS. 14 to 17, it can be seen that commercially available cerium oxide particles had particle sizes corresponding to their size classes, and the particles produced by the calcination method had an average primary size of more than 10 nm on average. When comparing these particle sizes with the average particle size of the cerium oxide particles according to one example of the present invention (4 nm or less as measured by TEM), can be seen that the conventional cerium oxide particles and the cerium oxide particles produced by the calcination method had a much coarser particle size. On the other hand, it was confirmed that the particle size (primary particle size) of the cerium oxide particles of the present invention was small, and it can be expected that, as the sizes of the cerium oxide particles are smaller as described above, defects such as scratches on the surface of the layer to be polished can be reduced.

Figure 18:
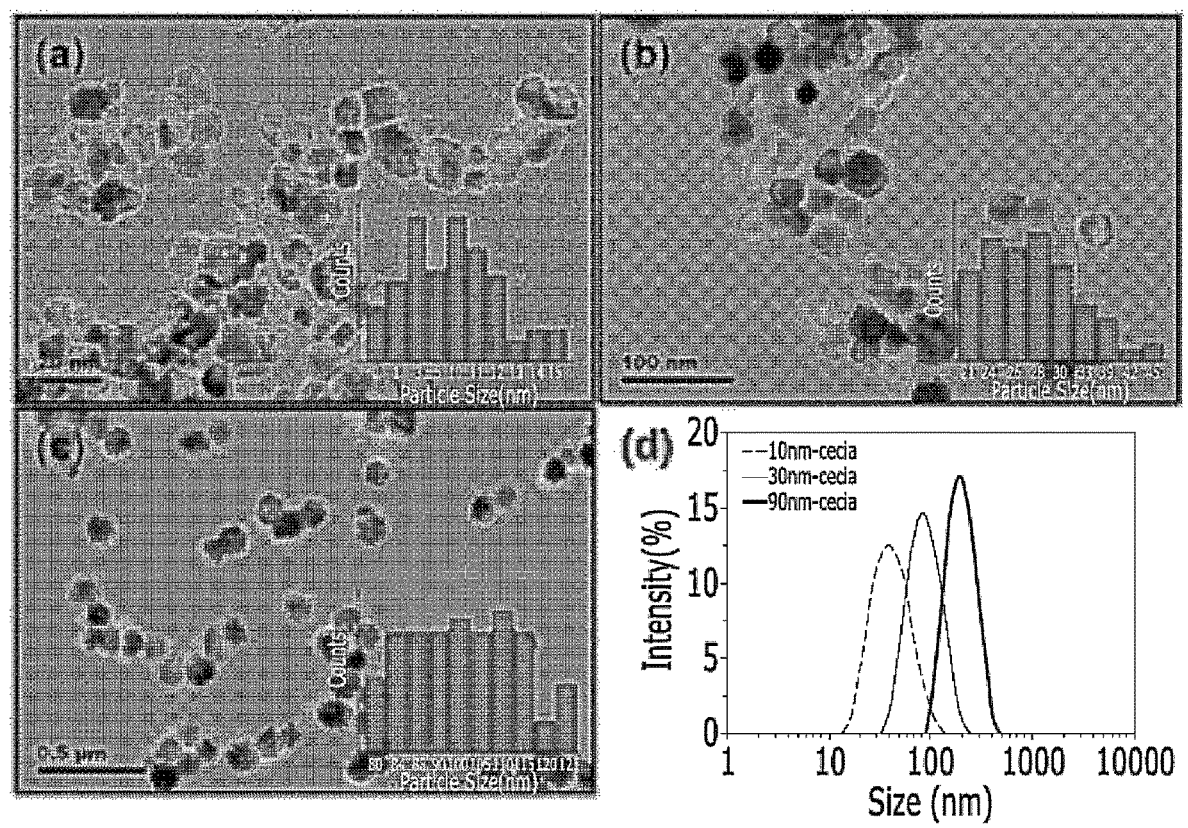
FIG. 18 shows TEM images of Comparative Examples 1 to 3.

In addition, FIG. 18 shows TEM images of conventional cerium oxide particles according to the Comparative Examples. Referring to FIG. 18, it can be seen that the conventional cerium oxide particles having a particle size of about 10 nm include particles having edges and spherical particles, and the conventional cerium oxide particles having a particle size of 30 nm or more are composed of prismatic particles having edges. On the other hand, as discussed above, the cerium oxide particles according to the example of the present invention generally have a spherical shape. As the cerium oxide particles of the present invention have a spherical particle shape and have a fine particle size, an increased number of the particles may be contained, and thus when they are used to polish a silicon oxide layer, the probability of occurrence of defects on the surface may be reduced and the global planarity may be increased.

Experimental Example 2. X-Ray Diffraction (XRD) Analysis of Cerium Oxide Particles Powdery cerium oxide particles (primary particles) were prepared by drying the dispersion of Preparation Example 1 according to one example of the present application at approximately 80 to 90° C. (sample A). For the prepared sample A, analysis was performed using an XRD instrument (Rigaku, Ultima IV). In this case, the XRD was set to Cu Kα ($\lambda$=1.5418 Å), 40 kV, and 40 mA.

Figure 19:
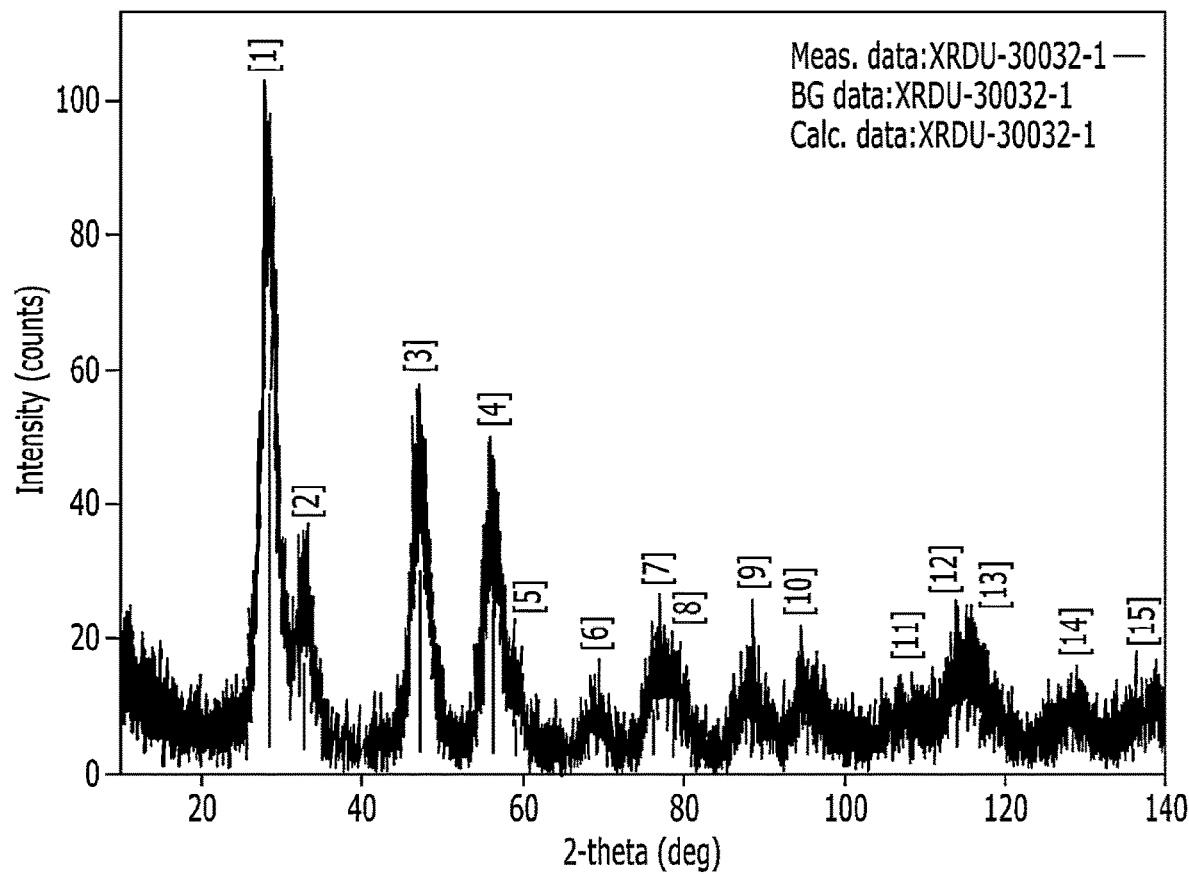
FIG. 19 shows the results of analyzing the particle size of cerium oxide particles according to one example of the present invention by X-ray diffraction (XRD) analysis.

FIG. 19 shows an X-ray diffraction (XRD) pattern of the cerium oxide particles according to one example of the present invention. The particle size of the cerium oxide particles, obtained by analyzing the XRD pattern, is shown in Table 1 below.

TABLE 1

| Sample | Crystallite size (Å) |
|---|---|
| Cerium oxide | 32.5(9) |

Referring to FIG. 19 and Table 1 above, as a result of XRD analysis of sample A, the XRD spectrum (X-axis: 2-theta (degree), Y-axis: intensity) shown in FIG. 19 was obtained. The crystallite size calculated from the spectrum was 3.25 nm. This is similar to the TEM analysis result of Experimental Example 1, suggesting that the particles of the present invention are single crystals.

Experimental Example 3. Small Angle X-Ray Scattering (SAXS) Analysis of Cerium Oxide Particles The particle sizes of the cerium oxide particles according to one example of the present invention was analyzed by small angle X-ray scattering (SAXS) analysis, and the results are shown in FIG. 20.

Figure 20:
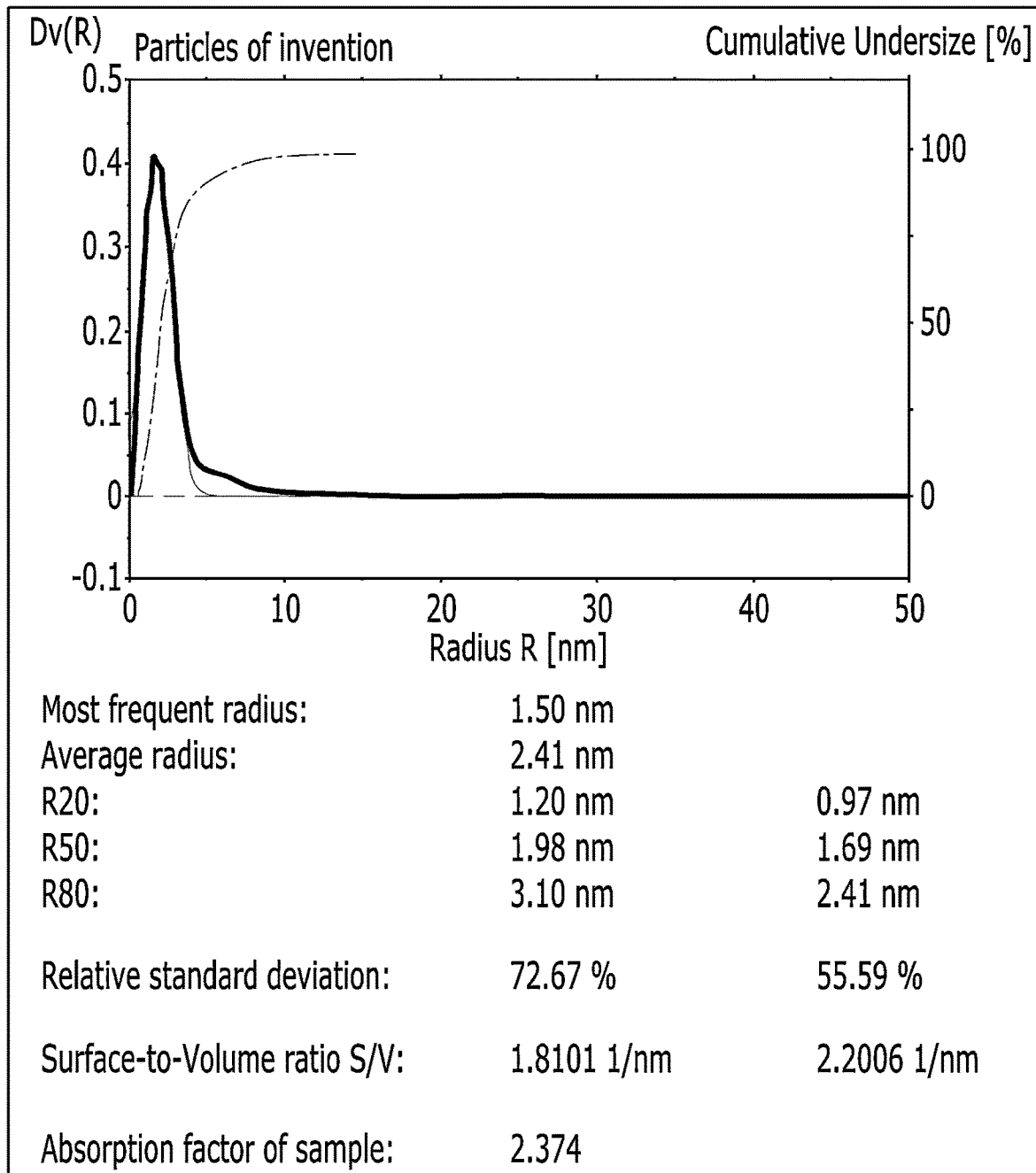
FIG. 20 shows the results of analyzing cerium oxide particles according to one example of the present invention by small angle X-ray scattering (SAXS) analysis.

Referring to FIG. 20, it can be seen that the particle size of the cerium oxide particles according to the example of the present invention had an average particle radius of 2.41 nm, suggesting that they had a particle size of 10 nm or less. Thereby, it can be confirmed that the particle size of the cerium oxide particles according to the example of the present invention was much finer than that of the conventional cerium oxide particles. Therefore, it can be seen that, when a silicon oxide layer is polished using the cerium oxide particles according to the example of the present invention, the probability of occurrence of defects on the surface can be further reduced.

Experimental Example 4. Dynamic Light Scattering (DLS) Analysis of Cerium Oxide Particles The slurry composition of Preparation Example 2 according to the present invention and the slurry compositions of Comparative Examples 1, 2, 3 and 4 were prepared as samples. For each of the prepared samples, analysis was performed using a DLS instrument.

Figure 21:
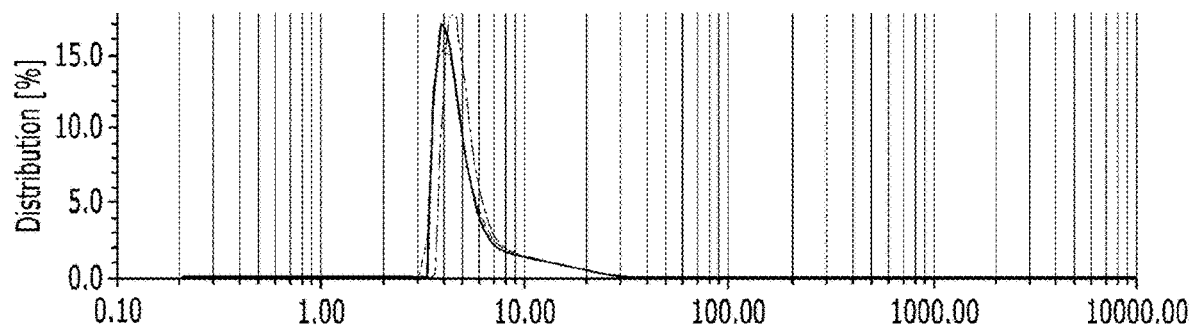
FIG. 21 shows the results of analyzing cerium oxide particles according to one example of the present invention by dynamic light scattering (DLS) particle size analysis (DLS).

FIG. 21 shows the result of dynamic light scattering (DLS) analysis (Malvern, Zetasizer Ultra) of the cerium oxide particles according to one example of the present invention. In addition, Table 2 below shows D50 values obtained by dynamic light scattering (DLS) analysis of the cerium oxide particles according to one example of the present invention and the cerium oxide particles of the Comparative Examples.

TABLE 2

| Sample | D50 number (nm) |
|---|---|
| Example of the present invention | 5.78 |
| Comparative Example 1 - conventional 10-nm cerium oxide particles | 33.6 |
| Comparative Example 2 - conventional 30-nm cerium oxide particles | 93.9 |

TABLE 2-continued

| Sample | D50 number (nm) |
|---|---|
| Comparative Example 3 - conventional 60-nm cerium oxide particles | 138.7 |
| Comparative Example 4 - cerium oxide particles produced by calcination method | 139.1 |

Referring to FIG. 21 and Table 2, it was shown that the cerium oxide particles according to the example of the present invention had a secondary particle size (D50 value) of about 5.78 nm, which was smaller than 10 nm. This secondary particle size was equal to about 148 to 199% of the primary particle size measured by TEM in Experimental Example 1 (see FIGS. 11 to 13), indicating that the cerium oxide particles of the present invention were little agglomerated and monodisperse in the slurry, and thus there was little change in the particle size.

On the other hand, it was confirmed that the D50 particle sizes of the conventional cerium oxide particles, measured by dynamic light scattering (DLS) analysis, were 30 nm, and the secondary particle size (D50 value) of the 10-nm cerium oxide particles, measured by dynamic light scattering (DLS) analysis, was equal to about 336% of the primary particle size measured by TEM. This suggests that the conventional cerium oxide particles had a much larger secondary particle size, indicating that a large amount of agglomeration occurred.

Therefore, it can be seen that the cerium oxide particles according to one embodiment of the present invention are less agglomerated in the slurry and can be more monodisperse in the slurry than the conventional cerium oxide particles of the Comparative Examples.

Experimental Example 5. Confirmation of Formation of Cerium Oxide Particles by Fourier Transform Infrared (FT-IR) Spectroscopic Analysis FIG. 22 shows the results of FT-IR spectroscopic analysis of powder consisting of the cerium oxide particles produced according to one example of the present invention and powder consisting of the conventional cerium hydroxide particles.

Figure 22:
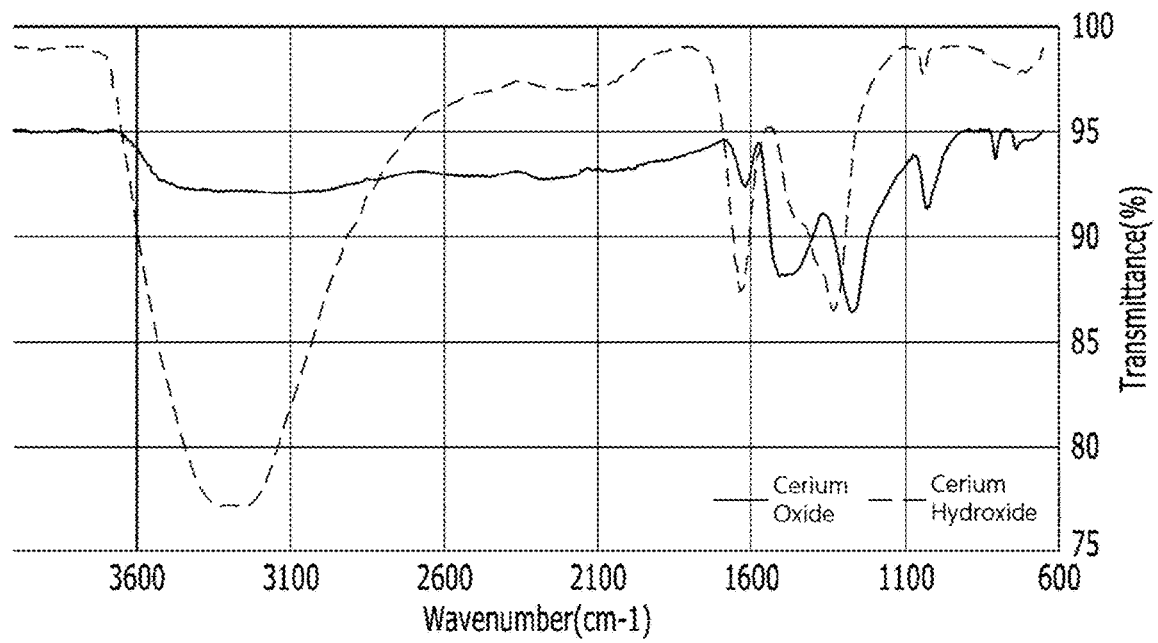
FIG. 22 shows the results of analyzing the spectra of cerium oxide particles according to one example of the present invention and cerium hydroxide particles by Fourier transform infrared (FT-IR) spectroscopy.

As a result of analyzing the FT-IR spectroscopic spectrum of FIG. 22, it can be confirmed that the powder consisting of the cerium oxide particles produced according to one example of the present invention has an IR transmittance of about 92 to 93% in the range of 3000 $cm^{-1}$ to 3600 $cm^{-1}$ and an IR transmittance of about 93 to 95% in the range of 720 $cm^{-1}$ to 770 $cm^{-1}$. In comparison with this, the powder consisting of the conventional cerium hydroxide particles has an IR transmittance of 75 to 90% in the range of 3000 $cm^{-1}$ to 3600 $cm^{-1}$ and an IR transmittance of 97 to 99% in 720 $cm^{-1}$ to 770 $cm^{-1}$, in the FT-IR spectrum. Thus, it can be confirmed that, in the case of the cerium oxide particles produced according to one example of the present invention, the band by the O—H group of the cerium hydroxide particles in the range of 3000 $cm^{-1}$ to 3600 $cm^4$ was weaker than that of the conventional cerium hydroxide particles, and a peak was formed by Ce—O stretching in the range of 720 $cm^{-1}$ to 770 $cm^{-1}$. Accordingly, the above results suggest that the cerium compound produced according to one example of the present invention is cerium oxide.

Experimental Example 6. Measurement of Light Transmittance of Slurry Containing Cerium Oxide Particles A slurry composition (sample A) was prepared in the same manner as in Preparation Example 2, except that the weight percentage of the cerium oxide particles in the CMP slurry was 1 wt %. Meanwhile, slurry compositions were prepared in the same manner as in Comparative Examples 1, 2, 3 and 4 (corresponding to samples B1, B2, B3 and B4, respectively), except that the weight percentage of the cerium oxide particles in each CMP slurry was 1 wt %. For each sample, the transmittance for light having a wavelength of 200 to 1,100 nm was measured using a UV-Vis spectrometer (JASCO).

Figure 23:
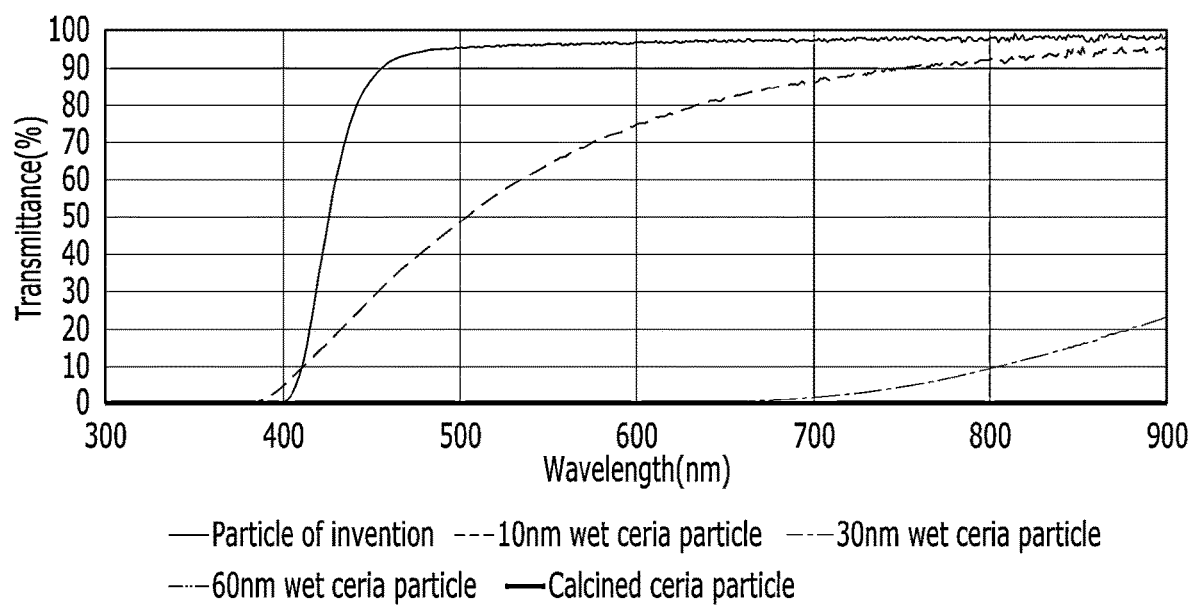
FIG. 23 shows the results of measuring of the light transmittances of slurries containing cerium oxide particles according to one example of the present invention and conventional cerium oxide particles of Comparative Examples 1 to 4 by UV-Vis spectroscopy.

FIG. 23 shows the results of measuring the light transmittances of slurries containing the cerium oxide particles according to one example of the present invention and the conventional cerium oxide particles of Comparative Examples 1 to 4 by UV-Vis spectroscopy.

The cerium oxide particles according to one embodiment of the present invention and the Comparative Examples were added to deionized water at an abrasive concentration of 1.0 wt %, thereby preparing CMP slurries. The light transmittances of the CMP slurries were analyzed. In this case, the optical spectra were measured using a UV-Vis spectrometer (Jasco UV-vis spectrophotometer) in the range of 200 to 1,100 nm.

Based on the UV-Vis analysis graph, the transmittances (%) of sample A and samples B1 to B4 at wavelengths of 500 nm, 600 nm and 700 nm are summarized and the results are in Table 3 below.

TABLE 3

| Wavelength | Transmittance (%) | | | | |
|---|---|---|---|---|---|
| (nm) | Sample A | Sample B1 | Sample B2 | Sample B3 | Sample B4 |
| 500 | 95.4 | 48.6 | 0.07 | 0.042 | 0.021 |
| 600 | 96.9 | 74.9 | 0.162 | 0.072 | 0.048 |
| 700 | 97.5 | 86.3 | 1.61 | 0.109 | 0.05 |

Referring to FIG. 23 and Table 3 above, it could be confirmed that the slurry containing the cerium oxide particles of the present invention had an average light transmittance of 50% or more for light having a wavelength of 450 to 800 nm. In addition, it could be confirmed that the slurry had a light transmittance of 90% or more for light having a wavelength of about 500 nm, and a light transmittance of 95% or more for light having a wavelength of about 600 nm or 700 nm.

Meanwhile, the light transmittances of the slurries containing the conventional cerium oxide particles according to Comparative Examples 1 to 4 (10 nm, 30 nm, and 60 nm conventional cerium oxide particles, and the ceria particles produced by the calcination method) were measured. It was shown that Comparative Example 4 (calcined ceria particles) exhibited a light transmittance of almost 0%, the light transmittance of the slurry of Comparative Example 1, containing the commercially available 10-nm cerium oxide particles, was 80% or more on average, and the light transmittance thereof at a wavelength of 500 nm was less than 50%. In the case of Comparative Examples 2 and 3, the primary particle sizes were 30 and 60 nm, respectively, and the secondary particle sizes were coarser than that of the example of the present invention (i.e., the degree of agglomeration thereof in the slurries is high), and thus the particles of Comparative Examples 2 and 3 exhibited a transmittance of less than 20% in the visible wavelength region.

On the other hand, it could be confirmed that the cerium oxide particles according to one example of the present invention exhibited a light transmittance of 90% or more in the visible wavelength region, which means that, in the case of the cerium oxide particles of the present invention, the primary particle size itself is fine, and agglomeration into secondary particles occurs less than the conventional cerium oxide particles. It is well known that, when the size of secondary particles is more than 20 nm, opacity of the slurry composition can be observed with the naked eye, and the light transmittance thereof in the visible wavelength region will be less than 80%.

It can be easily seen that, in the case of the slurry composition of the present invention, the light transmittance is as described above, the primary particle size of the cerium oxide particles is small, agglomeration into secondary particles is low, the particles may be uniformly distributed due to their high dispersion stability, and a polishing-target layer is polished using the slurry composition containing the particles, the probability of occurrence of defects such as scratches on the surface may be reduced.

Experimental Example 7. Measurement of Peak Area Ratio of Cerium Oxide Particles By XRD Analysis XRD FIG. 24 shows the results of measuring the peak intensities and peak areas of cerium oxide particles according to one example of the present invention by X-ray diffraction (XRD) analysis.

Figure 24:
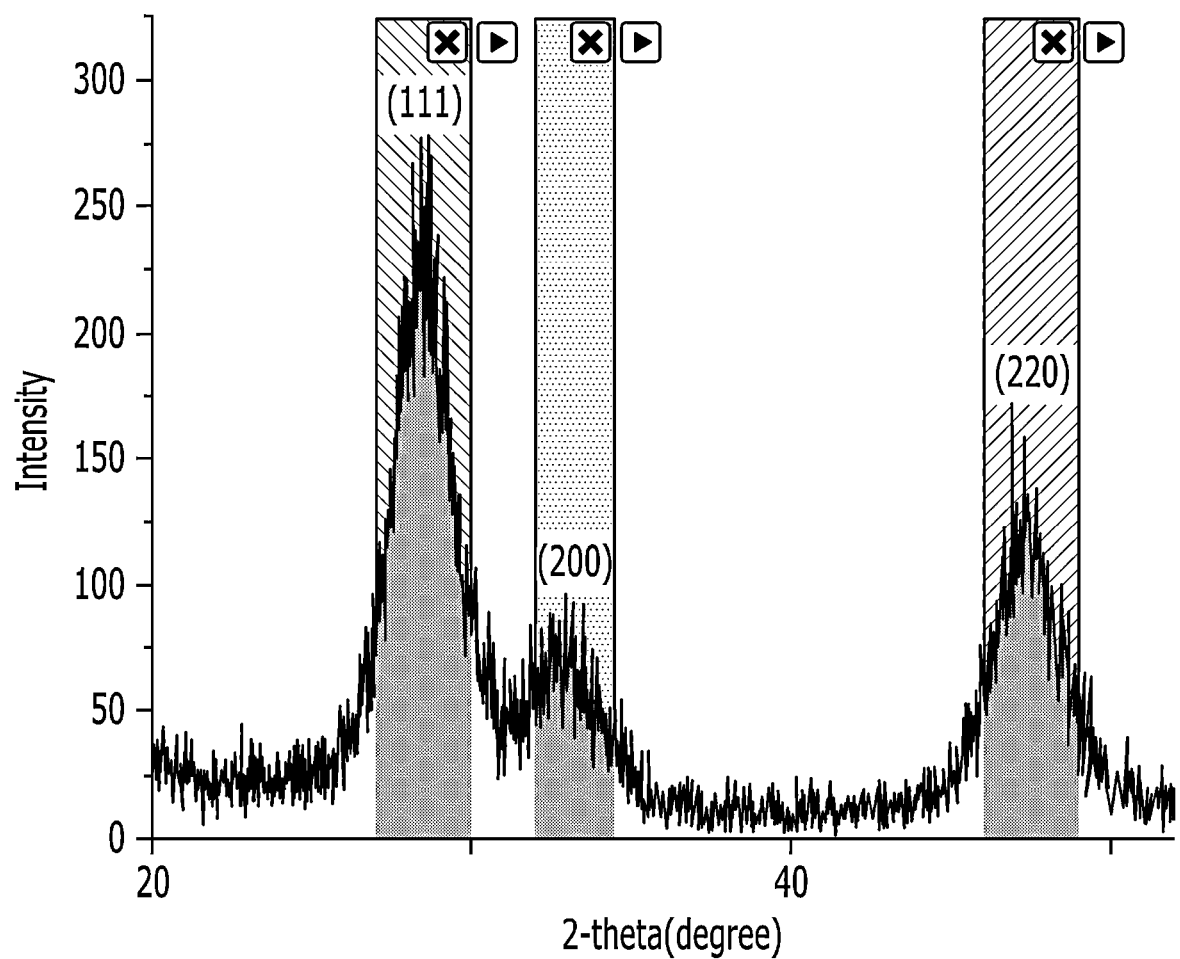
FIG. 24 shows the results of measuring the peak intensities and peak areas of cerium oxide particles according to one embodiment of the present invention by X-ray diffraction (XRD) analysis.

As a result of XRD analysis, as shown in FIG. 24, it can be confirmed that the peak area of the (111) plane of the cerium oxide particles according to one example of the present invention was about 496.9, and the peak area of the (200) plane thereof was about 150.1. At this time, it can be seen that the ratio of the peak area of the (111) plane to the peak area of the (200) plane was approximately 3.3. As a result of examining the main peaks through the library, it could be confirmed that the particles produced according to the example of the present invention were cerium oxide particles.

Experimental Example 8. XPS Analysis of Cerium Oxide Particles

Figure 25:
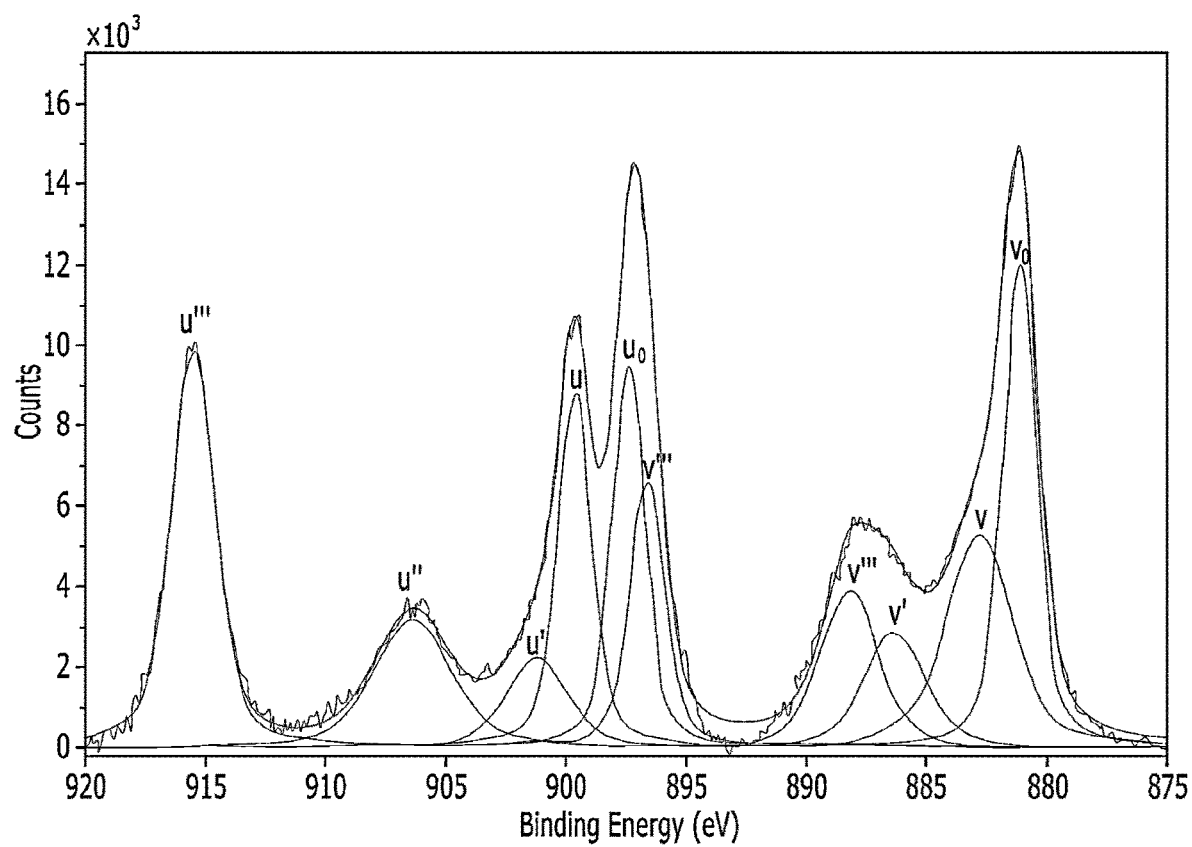
FIG. 25 shows the results of X-ray photoelectron spectroscopy (XPS) analysis of cerium oxide particles according to one example of the present invention.
Figure 26:
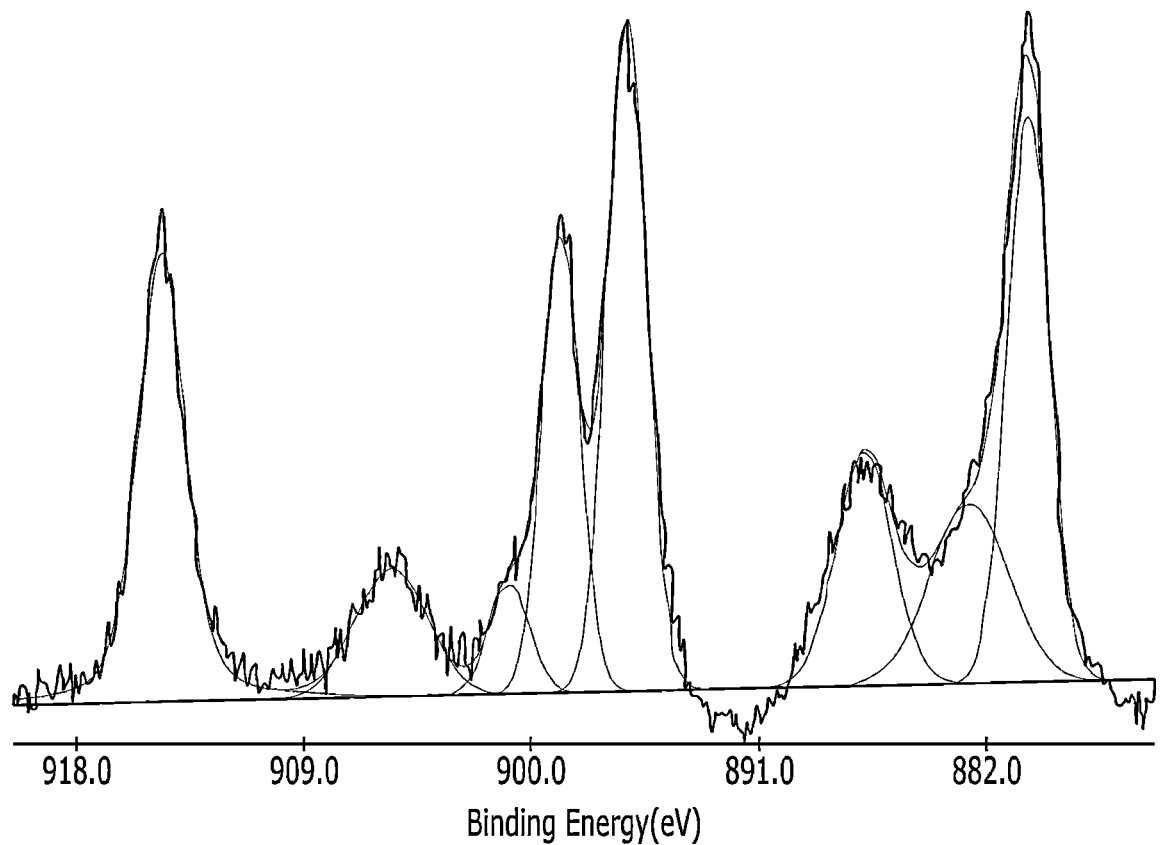
FIG. 26 shows the results of X-ray photoelectron spectroscopy (XPS) analysis of cerium oxide particles according to Comparative Example 3.

FIGS. 25 and 26 show the results of XPS analysis of the cerium oxide particles according to one example of the present invention and the 60-nm conventional cerium oxide particles according to Comparative Example 3. According to XPS (X-ray photoelectron spectroscopy), the $Ce^{3+}$ and $Ce4^+$ contents in the cerium oxide particles can be measured by measuring peaks appearing at 900.2 to 902.2 eV, 896.4 to 898.4 eV, 885.3 to 887.3 eV, and 880.1 to 882.1 eV, which represent the Ce—O binding energy representing $Ce^{3+}$, upon irradiation of soft X-ray, and analyzing atomic % through XPS fitting. Table 4 below show the results of XPS analysis of the cerium oxide particles according to one example of the present invention.

TABLE 4

| | Name | Peak BE | FWHM eV | Area (P) CPS · eV | Atomic % | Atomic % |
|---|---|---|---|---|---|---|
| $Ce^{3+}$ | u' | 901.2 | 3.0 | 11,363 | 4.8% | 36.9% |
| | u0 | 897.4 | 1.7 | 26,481 | 11.2% | |
| | v' | 886.3 | 3.0 | 14,432 | 6.1% | |
| | v0 | 881.1 | 1.7 | 35,248 | 14.8% | |
| $Ce^{4+}$ | u'''' | 915.5 | 2.2 | 36,591 | 15.5% | 63.1% |
| | u'' | 906.4 | 3.8 | 20,514 | 8.7% | |
| | u | 899.6 | 1.7 | 25,576 | 10.8% | |
| | v''' | 896.6 | 1.7 | 19,147 | 8.1% | |
| | v'' | 888.2 | 2.9 | 19,066 | 8.0% | |
| | v | 882.8 | 3.3 | 29,093 | 12.2% | |

As a result of calculating the Ce3+ content by the above-described chemical formula from the results of the XPS analysis, it can be seen that the $Ce^{3+}$ content was 30% or more. It can be seen that, since $Ce^{3+}$ acts as reactive sites in the cerium oxide particles, the amount of polishing can be increased. Comparative data with the conventional cerium oxide particles are shown in Table 5 below.

TABLE 5

| Sample | $Ce^{4+}$ atomic % | $Ce^{3+}$ atomic % |
|---|---|---|
| Example of the present invention | 63.1 | 36.9 |
| Comparative Example (60-nm commercially available cerium oxide particles) | 86.1 | 13.9 |
| Conventional 10-nm ceria particles (by hydrothermal synthesis under supercritical or subcritical conditions) | 83.2 | 16.8 |

As can be seen in Table 5 above, it could be confirmed that the cerium oxide particles according to one example of the present invention had a $Ce^{3+}$ content of about 36.9 atomic %, which was higher than the $Ce^{3+}$ content (14 atomic %) of the conventional 60-nm cerium oxide particles and the $Ce^{3+}$ content (about 16.8 atomic %) of the cerium oxide particles produced by hydrothermal synthesis under supercritical or subcritical conditions. When the $Ce^{3+}$ content on the particle surface is a high as described in the example of the present invention, it is possible to increase the removal rate of a substrate containing silicon by a chemical polishing mechanism that forms Si—O—Ce between silica and cerium.

Figure 27:
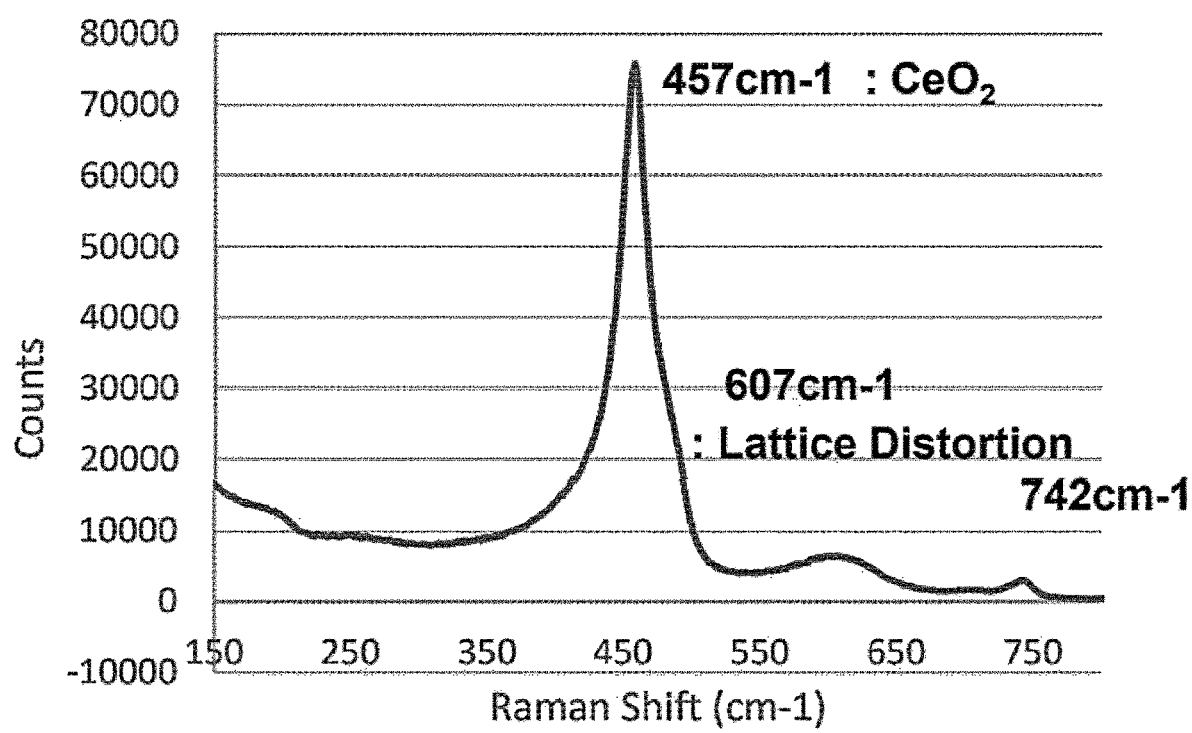
FIG. 27 shows the results of analyzing the Raman peaks of cerium oxide particles according to one example of the present invention.
Figure 28:
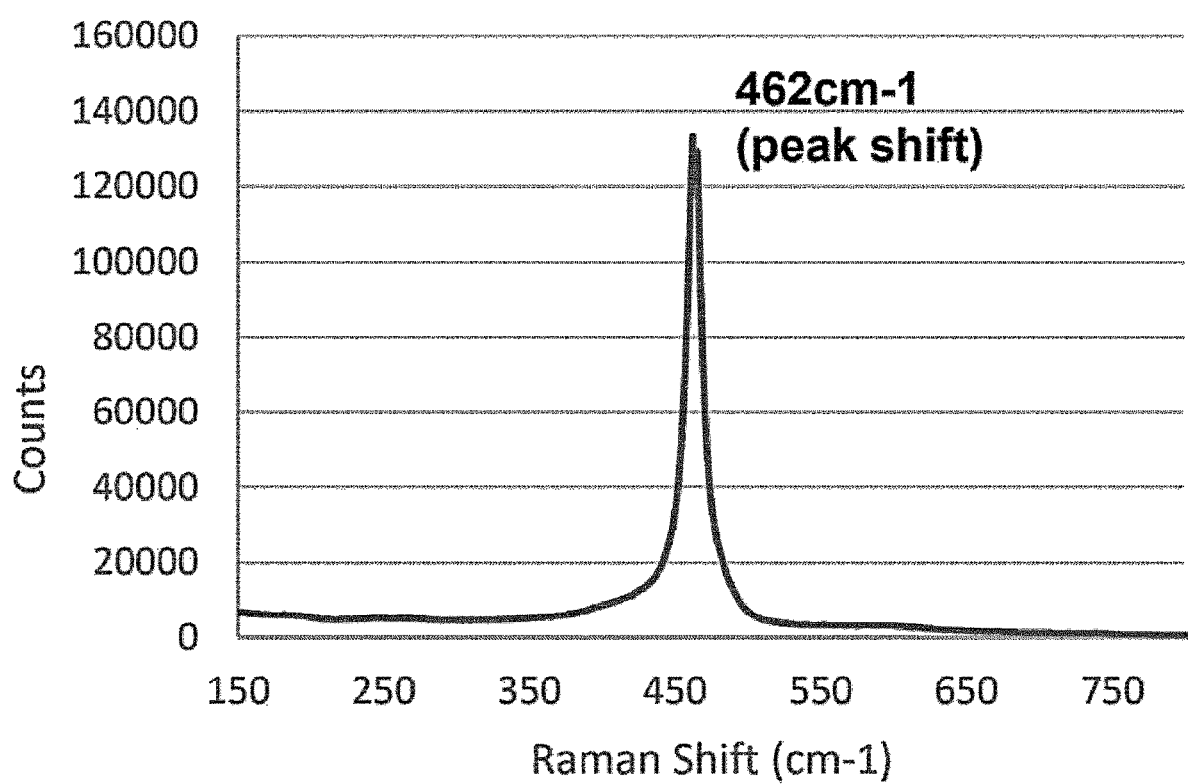
FIG. 28 shows the results of analyzing the Raman peaks of cerium oxide particles according to Comparative Example 1.
Figure 29:
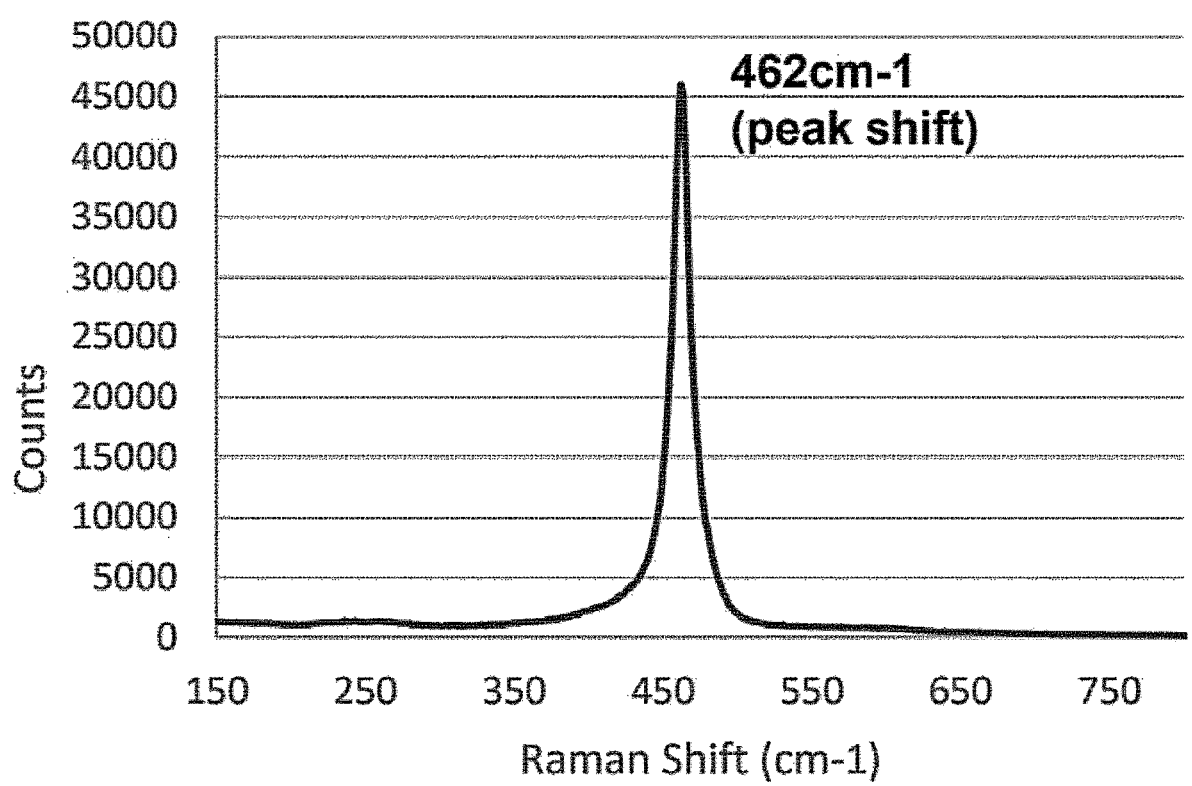
FIG. 29 shows the results of analyzing the Raman peaks of cerium oxide particles according to Comparative Example 1.

Experimental Example 9. Analysis of Cerium Oxide Particles by Raman Spectroscopy FIGS. 27 to 29 show the results of Raman spectroscopy analysis of the cerium oxide particles according to one example of the present invention, the 10-nm conventional cerium oxide particles, and the 60-nm conventional cerium oxide particles, respectively. As a result of the analysis, Raman spectra (X-axis: Raman shift ($cm^{-1}$), Y-axis: counts) as shown in FIGS. 27, 28 and 29 were obtained for the samples of the example, Comparative Example 1 and Comparative Example 3, respectively. The analysis results for the obtained Raman spectra are shown in Table 6 below.

TABLE 6

| | First Raman peak intensity (A) | Second Raman peak intensity (B) | Third Raman peak intensity (C) | A/B | A/C |
|---|---|---|---|---|---|
| Example | 89,521 @ 457 $cm^{-1}$ | 5,795 @ 607 $cm^{-1}$ | 2,541 @ 742 $cm^{-1}$ | 15.4 | 35.2 |
| Comparative Example 1 | 133338 @ 462 $cm^{-1}$ | 2899 @ 607 $cm^{-1}$ | Not detected @ 742 $cm^{-1}$ | 46.0 | — |
| Comparative Example 3 | 45916 @ 462 $cm^{-1}$ | 691 @ 607 $cm^{-1}$ | Not detected @ 742 $cm^{-1}$ | 66.4 | — |

Referring to FIGS. 27 to 29 and Table 6 above, it can be confirmed that the conventional cerium oxide particles according to Comparative Examples 1 and 3 had a first Raman peak at about 462 $cm^{-1}$, whereas the cerium oxide particles according to the example of the present invention had a first Raman peak at about 457 $cm^{-1}$ due to vibration. It appears that, in the case of the cerium oxide particles according to one example of the present invention, $Ce^{4+}$ was partially reduced to $Ce^{3+}$, and defects were induced in the cubic fluorite lattice structure of the cerium oxide particles, resulting in increased oxygen vacancies, causing the shift of the first Raman peak. In addition, it can be confirmed that the intensity of the second Raman peak of the sample of the example was higher than those of Comparative Example 1 and Comparative Example 3 due to this difference in the particle structure.

In addition, it could be confirmed that the cerium oxide particles according to the example of the present invention showed peaks at 457, 607, and 742 $cm^{-1}$, whereas, in Comparative Example 1 and Comparative Example 3, the second peak at about 607 $cm^{-1}$ was almost not detected or had a very weak intensity, and the third peak at about 742 $cm^{-1}$ was not detected, unlike the example.

Meanwhile, it was confirmed that the ratio (A/B) of the first Raman peak intensity (A) to the second Raman peak intensity (B) was 15.4, 46.0, and 66.4 in the example, Comparative Example 1 and Comparative Example 3, respectively. As such, it could be confirmed that the A/B value of the sample of the example is much smaller than those of Comparative Example 1 and Comparative Example 3, and in the case of this example, the ratio (A/C) of the first Raman peak intensity (A) to the third Raman peak intensity (C) was 50 or less, but in Comparative Examples 1 and 3, the A/C ratio could not be calculated because the third Raman peak was not detected, and this is believed to be because the proportion of oxygen vacancies increased due to an increase in the $Ce^{3+}$ content in the cerium oxide particles.

From the above results, it can be seen that the cerium oxide particles according to one example of the present invention has a higher content of $Ce^{3+}$ than the conventional cerium oxide particles according to the Comparative Examples.

Experimental Example 10. Electron Energy Loss Spectroscopy (EELS) Spectrum Analysis of Cerium Oxide Particles The slurry composition of Preparation Example 2 according to the present invention and the slurry compositions of Comparative Example 3 and Comparative Example 4 were prepared as samples.

For each of the prepared samples, analysis was performed using an EELS instrument. The EELS measurement was performed for a core-loss region, which is an energy loss region of 50 eV or more. Peaks according to the oxidation state of the sample to be measured could be distinguished using the ionization edge appearing in the high-loss region, and based on this, the $Ce4^+$ content of the cerium oxide particles was quantitatively analyzed.

Figure 30:
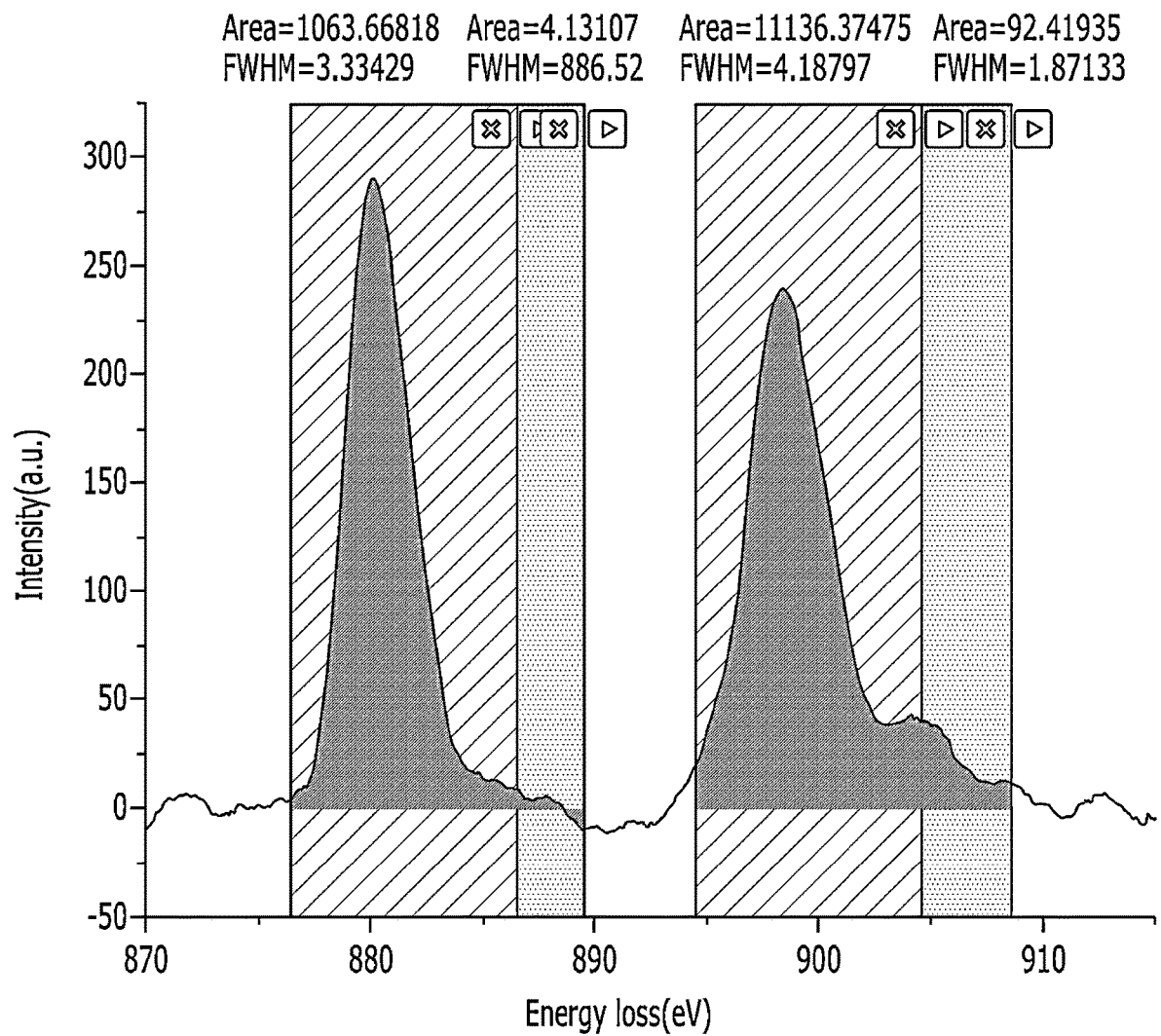
FIG. 30 shows the results of electron energy loss spectroscopy (EELS) analysis of cerium oxide particles according to one example of the present invention.
Figure 31:
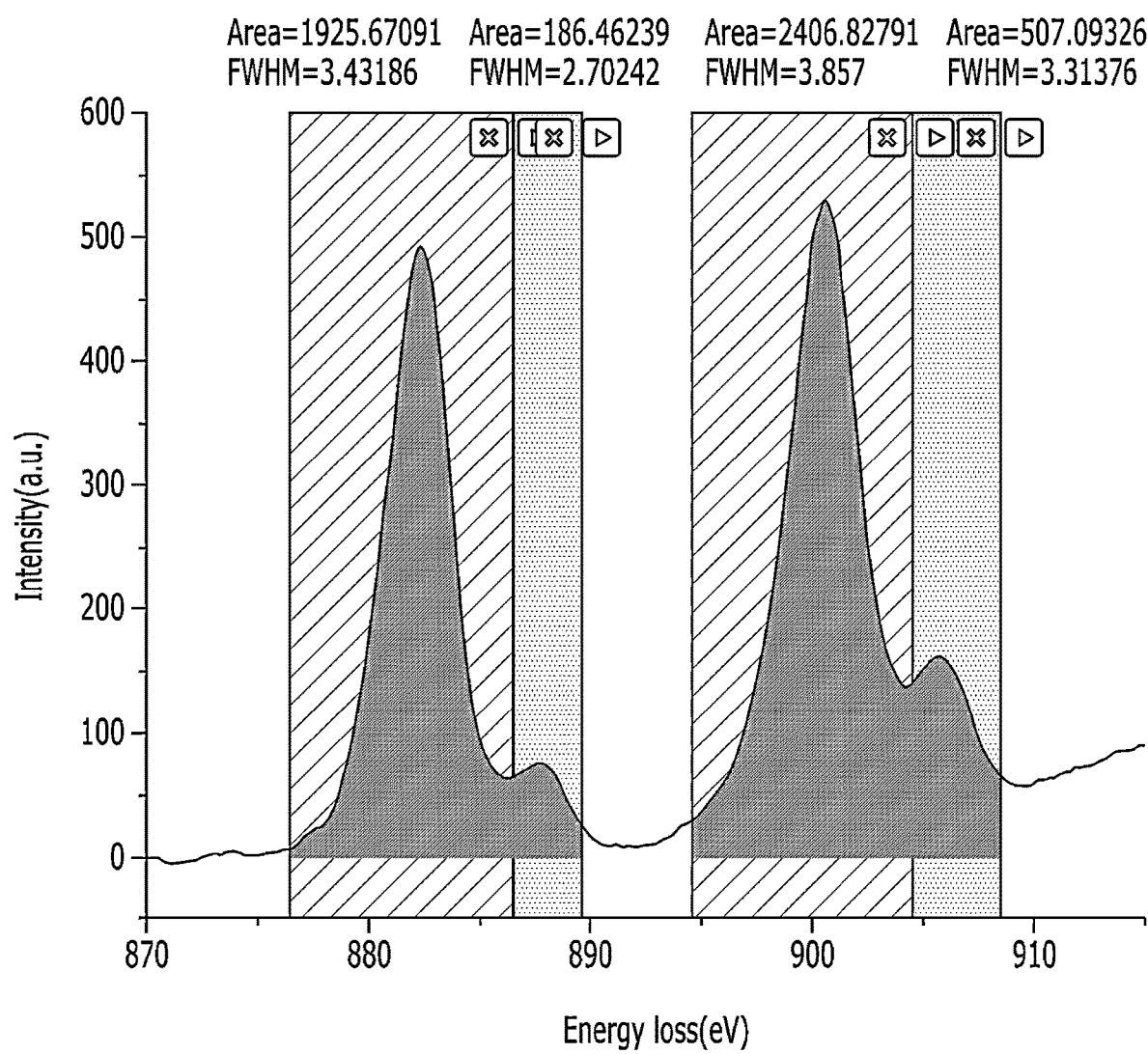
FIG. 31 shows the results of electron energy loss spectroscopy (EELS) analysis of cerium oxide particles according to Comparative Example 3.
Figure 32:
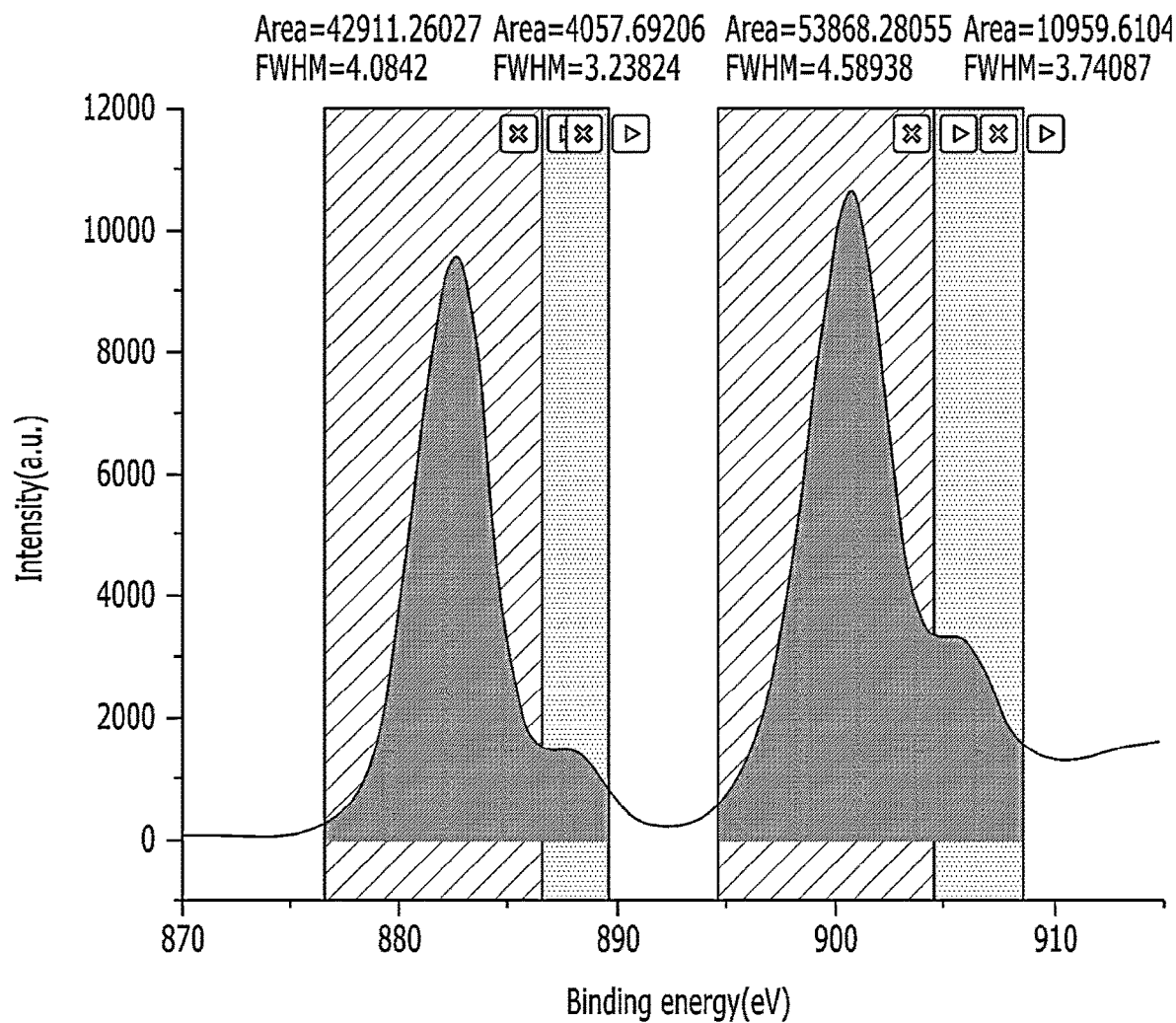
FIG. 32 shows the results of electron energy loss spectroscopy (EELS) analysis of cerium oxide particles according to Comparative Example 4.

As a result of analyzing the sample using the EELS instrument, EELS spectra (X-axis: binding energy (eV), Y-axis: intensity (A.U.)) shown in FIGS. 30 to 32 were obtained for the samples of the example and the Comparative Examples 3 and 4, respectively.

As a result of the analysis, it could be confirmed that the EELS spectrum of the example included a first peak at about 876.5 to 886.5 eV and a second peak at 894.5 to 904.5, and the maximum intensity of the first peak was greater than the maximum intensity of the second peak, indicating that the EELS spectrum follows the EELS spectrum trend of $Ce^{3+}$. On the other hand, it could be confirmed that, in the EELS spectra of Comparative Example 3 and Comparative Example 4, the maximum intensity of the second peak was greater than that of the first peak, indicating that the EELS spectrum follows the EELS spectrum trend of $Ce^{4+}$. This suggests that the cerium oxide particles of the example follow the EELS spectrum trend of $Ce^{3+}$, whereas the cerium oxide particles of Comparative Examples 3 and 4 follow the EELS spectrum trend of $Ce^{4+}$.

Meanwhile, the EELS spectrum of the cerium oxide particles may further include a third peak region at 886.5 to 889.5 eV and a fourth peak region at 904.5 to 908.5 eV, and the peak areas of the third and fourth peak regions may be peaks representing an oxidation state representing $Ce^{4+}$ of the cerium oxide particles. Based on the EELS spectra of FIGS. 30 to 32, peak area ratios for specific binding energy ranges were calculated, and the results are shown in Tables 7 to 9 (result data for the example, Comparative Examples 3 and 4, respectively) below. As a result of the EELS spectrum analysis, it was calculated that the ratio ($P_1/P_t$) of the area of the third peak region ($P_1$) to the sum of all the EELS peak areas ($P_t$) in the cerium oxide particles according to one example of the present invention was as 1%, 1%, 0% and 0%, that of Comparative Example 3 was 3%, 3%, 4% and 4%, and that of Comparative Example 4 was 3%, 3%, 3% and 4%.

In addition, it could be confirmed that the ratio (($P_1+P_2$)/$P_t$) of the area ($P_1$) of the third peak region and the area ($P_2$) of the fourth peak region to the sum ($P_t$) of all the EELS peak areas in the cerium oxide particles according to one example of the present invention was about 5.8% or less on average, that of Comparative Example was about 13% or more, and that of Comparative Example 4 was about 12% or more, suggesting that in the cerium oxide particles according to one example of the present invention had a lower content of $Ce^{4+}$ than the cerium oxide particles of Comparative Examples 3 and 4.

TABLE 7

| Binding energy (eV) | Measurement 1 | Measurement 2 | Measurement 3 | Measurement 4 |
|---|---|---|---|---|
| 876.5 to less than 886.5 (first peak) | 46% | 45% | 46% | 46% |
| 886.5 to less than 889.5 (third peak) | 1% | 1% | 0% | 0% |
| 894.5 to less than 904.5 (second peak) | 45% | 47% | 51% | 49% |
| 904.5 to less than 908.5 (fourth peak) | 8% | 7% | 2% | 4% |

TABLE 8

| Binding energy(eV) | Measurement 1 | Measurement 2 | Measurement 3 | Measurement 4 |
|---|---|---|---|---|
| 876.5 to less than 886.5 (first peak) | 40% | 40% | 38% | 38% |
| 886.5 to less than 889.5 (third peak) | 3% | 3% | 4% | 4% |
| 894.5 to less than 904.5 (second peak) | 49% | 48% | 48% | 48% |
| 904.5 to less than 908.5 (fourth peak) | 9% | 9% | 10% | 10% |

TABLE 9

| Binding energy(eV) | Measurement 1 | Measurement 2 | Measurement 3 | Measurement 4 |
|---|---|---|---|---|
| 876.5 to less than 886.5 (first peak) | 40% | 40% | 42% | 38% |
| 886.5 to less than 889.5 (third peak) | 3% | 3% | 3% | 4% |
| 894.5 to less than 904.5 (second peak) | 48% | 49% | 48% | 48% |
| 904.5 to less than 908.5 (fourth peak) | 9% | 9% | 8% | 10% |

Experimental Example 11. XAFS (X-Ray Absorption Fine Structure) Spectrum Analysis of Cerium Oxide Particles The slurry composition of Preparation Example 2 according to the present invention and the slurry compositions of Comparative Example 3 were prepared as samples.

For each of the prepared samples, analysis was performed using an XAFS instrument. The XAFS is an analysis method of measuring the intensity of X-rays absorbed by irradiating the sample with X-rays with high intensity, and it is possible to determine the weight percentages (wt %) of $Ce^{3+}$ and $Ce^{4+}$ in the particles based on the absorption spectrum obtained by measuring the optical absorption coefficient (xμ) depending on the X-ray energy (eV). In this case, the absorption spectrum was obtained by an X-ray absorption near edge structure (XANES) method that analyzes an XAFS spectrum within 50 eV near an absorption edge where X-ray absorption rapidly increases.

Figure 33:
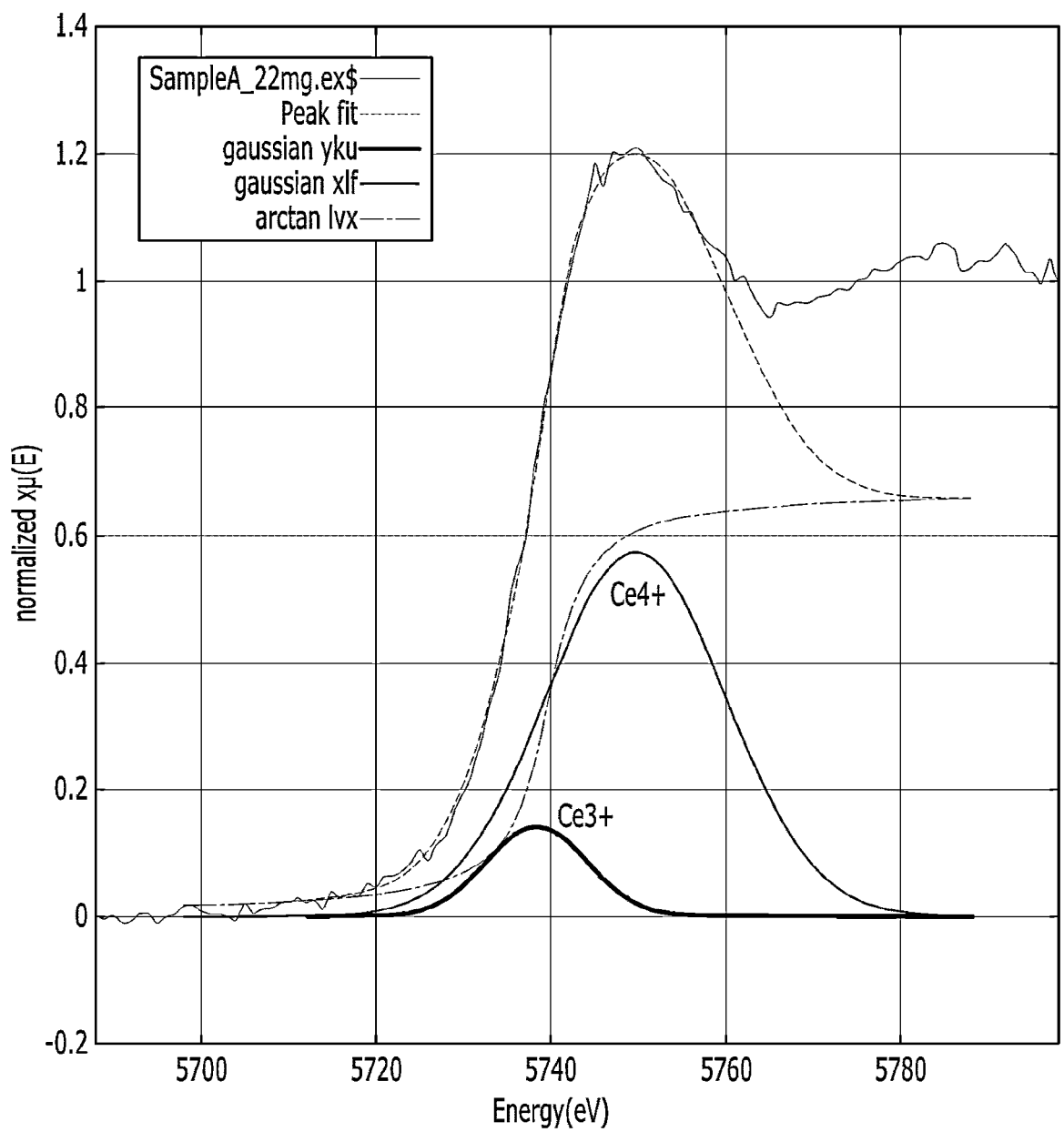
FIG. 33 shows the results of X-ray absorption fine structure (XAFS) spectrum analysis of cerium oxide particles according to one example of the present invention.
Figure 34:
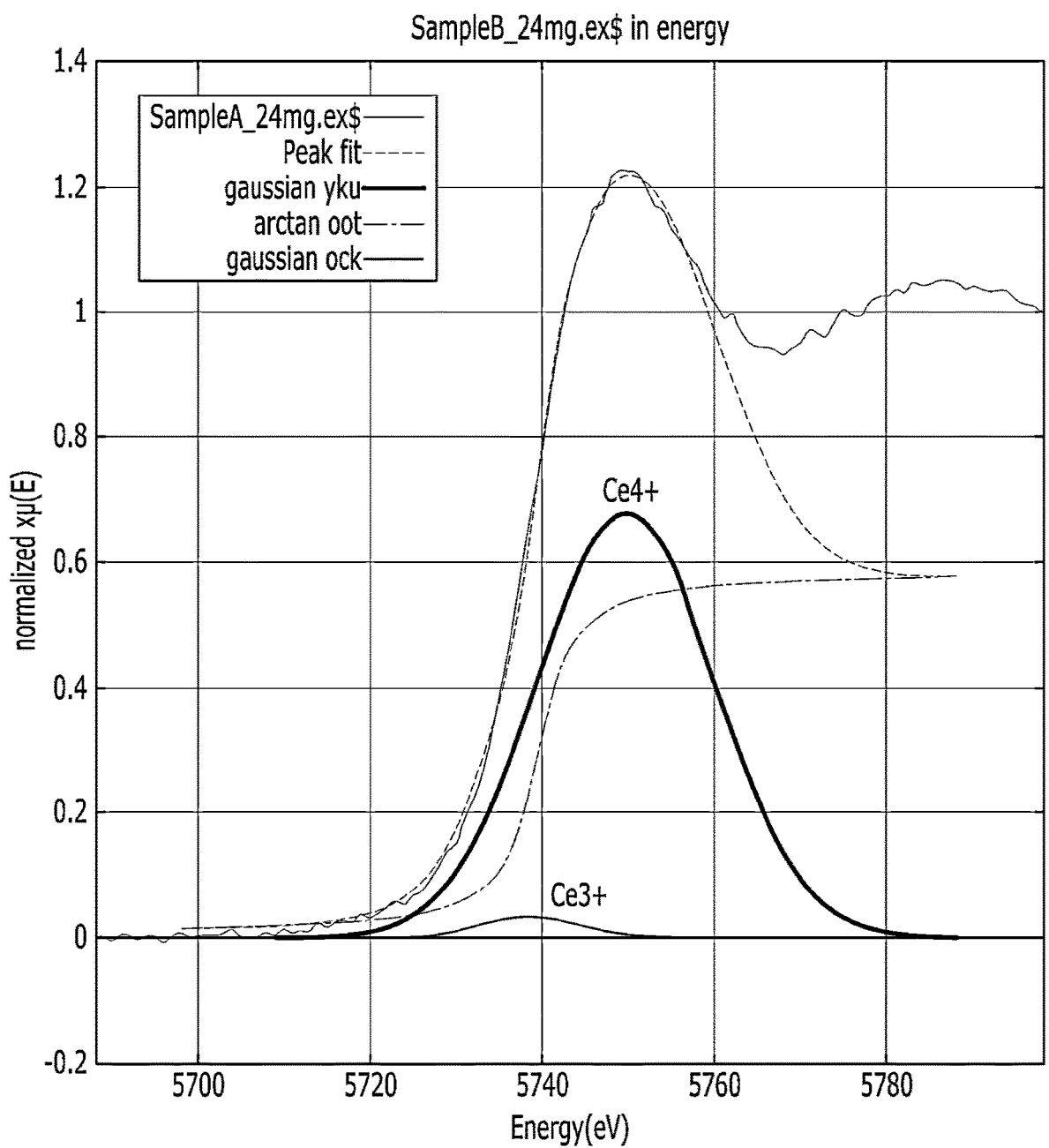
FIG. 34 shows the results of X-ray absorption fine structure (XAFS) spectrum analysis of cerium oxide particles according to Comparative Example 3.

As a result of XAFS analysis for each of the samples of the example and Comparative Example 3, XAFS spectra (X-axis: X-ray energy (eV), Y-axis: X-ray light absorption coefficient xμ (E) shown in FIGS. 33 and 34 were obtained. As shown in FIGS. 33 and 34, in each of the samples of the example and Comparative Example 3, an absorption edge was formed in the about 5,745 to 5,755 eV. Meanwhile, it could be confirmed that the peak ($P_1$), in which electronic transition strongly occurs due to X-ray absorption by $Ce^{3+}$, was formed in the range of about 5,735 to 5,740 eV, and the peak ($P_1$), in which electronic transition strongly occurs due to X-ray absorption by $Ce^{4+}$, was formed in the range of about 5,745 to 5,755 eV.

As a result of examining the light absorption coefficients for $P_1$ and $P_2$, it could be seen that, in the case of the example according to the present invention, $P_1$ and $P_2$ were about 0.1 to 0.2, and 0.5 to 0.6, respectively, whereas, in the case of Comparative Example 3, $P_1$ and $P_2$ were less than 0.1 and more than 0.6, respectively.

Based on the above analysis results, it can be confirmed that the peak areas and area percentages of $Ce^{3+}$ and $Ce^{4+}$ in the sample of each of the example and Comparative Example 3 are those shown in Table 10 below.

TABLE 10

|  | Peak area of $Ce^{3+}$ | Peak area of $Ce^{4+}$ | Area percentage of $Ce^{3+}$ | Area percentage of $Ce^{4+}$ |
|---|---|---|---|---|
| Example | 2.03 | 14.7 | 12.1 | 87.9 |
| Comparative Example 3 | 0.5 | 17.37 | 2.8 | 97.2 |

Referring to Table 10, it can be confirmed that the area percentage of $Ce^{3+}$ on the surfaces of the cerium oxide particles according to one example of the present invention was about 4 times higher than the area percentage of $Ce^{3+}$ on the surfaces of the cerium oxide particles according to Comparative Example 3, suggesting that the cerium oxide particles according to the example of the present invention has a higher polishing rate than the conventional cerium oxide particles of the Comparative Example.

Experimental Example 12. UPS Analysis of Cerium Oxide Particles

Samples of the cerium oxide particles according to one example of the present invention and the cerium oxide particles of Comparative Examples 3 and 4 were prepared.

Figure 35:
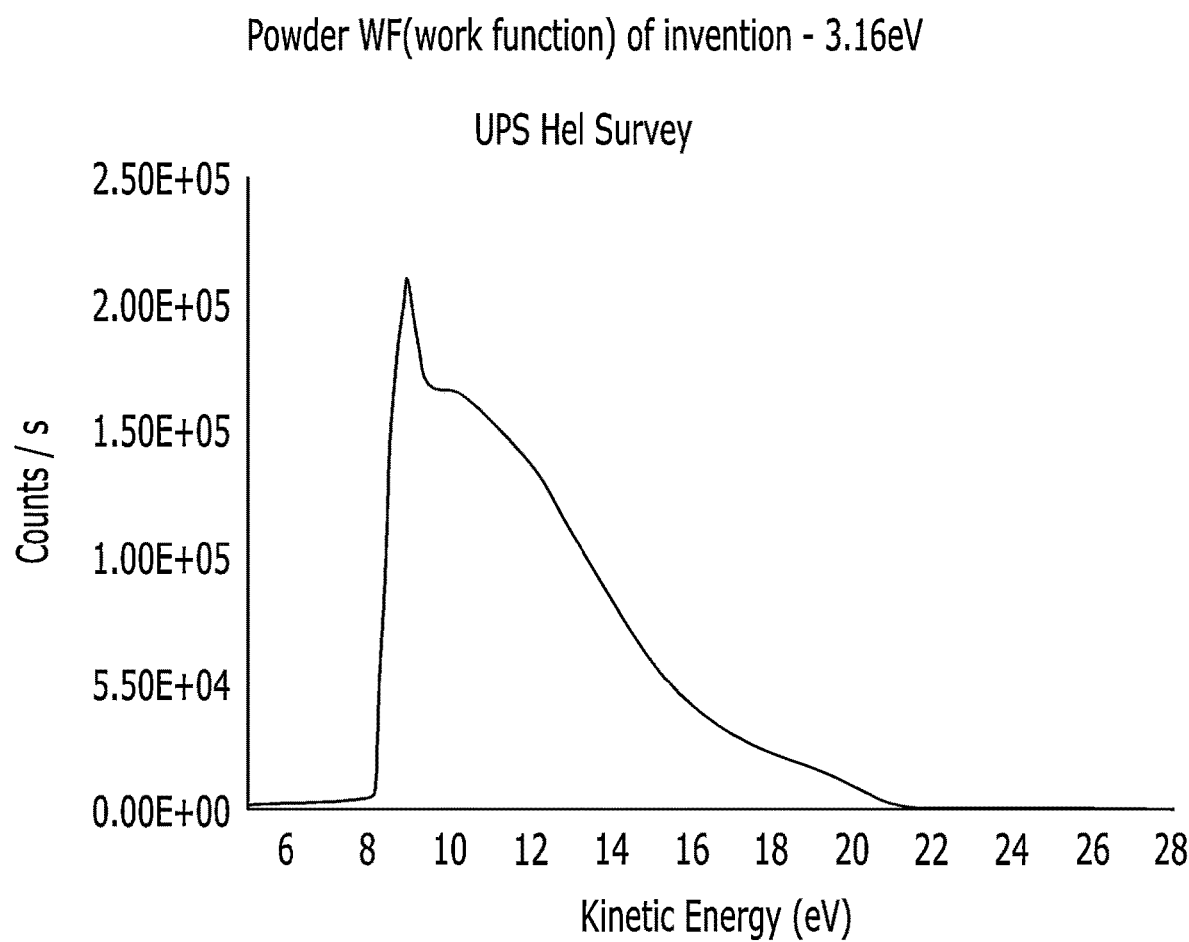
FIG. 35 shows the results of ultraviolet photoelectron spectroscopy (UPS) analysis of an aqueous dispersion containing 1 mass % of cerium oxide particles according to one example of the present invention.
Figure 36:
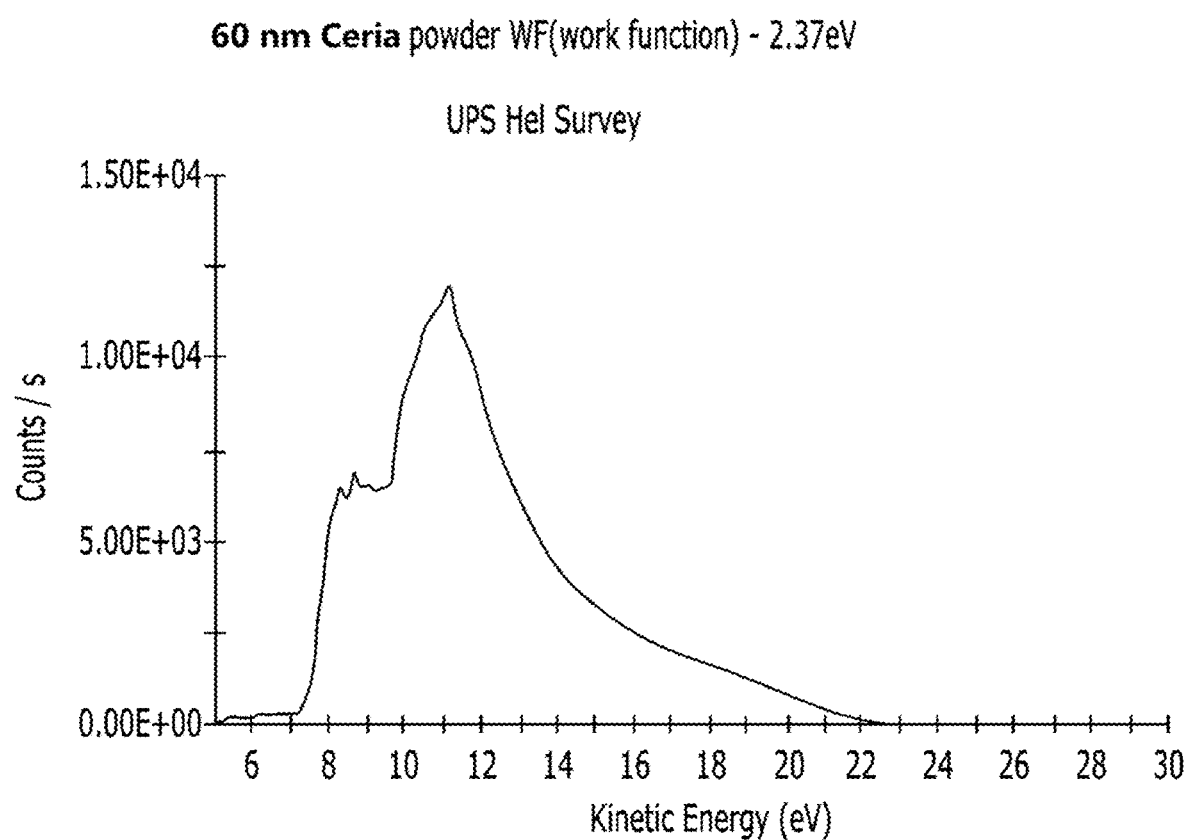
FIG. 36 shows the results of ultraviolet photoelectron spectroscopy (UPS) analysis of an aqueous dispersion containing 1 mass % of cerium oxide particles according to Comparative Example 3.
Figure 37:
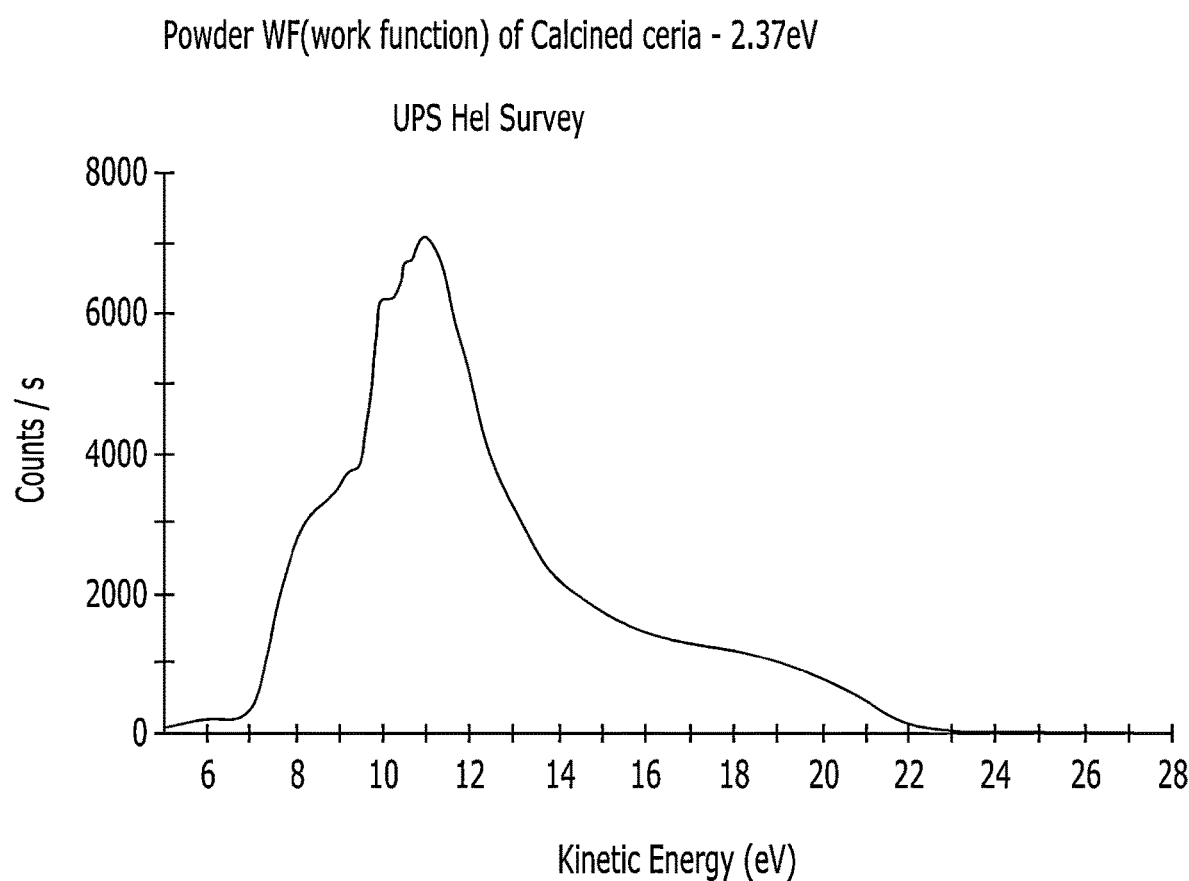
FIG. 37 shows the results of ultraviolet photoelectron spectroscopy (UPS) analysis of an aqueous dispersion containing 1 mass % of cerium oxide particles according to Comparative Example 4.

FIG. 35 to 37 show the results of UPS analysis of the cerium oxide particles according to one example of the present invention, the 60-nm conventional cerium oxide particles, and the conventional cerium oxide particles produced by the calcination method.

Table 11 below summarizes the work function values of the cerium oxide particles according to one example of the present invention and the conventional cerium oxide particles.

In one embodiment, it could be confirmed that, in the case of the cerium oxide particles according to one example of the present application, a maximum value of the number of photoelectrons emitted per second (Counts, Y-axis) was in the kinetic energy range of 8 to 10 eV, whereas, in the case of Comparative Examples 3 and 4, a maximum value of the number of photoelectrons emitted per second was in the kinetic energy range of 11 to 13 eV. From these results, it could be seen that the cerium oxide particles of the example had a work function of 3.16 eV, and the cerium oxide particles of Comparative Examples 3 and 4 had work functions of 2.37 eV and 2.37 eV, respectively.

In one embodiment, as a result, the UPS analysis, the binding energy ($E_b$) could be determined based on the measured kinetic energy ($E_{kin}$) value, and the Fermi energy level ($E_F$) and vacuum level ($E_{cutoff}$) of each of the samples could be determined through the obtained binding energy graph. Accordingly, the work function ($\phi$) value could be determined by applying the Fermi energy level ($E_F$) and vacuum level ($E_{cutoff}$) values to Equation 1 below. Here, hv represents the energy of incident light as a source energy used when emitting ultraviolet light, and helium (He) was used as a source (He|UPS=21.22 eV). The work function values obtained through the analysis results are shown in Table 11 below.

$$\phi = hv - |E_f - E_{cutoff}| \quad \text{[Equation 1]}$$

TABLE 11

|  | Work function (eV) |
|---|---|
| Example of the present invention | 3.16 |
| Comparative Example 3 | 2.37 |
| Comparative Example 4 | 2.37 |

Referring to Table 11, it could be seen that the work function value of the cerium oxide particles according to one example of the present invention was the highest. As the particle size decreases, the energy level difference between the orbitals of the sample gradually increases, resulting in a high energy band gap. It could be seen that, since the particle size of the cerium oxide according to one example of the present invention was sufficiently smaller than that of the conventional cerium oxide particles, the cerium oxide according to one example of the present invention had a high energy band gap, which affected the Fermi energy level and the vacuum level, resulting in a change in the energy of the work function. Therefore, the work function values obtained through the UPS analysis indicate that the particle size of the cerium oxide particles according to one example of the present invention is sufficiently smaller than that of conventional cerium oxide particles and that the cerium oxide particles according to one example of the present invention have a very low degree of agglomeration. By having a low degree of agglomeration and monodisperse characteristics as described above, the cerium oxide particles according to one example of the present application, when contained in a slurry for chemical mechanical polishing and used, can maximize the number of particles in contact with a wafer, increase the oxide removal rate, and at the same time, minimize the occurrence of defects on the wafer surface because the particle size itself is fine.

Experimental Example 13. Analysis of BET Surface Area of Cerium Oxide Particles

Figure 38:
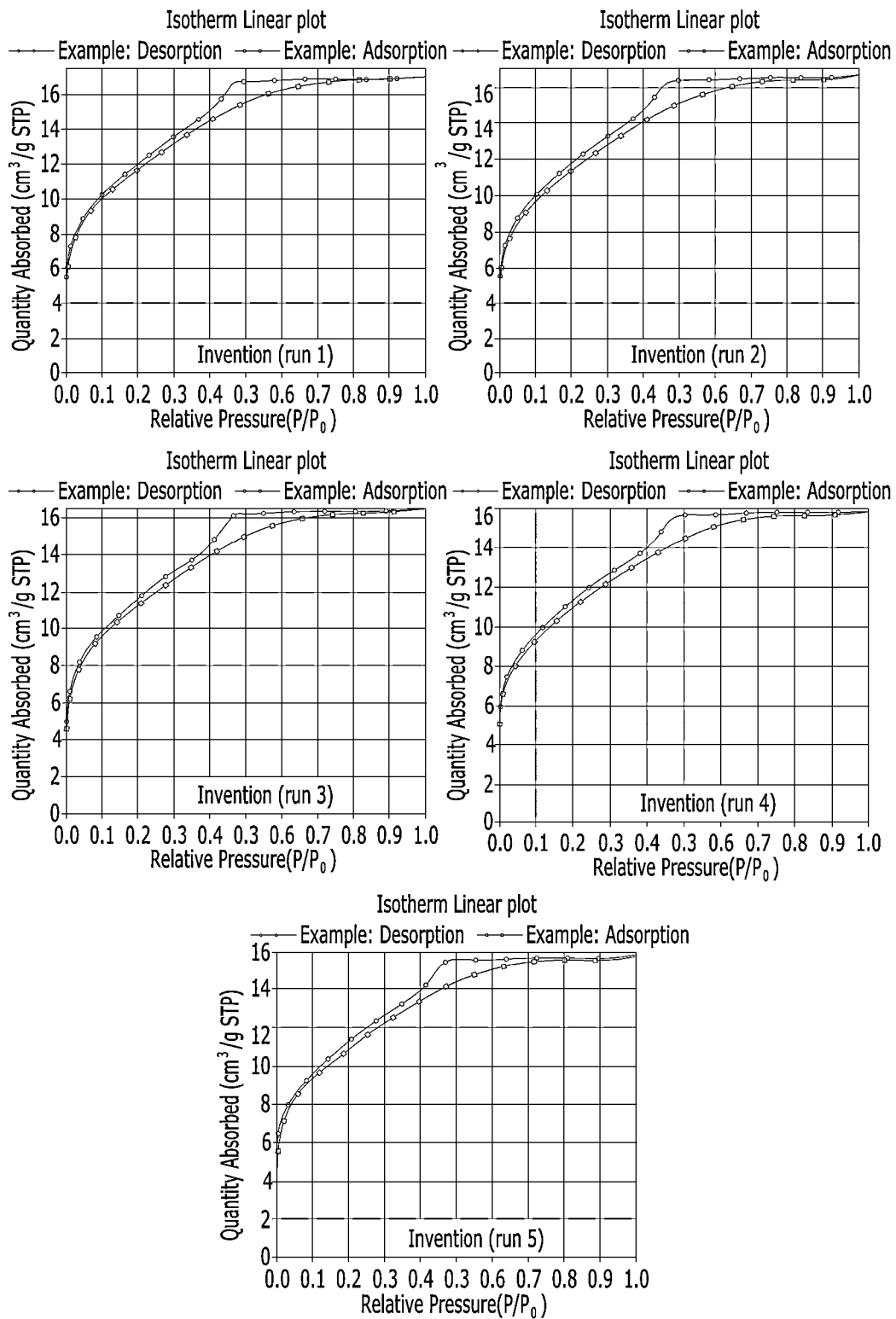
FIG. 38 shows the results of measuring the BET surface area of cerium oxide particles according to one example of the present invention.
Figure 39:
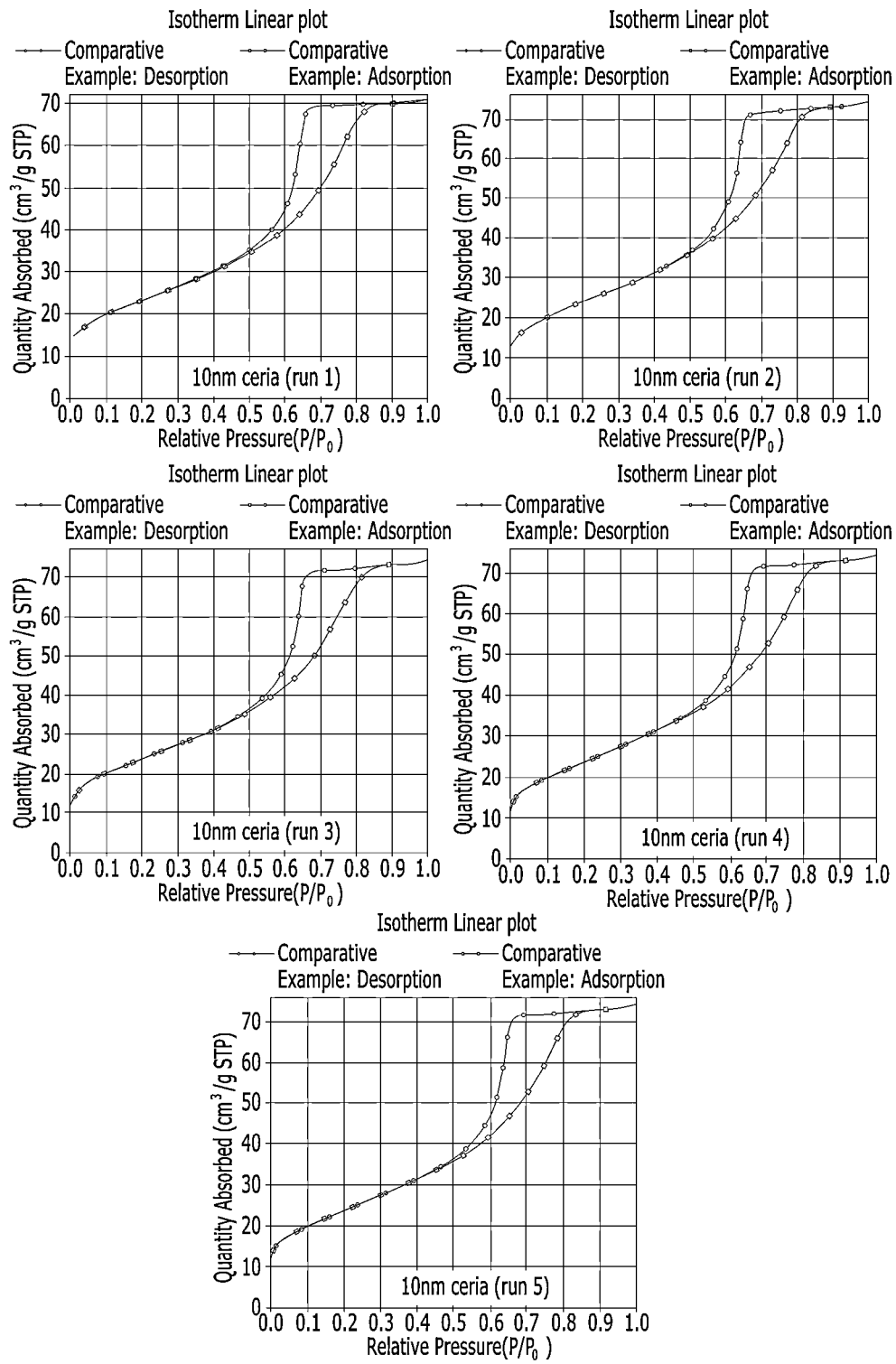
FIG. 39 shows the results of measuring the BET surface area of cerium oxide particles according to Comparative Example 1.

In order to measure the BET surface area, 1.0 g of each of the cerium oxide particle powder according to the example of the present invention and the cerium oxide particle powder according to Comparative Example 1 was degassed by pretreatment at 200° C. for 1 hour until the residual pressure reached a predetermined value or less, the adsorption amount of nitrogen gas according to the increase in relative pressure at 77K was measured using BET (Tristar II plus, Micrometrics). The BET surface area values based on the adsorption amount are shown in FIGS. 38 and 39 and Table 12 below.

TABLE 12

| BET surface area (m²/g) | Run 1 | Run 2 | Run 3 | Run 4 | Run 5 |
|---|---|---|---|---|---|
| Powder of Example | 41.2 | 40.3 | 39.9 | 38.6 | 38.1 |
| Powder of Comparative Example 1 | 83.3 | 86.2 | 86.5 | 86.1 | 86.5 |

Referring to Table 12, it can be confirmed that, when general pretreatment conditions (200° C., 1 hour) were applied, the cerium oxide particle powder according to one example of the present invention had a BET surface area of 50 m²/g or less when measured 5 times under the same conditions, whereas the cerium oxide particle powder according to Comparative Example 1 had a BET surface area of more than 80 m²/g when measured 5 times under the same conditions. It can be seen that the numerical values of the Comparative Examples are similar to the BET surface area of 10-nm cerium oxide particles, commonly known in literature.

From the above results, it can be seen that, contrary to the general tendency that the BET surface area increases as the particle size decreases, the cerium oxide particle powder according to the example of the present invention has a smaller BET surface area than the cerium oxide particle powder of Comparative Example 1, which as a coarser particle size, suggesting that the cerium oxide particles according to the example of the present invention have a finer particle size than the conventional cerium oxide particles, and thus when they are powdered, they can be packed at a higher density. This can be in the same context as the fact that cerium oxide particles synthesized by a self-assembly synthesis method such as a sol-gel method or a bottom-up method have fewer —OH functional groups than cerium oxide particles synthesized by other synthesis methods, and thus have a smaller BET surface area and pore volume.

Experimental Example 14. Analysis of Apparent Density of Cerium Oxide Particles

The dispersion of Preparation Example 1 according to the present application was dried at approximately 80 to 90° C., thus preparing powdery cerium oxide particles (sample A). In addition, powdery cerium oxide particles according to Comparative Examples 3 and 4 (samples B and C, respectively) were prepared by drying under the same conditions. Tables 13 and 14 below show the results of measuring the apparent densities and tap densities of the prepared sample A according to one example of the present invention and the samples according to Comparative Examples 3 and 4.

TABLE 13

| Sample | Sample A (Example) | Sample B (Comparative Example 3) | Sample C (Comparative Example 4) |
|---|---|---|---|
| Apparent density (g/ml) | 2.22 | 1.90 | 1.30 |

TABLE 14

| Sample | Sample A (Example) | Sample B (Comparative Example 3) | Sample C (Comparative Example 4) |
|---|---|---|---|
| Tap density (g/ml) | 2.94 | 2.86 | 1.60 |

Referring to Table 13, it was confirmed that the apparent density of sample A, measured by the stationary method, was 2.22 g/ml, whereas the apparent density of the 60-nm cerium oxide particles of Comparative Example 3 was 1.90 g/ml, and the apparent density of the calcined cerium oxide particles of Comparative Example 4 was 1.30 g/ml. Referring also to Table 14, it can be confirmed that the tap density of sample A was 2.94 g/ml, whereas the tap density of the 60-nm cerium oxide particles of Comparative Example 3 was 2.86 g/ml, and the tap density of the calcined cerium oxide particles of Comparative Example 4 was 1.60 g/ml, which was lower than 2.90 g/ml. Thereby, it can be confirmed that the cerium oxide particles according to one example of the present application have a larger apparent density than the cerium oxide particles of the Comparative Example, which have a coarser particle size, even though they have a finer primary particle size. Therefore, it can be confirmed that the cerium oxide particles according to the example of the present invention has a relatively high apparent density while having a particle size of 10 nm or less, which is smaller than the conventional cerium oxide particles.

Experimental Example 15. Measurement of Photoluminescence (PL) Intensity of Dispersion Containing Cerium Oxide Particles FIGS. 40 to 42 and Table 15 below show the results of measuring the photoluminescence intensity of each of an aqueous dispersion containing 1% by mass of the cerium oxide particles according to one example of the present invention, an aqueous dispersion containing 1% by mass of the conventional 60-nm cerium oxide particles, and an aqueous dispersion containing 1% by mass of the 10-nm cerium oxide particles produced by the calcination method. The photoluminescence intensity was measured under the following test conditions.

(1) Test instrument: Perkin Elmer LS-55 fluorescence spectrometer
(2) Excitation wavelength: 325 nm
(3) Emission filter: 350 rnm
(4) Excitation slit width: 10.0 nm
(5) Emission slit width: 10.0 nm

TABLE 15

| Dispersion containing 1 mass % of cerium oxide particles | Peak intensity 325 nm ($\lambda_{exc}$) | Peak intensity 450 nm ($\lambda_{ems1}$) | Peak intensity 525 nm ($\lambda_{ems2}$) | Peak intensity ratio ($\lambda_{ems1}/\lambda_{exc}$) | Peak intensity ratio ($\lambda_{ems1}/\lambda_{ems2}$) |
|---|---|---|---|---|---|
| Cerium oxide particles of the present invention | 0.31 | 1.72 | 0.23 | 5.5 | 7.5 |
| 10-nm cerium oxide particles produced by calcination | 1.20 | 43.36 | 32.53 | 36.1 | 1.3 |
| Conventional 60-nm cerium oxide particles | 0.99 | 40.44 | 12.07 | 40.8 | 3.4 |

Figure 40:
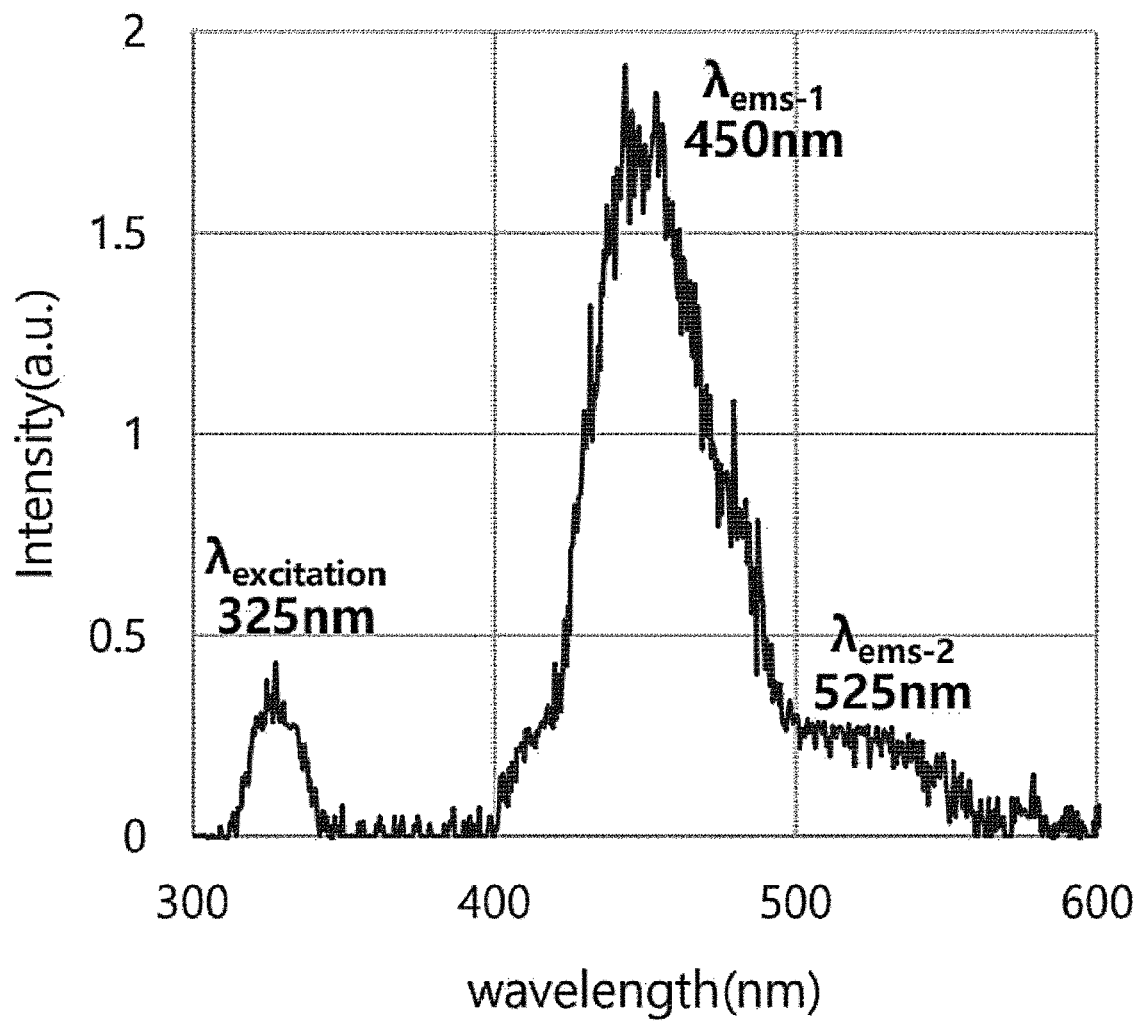
FIG. 40 shows the results of measuring the photoluminescence (PL) intensity of cerium oxide particles according to one example of the present invention.
Figure 41:
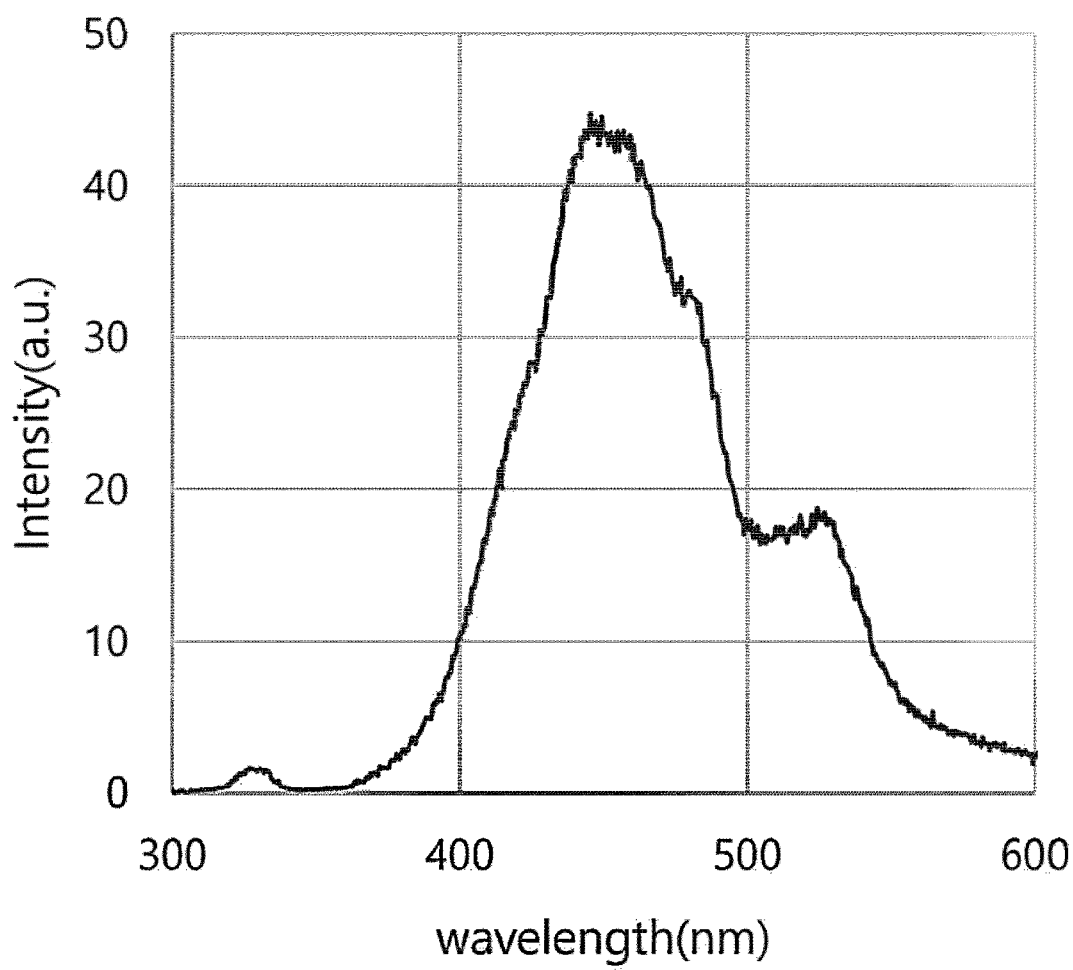
FIG. 41 shows the results of measuring the photoluminescence (PL) intensity of cerium oxide particles according to Comparative Example 3.
Figure 42:
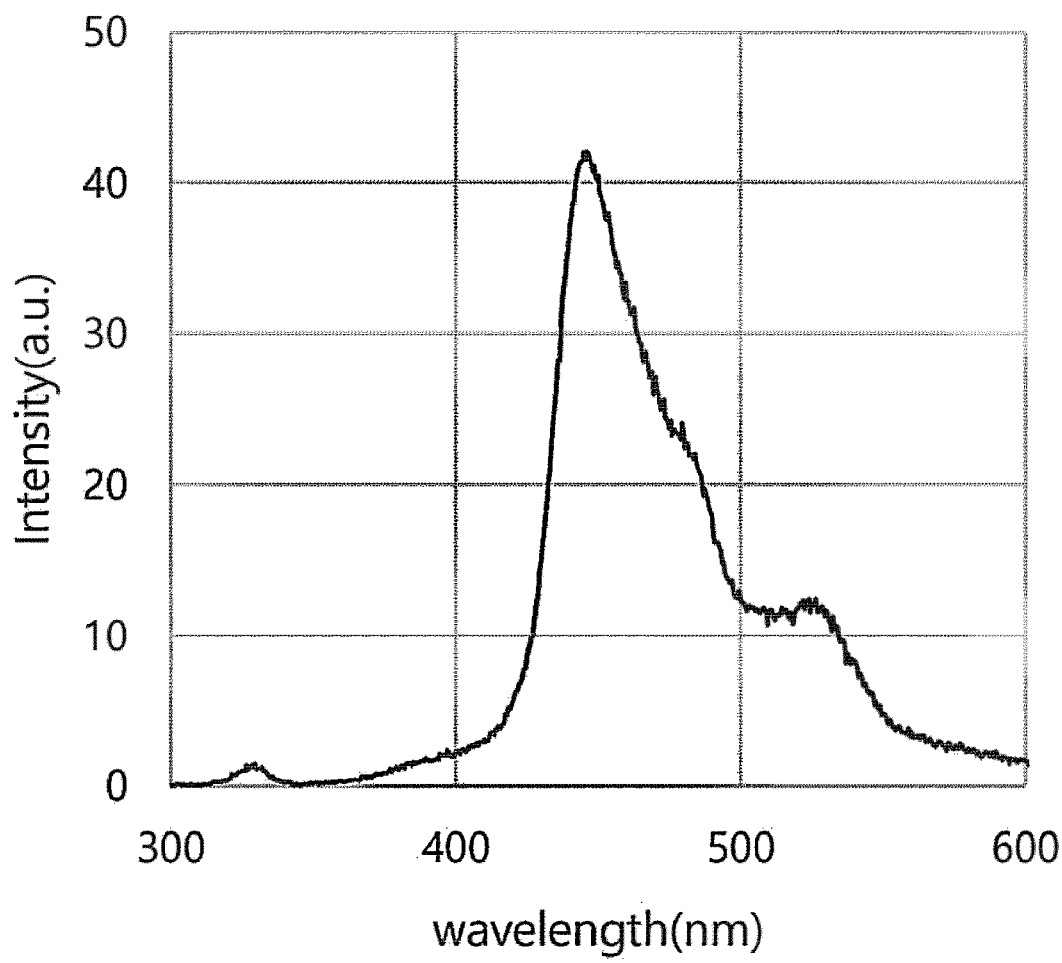

Referring to FIGS. 40 to 42 and Table 15 above, as a result of the fluorescence spectrometer analysis performed at an excitation wavelength ($\lambda_{excitation}$) of 325 nm, it can be seen that the three samples all exhibited an excitation peak ($\lambda_{exc}$) at a wavelength of about 325 nm, a first emission peak ($\lambda_{ems1}$) at a wavelength of about 450 nm, and a second emission peak ($\lambda_{ems2}$) at a wavelength of about 525 nm.

It could be seen that, in the case of the cerium oxide particles of the present invention, the ratio ($\lambda_{ems1}/\lambda_{ems2}$) of the first emission peak to the second emission peak was about 7.5, which was higher than 5. On the other hand, it was confirmed that, in the case of both the conventional 10-nm cerium oxide particles and the commercially available 60-nm cerium oxide particles produced by the calcination method, the ratio ($\lambda_{ems1}/\lambda_{ems2}$) of the first emission peak to the excitation peak was more than 30, the ratio ($\lambda_{ems1}/\lambda_{ems2}$) of the first emission peak to the second emission peak was less than 5.

It can be seen that, in the case of the cerium oxide particles of the present invention, the intensity of the first emission peak representing $Ce^{3+}$ was smaller than those of the conventional 10-nm cerium oxide particles obtained by calcination and the commercially available 60-nm cerium oxide particles. This is believed to be because, in the case of the cerium oxide particles of the present invention, agglomeration into secondary particles in the dispersion was very low and light transmittance was good, and thus the photoluminescence intensity was relatively weak. In addition, in the case of the cerium oxide particles of the present invention, unlike the conventional 60-nm particles or the cerium oxide particles obtained by a calcination method, the ratio of the first emission peak to the second emission peak ($\lambda_{ems1}/\lambda_{ems2}$) was 5 or more, suggesting that the cerium oxide particles of the present invention had a relatively high content of $Ce^{3+}$ on the surface. Thus, through this Experimental Experiment, it can be seen that, when the cerium oxide particles of the present invention are used in a slurry for chemical mechanical polishing, they have a very low degree of agglomeration in the slurry because they are fine while having a high content of $Ce^{3+}$ on the surface, and thus the chemical polishing rate is increased due to the Si—O—Ce bond between the cerium oxide particles and the oxide substrate, thereby increasing the oxide removal rate.

Figure 43:
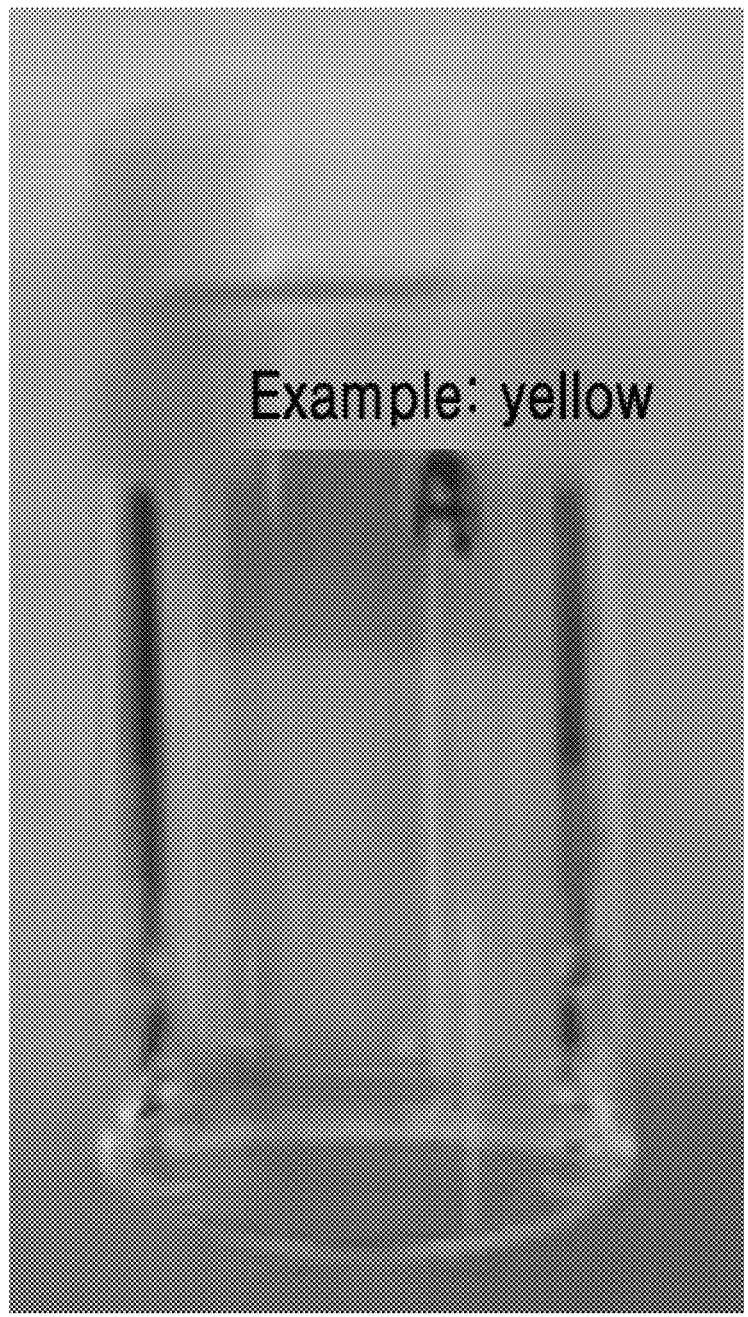
FIG. 43 is a dispersion containing 1% by mass of cerium oxide particles according to one example of the present invention, prepared for colorimetric measurement.
Figure 44:
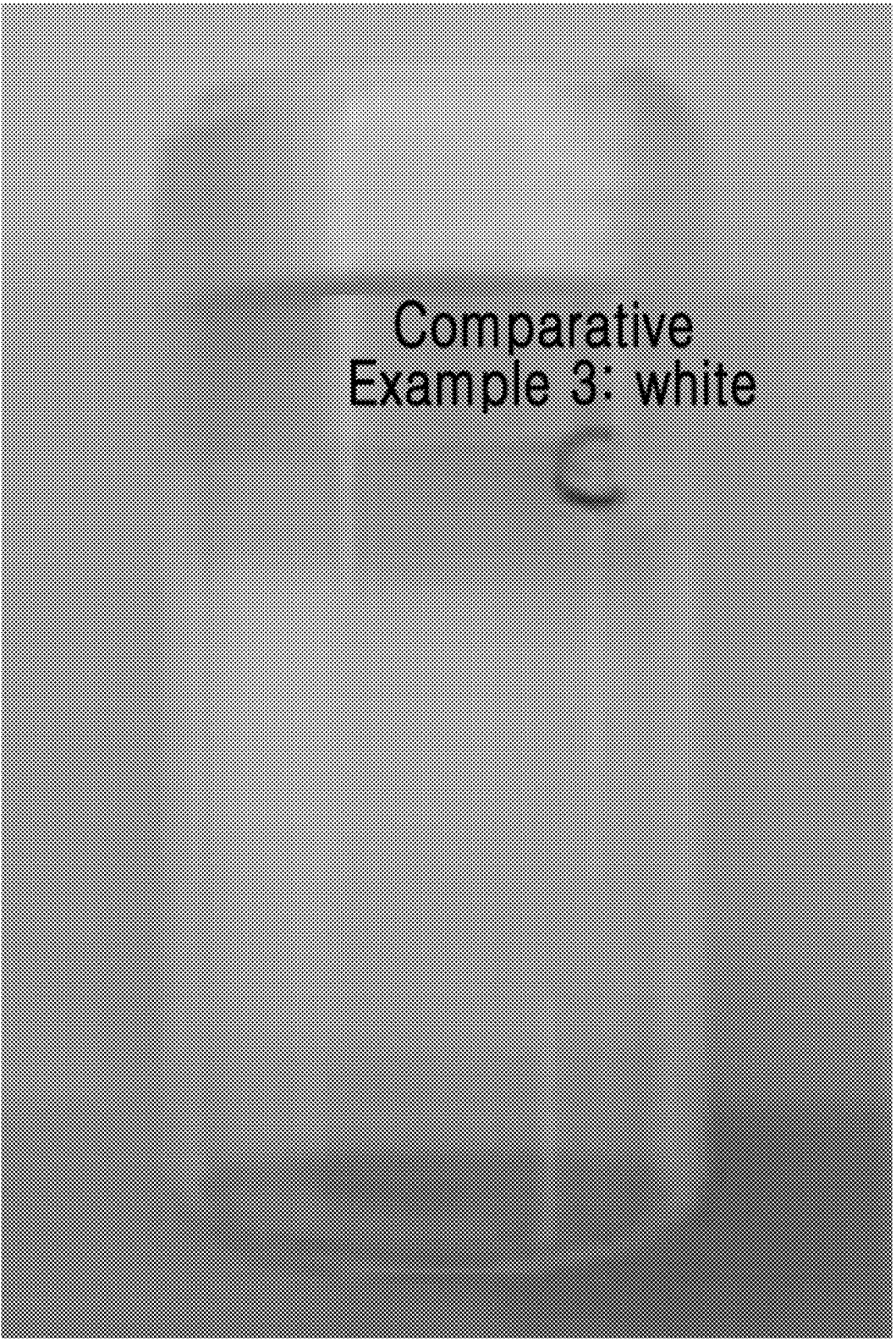
FIG. 44 is a dispersion containing 1% by mass of cerium oxide particles according to Comparative Example 3, prepared for colorimetric measurement.

Experimental Example 16. L*a*b* Colorimetric Analysis of Dispersion Containing Cerium Oxide Particles FIGS. 43 and 44 show an aqueous dispersion containing 1% by mass of the cerium oxide particles according to one example of the present invention and an aqueous dispersion containing 1% by mass of the conventional 60-nm cerium oxide particles.

Tables 16 and 17 summarize the L*a*b* colorimetric values of the dispersion containing 1% by mass of the cerium oxide particles according to one example of the present invention and the dispersion containing 1% by mass of the conventional 60-nm cerium oxide particles.

In one embodiment, L*a*b* colorimetric analysis was performed according to the method of ASTM E1164 (standard practice for obtaining spectrometric data for object color evaluation) using CM-5 (KONICA MINOLTA, JAPAN) and using xenon lamp D65 as a light source at a wavelength range of 360 to 740 nm and a wavelength interval of 10 nm. The results of the analysis are shown in Tables 16 and 17 below.

TABLE 16

| The present invention | L* (no units) | a* (no units) | b* (no units) |
|---|---|---|---|
| 1 | 99.74 | −5.58 | 11.72 |
| 2 | 99.74 | −5.58 | 11.72 |
| 3 | 99.74 | −5.58 | 11.72 |
| S.D. | 0.00 | 0.00 | 0.00 |
| CV (%) | 0.00 | 0.00 | 0.00 |
| Average | 99.74 | −5.58 | 11.72 |

TABLE 17

| 60-nm ceria particles | L* (no units) | * (no units) | b* (no units) |
|---|---|---|---|
| 1 | 94.73 | −2.19 | 0.13 |
| 2 | 94.72 | −2.19 | 0.13 |
| 3 | 94.71 | −2.18 | 0.13 |
| S.D. | 0.01 | 0.01 | 0.00 |
| CV (%) | 0.01 | −0.26 | 0.00 |
| Average | 94.72 | −2.19 | 0.13 |

Referring to FIGS. 43 and 44, it could be seen with the naked eye that the aqueous dispersion containing the cerium oxide particles of the present invention had a yellowish color, and the aqueous dispersion containing the conventional 60-nm class cerium oxide particles was opaque but closer to white.

Also, referring to Tables 16 and 17 above, it can be confirmed that, in the case of the dispersion containing 1% by mass of the cerium oxide particles according to one example of the present invention, the average value of L* was about 99.7, and the average value of a* was about −5.9, and the average value of b* was about 11.7. On the other hand, it can be confirmed that, in the case of the dispersion containing the conventional 60-nm cerium oxide particles, the average value of L* was about 94.7, the average value of a* was about −2.2, and the average value of b* was about 0.1. Thus, it could be seen that the cerium oxide particle dispersion according to the present invention satisfied an L* value of 95 or more and a b* value ranging from 10 to 25, and had a higher L* value than the conventional 60-nm cerium oxide particle dispersion, indicating that it had fine particle characteristics. In addition, the cerium oxide particle dispersion according to the present invention had a higher b* value, indicating that it had a higher yellowish color. From the fact that the dispersion containing the cerium oxide particles according to one example of the present application has L*, a* and b* values within the above-described ranges, and particularly, has high yellowness, it can be seen that he cerium oxide particles are very fine and monodisperse, and the content of $Ce^{3+}$ on the surfaces of the cerium oxide particles is relatively high.

Experimental Example 17. Sedimentation Rate of Cerium Oxide Particles by Centrifugation A slurry composition containing 1.0 wt % of the cerium oxide particles according to one example of the present application and a slurry composition containing 1.0 wt % of the cerium oxide particles of each of Comparative Example 1 and Comparative Example 3 were prepared as samples.

Each of the samples was centrifuged using a high-speed centrifuge or an ultra-high-speed centrifuge (Supra R22 model from Hanil Science Co., Ltd.) at a slurry composition temperature of 25° C. while changing the centrifugal force from 2100 G to 3300 G, 4265 G, 26188 G, and 398282 G. The sedimentation rates of the cerium oxide particles after centrifugation are shown in Table 18 below.

TABLE 18

| Centrifugation conditions | Sedimentation rate (wt %) | | |
|---|---|---|---|
| | Cerium oxide particles of the present invention | Cerium oxide particles of Comparative Example 1 | Cerium oxide particles of Comparative Example 3 |
| 2,100 G, 10 min | 0 | 0.7 | 84.7 |
| 3,300 G, 30 min | 0 | 5.48 | 96.9 (10 min) |
| 4,265 G, 30 min | 0 | 27.14 | — |
| 26,188 G, 30 min | 0 | 45.22 | — |
| 39,282 G, 30 min | 0 | 94.66 | — |

Referring to Table 18, it can be confirmed that, when the slurry composition containing 1.0 wt % of the cerium oxide particles of each of the example and Comparative Examples 1 and 4 was centrifuged, the sedimentation rate of the cerium oxide particles according to one example of the present invention was lower than those of the cerium oxide particles of Comparative Example 1 and Comparative Example 3 under the same conditions. For example, it can be confirmed that, when centrifugation was performed with a centrifugal force of 4,265 G for 30 minutes, the example of the present invention showed a sedimentation rate of 0 wt %, whereas Comparative Example 1 showed a sedimentation rate of 27.14 wt %, and Comparative Example 3 already showed a sedimentation rate of 96.9 wt % when centrifugation was performed for 10 minutes with a centrifugal force of 3,300 G, which was smaller than 4,265 G. This suggests that the primary and/or secondary particle sizes of the cerium oxide particles according to the example of the present invention are finer than those of the cerium oxide particles of Comparative Example 1 and Comparative Example 3, and that the cerium oxide particles according to the example of the present invention are monodisperse. Thus, it can be seen that the monodispersed particles come into contact with a wafer during a chemical mechanical polishing process, and the number of particles contacting the wafer increases, this increasing the oxide removal rate. In addition, it can be seen that, when polishing is performed using the slurry composition containing the cerium oxide particles according to the example of the present invention, the probability of occurrence polishing defects such as scratches on the wafer can be reduced.

Experimental Example 18. Analysis of Residual Amount of Cerium Oxide Precursor

Evaluation was performed to measure the residual amount of the precursor in the CMP slurry containing the cerium oxide particles produced in Preparation Example 2. The slurry sample of Preparation Example 2 was dried at high temperature to obtain powder, and then the remaining powder was dissolved again in pure water. As a result of analyzing the precursor content of the solution (obtained by dissolution in pure water) by ICP-MS and converting it to a weight percentage relative to the cerium oxide powder, it was confirmed that materials such as basic materials, solvents, and ammonia were almost not detected and they were 300 ppm or less. "Almost not detected" means that the powder either does not contain these materials or contains them in significantly small amounts of less than 1 ppm. Thus, it can be seen that the cerium oxide particles were appropriately distributed in the slurry and hardly contained a cerium precursor, basic material and other impurities that may occur due to the nature of the wet process. Thus, it can be seen that the cerium oxide particles according to one embodiment of the present application are prepared in the form of a dispersion through a wet process, they do not need to be dispersed again in a slurry solvent through a separate separation or milling process.

TABLE 19

| | Impurities in synthetic raw material | | | |
|---|---|---|---|---|
| Sample name | Cerium precursor material | Basic material | Solvent | Ammonia |
| Batch 1 | Not detected (N.D.) | N.D. | N.D. | N.D. |
| Batch 2 | N.D. | N.D. | N.D. | N.D. |
| Batch 3 | N.D. | N.D. | N.D. | N.D. |

Experimental Example 19. Comparison of Oxide Removal Rate Between Cerium Oxide Particles The slurry composition of Preparation Example 2 according to the present invention and the slurry compositions of Comparative Example 1 and Comparative Example 3 were prepared as samples.

Polishing of an oxide wafer using each of the samples was performed using a polishing system (Reflexion® LK CMP, Applied Materials). Specifically, a PE-TEOS silicon oxide wafer (300 mm PE-TEOS Wafer) was placed on a platen, and a surface of the wafer was brought into contact with a polishing pad (IC1010, DOW). Then, the slurry composition of each sample was supplied at a rate of 200 mL/min, and a polishing process was performed while rotating the platen and the pad of the polishing pad. At this time, the rotation speed of the platen and the rotation speed of the head were 67 rpm and 65 rpm, respectively, the polishing pressure was 2 psi, and the polishing time was 60 seconds. Meanwhile, the silicon oxide layer thickness of the wafer was measured using ST5000 (Spectra Thick 5000ST, K-MAC). The results are shown in Table 20 below.

TABLE 20

|  | Comparative Example 1 | Comparative Example 3 | Example |
|---|---|---|---|
| Cerium oxide | Commercially available nanoparticles of 10 nm or less | Commercially available 60-nm nanoparticles | Particles of the present invention |
| Cerium oxide content | 0.05% | 0.05% | 0.05% |
| pH | 5.5 | 5.5 | 5.5 |
| PETEOS removal rate | 354 Å/min | 546 Å/min | 3,458 Å/min |

As shown in Table 20 above, it can be confirmed that, when the slurry composition of the example was used, the silicon oxide removal rate was about 6 times higher than those shown when the slurry compositions of Comparative Examples 1 and 3 were used. This is believed to be because, in the case of the cerium oxide particles contained in the slurry composition of the example, the particle size was small, the number of particles effective for polishing was large, and the content (molar ratio and/or weight ratio) of $Ce^{3+}$ on the surface was high, and thus chemical reactivity with the surface of the silicon oxide layer increased.

Experimental Example 20. Defect Evaluation for Cerium Oxide Particles

Figure 45:
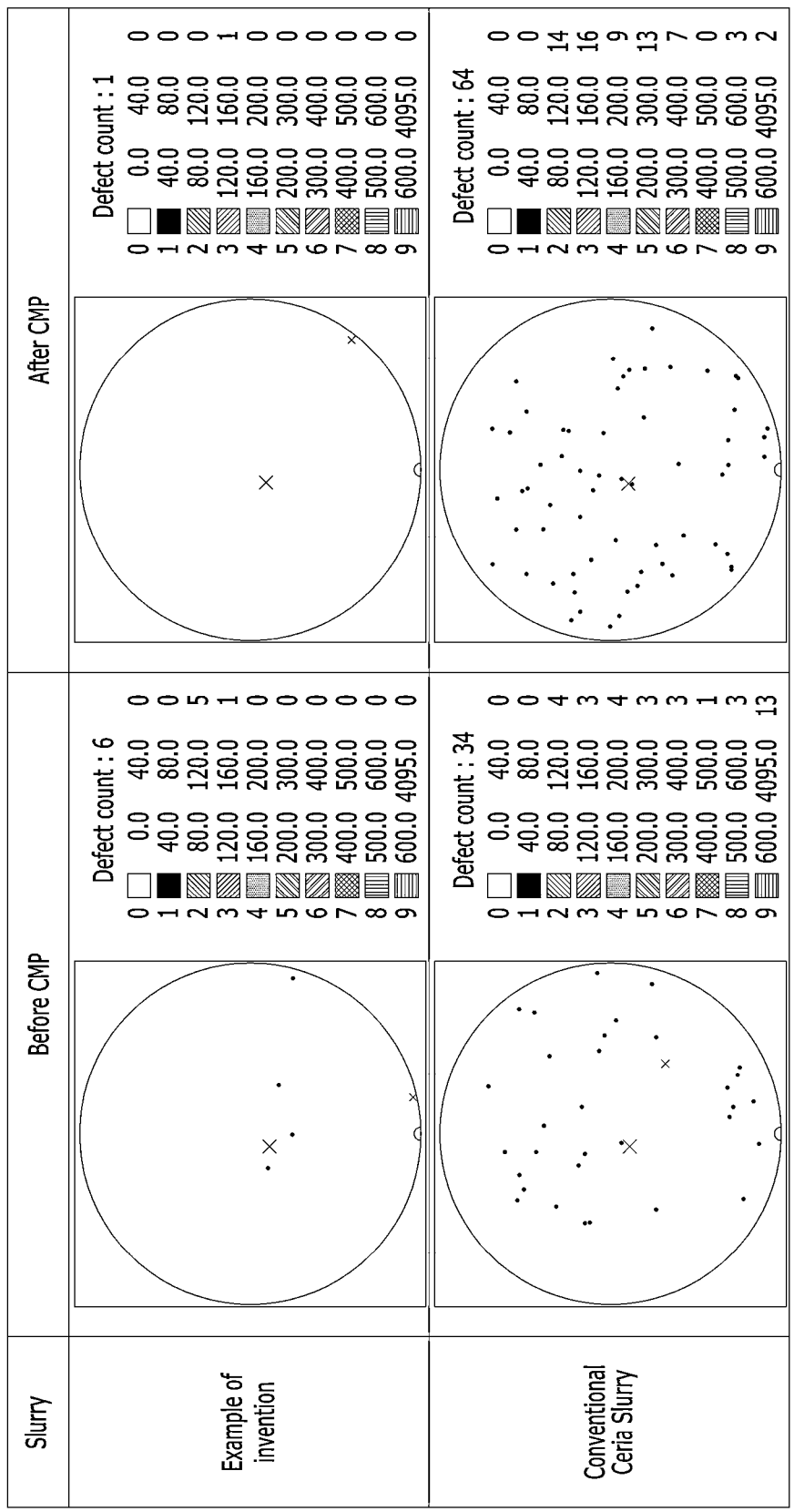
FIGS. 45 and 46 show scanned images before and after CMP of an oxide wafer using a CMP slurry composition containing cerium oxide particles according to one example of the present invention and a CMP slurry composition containing 60-nm cerium oxide particles.
Figure 46:
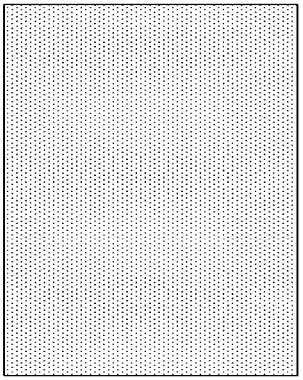

FIGS. 45 and 46 show scanned images before and after CMP of an oxide wafer using a CMP slurry composition containing the cerium oxide particles according to one example of the present invention and a CMP slurry composition containing 60-nm cerium oxide particles.

Surface analysis of the oxide wafer was performed by a full wafer scan method using an AIT-XP instrument.

Referring to FIGS. 45 and 46, as a result of analyzing the surface of the oxide wafer subjected to CMP using the CMP slurry composition containing the cerium oxide particles according to the example of the present invention before and after CMP, it could be confirmed that the number of defects before CMP was 6, and the number of defects after CMP was 1, indicating that the number of defects on the surface of the oxide wafer was reduced after performing CMP using the CMP slurry composition according to the example of the present invention. In addition, it could be confirmed that no scratches occurred on the wafer surface during the CMP process. On the other hand, as a result of analyzing the surface of the oxide wafer subjected to CMP using a CMP slurry composition containing the conventional cerium oxide particles before and after CMP, it could be confirmed that the number of defects before CMP was 34, but the number of defects after CMP increased to 64, suggesting that the conventional cerium oxide particles scratched the surface of the wafer. This suggests that the probability of occurrence of defects on the surface of an oxide wafer to be polished can be significantly reduced because the sizes of the cerium oxide particles according to the example of the present invention are smaller than those of the conventional cerium oxide particles.

Experimental Example 21. Analysis of Oxide Removal Rate Behavior and Oxide-to-Polysilicon Selectivity Following Addition of Cationic Polymer The cerium oxide particles produced according to one example of the present application or the commercially available 60-nm cerium oxide particles were added to deionized water and adjusted to a pH to 5.8, and then a cationic polymer was added thereto as shown in Table 21 below. Next, the oxide removal rate (Å/min) and the polysilicon removal rate (Å/min) were measured under the same polishing conditions as in Experimental Example 19.

TABLE 21

| | CMP slurry composition | | | | | Oxide removal rate (Å/min) | Poly-Si removal rate (Å/min) |
|---|---|---|---|---|---|---|---|
| | Abrasive particles and concentration | | Cationic polymer | | | | |
| | Type | Amount added | Type | Conc. (wt %) | pH | | |
| Example 1 | Particles of the invention | 0.05% | — | — | 5.8 | 3,258 | 1,253 |
| Example 2 | Particles of the invention | 0.05% | Poly(diallydimethyl ammonium chloride) | 0.01% | 5.8 | 3,985 | 15 |
| Example 3 | Particles of the invention | 0.05% | polyacrylamide-co-diallydimethyl ammonium chloride | 0.01% | 5.8 | 4,256 | 13 |
| Example 4 | Particles of the invention | 0.05% | Polyehthyleneimine | 0.01% | 5.8 | 3,888 | 15 |
| Example 5 | Particles of the invention | 0.05% | Poly(trimethylammonio ethyl methacrylate) | 0.01% | 5.8 | 3,978 | 14 |
| Example 6 | Particles of the invention | 0.05% | dicyandiamide-diethylenetriamine copolymer | 0.01% | 5.8 | 4,655 | 21 |

TABLE 21-continued

| | CMP slurry composition | | | | | Oxide removal rate (Å/min) | Poly-Si removal rate (Å/min) |
|---|---|---|---|---|---|---|---|
| | Abrasive particles and concentration | | Cationic polymer | | | | |
| | Type | Amount added | Type | Conc. (wt %) | pH | | |
| Example 7 | Particles of the invention | 0.05% | diallyldimethylamine/hydrochloride-acrylamide copolymer | 0.01% | 5.8 | 4,355 | 6 |
| Example 8 | Particles of the invention | 0.05% | dicyandiamide-formaldehyde copolymer | 0.01% | 5.8 | 4,215 | 9 |
| Comp. Example 1 | Commercial 60 nm nanoparticles | 0.05% | — | — | 5.8 | 522 | 89 |
| Comp. Example 2 | Commercial 60 nm nanoparticles | 0.05% | Poly(diallydimethyl ammonium chloride) | 0.01% | 5.8 | 11 | 10 |
| Comp. Example 3 | Commercial 60 nm nanoparticles | 0.05% | polyacrylamide-co-diallydimethyl ammonium chloride | 0.01% | 5.8 | 5 | 6 |
| Comp. Example 4 | Commercial 60 nm nanoparticles | 0.05% | Polyehthyleneimine | 0.01% | 5.8 | 3 | 8 |
| Comp. Example 5 | Commercial 60 nm nanoparticles | 0.05% | Poly(trimethylammonioethyl methacrylate) | 0.01% | 5.8 | 2 | 9 |
| Comp. Example 6 | Commercial 60 nm nanoparticles | 0.05% | dicyandiamide-diethylenetriamine copolymer | 0.01% | 5.8 | 6 | 12 |
| Comp. Example 7 | Commercial 60 nm nanoparticles | 0.05% | diallyldimethylamine/hydrochloride-acrylamide copolymer | 0.01% | 5.8 | 8 | 10 |
| Comp. Example 8 | Commercial 60 nm nanoparticles | 0.05% | dicyandiamide-formaldehyde copolymer | 0.01% | 5.8 | 3 | 5 |

Referring to Table 21, as a result of adding 0.01 wt % of the cationic polymer to the slurries containing the commercial 60-nm cerium oxide particles of Comparative Examples 2 to 8, it could be confirmed that the silicon oxide removal rate was remarkably reduced. On the other hand, it could be confirmed that, when the cationic polymer was added to the slurries containing the cerium oxide particles of Examples 2 to 8 according to the present invention as shown in Table 21, the oxide removal rate was increased. This is a feature not seen in the CMP slurries containing the conventional cerium oxide particles.

In addition, when comparing Example 1 of Table 21 with Examples 2 to 8 containing cationic polymers, it could be confirmed that, in the case of Examples 2 to 8, the silicon oxide removal rate significantly decreased while the polysilicon removal rate significantly decreased, and the oxide-to-polysilicon selectivity was in the range of about 200 to 900, which was lower than 2,000.

Figure 47:
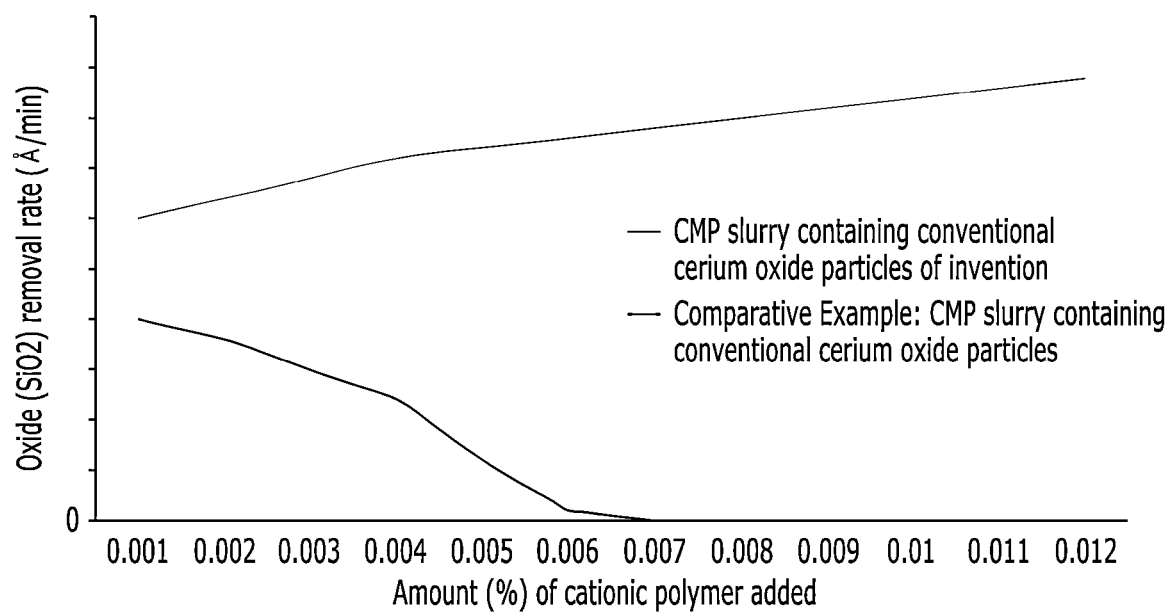
FIG. 47 shows the results of measuring the oxide removal rate behavior following the addition of a cationic polymer to a CMP slurry composition containing cerium oxide particles according to one example of the present invention.

In addition, the behavior of the oxide removal rate (Å/min) was examined while gradually increasing the content of the cationic polymer in each of the samples of the Examples and the Comparative Examples in Table 21 above. FIG. 47 shows the results of measuring the oxide removal rate behavior following the addition of a cationic polymer to a CMP slurry composition containing the cerium oxide particles according to one example of the present invention.

Referring to FIG. 47 and Table 21 above, it could be observed that the removal rate by the CMP slurry of the present invention increased as the content of the cationic polymer increased, whereas, in the case of the conventional ceria slurry, the removal rate decreased gradually when the concentration of the cationic polymer was continuously increased to 0.001% or more. Thus, it can be seen that, in the case of the conventional wet ceria slurry, the cationic polymer simply serves as a pH buffer and is added for particle stability, and hence when the content of the cationic polymer is increased, the cationic polymer can interfere with performing the polishing process with abrasive particles, whereas, in the case of the CMP slurry of the present invention, the cationic polymer serves not only to provide particle stability, but also as a polishing accelerator.

Mode for Invention

Hereinafter, the present invention will be described in more detail. However, the present invention may be embodied in various different forms, and the scope of the present invention is not limited by the embodiments described herein and is defined only by the appended claims.

In addition, terms used in the present invention are merely used to describe specific embodiments, and are not intended to limit the present invention. Singular expressions include plural expressions unless the context clearly dictates otherwise. Throughout the present specification, it is to be understood that when any part is referred to as "comprising" any component, it does not exclude other components, but may further comprise other components, unless otherwise specified.

The term "monodisperse" used as in the present invention means that, when cerium oxide particles are dispersed in a slurry, their agglomeration into secondary particles is suppressed and their primary particle size is relatively maintained. Specifically, the term "monodisperse" may mean that the secondary particle size (D50) determined by dynamic light scattering (DLS) analysis is at most 3.0 times, at most 2.8 times, at most 2.5 times, at most 2.2 times, at most 2.0 times, or at most 1.9 times the size the primary particle size determined by TEM. In addition, the term "monodisperse" does not exclude the inclusion of unavoidable impurities of a relatively coarse size when examining the particle size distribution and the like.

The term "transparent" as used in the present invention means that when cerium oxide particles are dispersed in a slurry, the slurry composition appears transparent when viewed visually. More specifically, the term "transparent" may mean that the slurry composition has an average light transmittance of 50% or more, advantageously 70% or more, more preferably 80% or more, for light in the visible wavelength region. Further, the term "transparent" may mean that the agglomeration of the cerium oxide particles of the present invention into secondary particles is suppressed and the primary particle size is relatively maintained.

A polishing composition may be characterized according to its polishing rate (i.e., removal rate) and its planarization efficiency. The polishing rate refers to the rate of removal of a material from the surface of a substrate and is usually expressed in terms of units of length (thickness) per unit of time (e.g., Angstroms (Å) per minute). Specifically, a polishing surface, e.g., a polishing pad, first contacts the "high points" of the surface and must remove material in order to form a planar surface. A process that results in achieving a planar surface with lowest trench loss is considered to be more efficient than a process requiring removal of more material to achieve planarity.

Often the rate of removal of a silicon oxide pattern can be rate-limiting for the dielectric polishing step in STI processes, and therefore high removal rates of the silicon oxide pattern are desired to increase device throughput. However, if the blanket removal rate is too rapid, overpolishing of oxide in exposed trenches can result in trench erosion and increased device defectivity.

Hereinafter, the present invention will be described in detail.

A first aspect of the present invention provides
cerium oxide particles for chemical mechanical polishing, the cerium oxide particles having a light transmittance of 50% or more for light having a wavelength of 500 nm, as measured for an aqueous dispersion containing 10 wt % of the cerium oxide particles.

Hereinafter, cerium oxide particles for chemical mechanical polishing according to one aspect of the present invention will be described in detail.

FIG. 1 illustrates an oxide removal mechanism according to one embodiment of the present invention. As shown in FIG. 1, only when $Ce^{3+}$ ions on the surfaces of cerium oxide particles are activated, they can smoothly react with $SiO_2$.

In one embodiment of the present invention, the particle sizes of the cerium oxide particles (primary particles) may be measured by X-ray diffraction (XRD) analysis. In one embodiment of the present invention, the particle sizes of the cerium oxide particles, measured by X-ray diffraction (XRD) analysis, may be 11 nm or less. In another embodiment, the particle sizes may be 10.8 nm or less, 10.5 nm or less, 10.2 nm or less, 10 nm or less, 9.5 nm or less, 9.0 nm or less, 8.5 nm or less, 8.0 nm or less, 7.5 nm or less, 7.0 nm or less, 6.5 nm or less, 6.0 nm or less, 5.5 nm or less, 5.0 nm or less, 4.5 nm or less, or 4.0 nm or less, and may be 0.3 nm or more, 0.5 nm or more, 0.7 nm or more, 1.0 nm or more, 1.1 nm or more, 1.2 nm or more, 1.3 nm or more, 1.4 nm or more, 1.5 nm or more, 1.6 nm or more, 1.7 nm or more, 1.8 nm or more, 1.9 nm or more, 2.0 nm or more, 2.1 nm or more, 2.2 nm or more, 2.3 nm or more, or 2.4 nm or more. If the sizes of the cerium oxide particles are less than 0.3 nm, crystallinity may be lowered, and the removal rate of a polishing-target layer may be excessively suppressed, so that the polishing efficiency may be reduced, and conversely, if the particle sizes are more than 11 nm, surface defects such as scratches may occur in large quantities. In one embodiment of the present invention, the average particle size of the cerium oxide particles, measured by X-ray diffraction (XRD) analysis, may be 0.5 to 10 nm, preferably 1 to 10 nm, more preferably 2 to 9 nm.

In another embodiment of the present invention, the particle sizes of the cerium oxide particles (primary particles) may be measured by transmission electron microscopy (TEM). In one embodiment of the present invention, the particle sizes of the cerium oxide particles, measured by transmission electron microscopy (TEM), may be 11 nm or less. In another embodiment, the particle sizes may be 10.8 nm or less, 10.5 nm or less, 10.2 nm or less, 10 nm or less, 9.5 nm or less, 9.0 nm or less, 8.5 nm or less, 8.0 nm or less, 7.5 nm or less, 7.0 nm or less, 6.5 nm or less, 6.0 nm or less, 5.5 nm or less, 5.0 nm or less, 4.5 nm or less, or 4.0 nm or less, and may be 0.3 nm or more, 0.5 nm or more, 0.7 nm or more, 1.0 nm or more, 1.1 nm or more, 1.2 nm or more, 1.3 nm or more, 1.4 nm or more, 1.5 nm or more, 1.6 nm or more, 1.7 nm or more, 1.8 nm or more, 1.9 nm or more, 2.0 nm or more, 2.1 nm or more, 2.2 nm or more, 2.3 nm or more, or 2.4 nm or more. If the sizes of the cerium oxide particles are less than 0.3 nm, crystallinity may be lowered, and the removal rate of a polishing-target layer may be excessively suppressed, so that the polishing efficiency may be reduced, and conversely, if the particle sizes are more than 11 nm, surface defects such as scratches may occur in large quantities. In one embodiment of the present invention, the average particle size of the cerium oxide particles, measured by transmission electron microscopy (TEM), may be 0.5 to 10 nm, preferably 1 to 10 nm, more preferably 2 to 9 nm.

In another embodiment of the present invention, the particle sizes of the cerium oxide particles (primary particles) may be measured by small-angle X-ray scattering (SAXS) analysis. In one embodiment of the present invention, the particle sizes of the cerium oxide particles, measured by small-angle X-ray scattering (SAXS) analysis, may be 15 nm or less. In another embodiment, the particle sizes may be 14 nm or less, 13 nm or less, 12 nm or less, 11 nm or less, 10 nm or less, 9.5 nm or less, 9.0 nm or less, 8.5 nm or less, 8.0 nm or less, 7.5 nm or less, 7.0 nm or less, 6.5 nm or less, 6.0 nm or less, 5.5 nm or less, 5.0 nm or less, 4.5 nm or less, or 4.0 nm or less, and may be 0.3 nm or more, 0.5 nm or more, 0.7 nm or more, 1.0 nm or more, 1.1 nm or more, 1.2 nm or more, 1.3 nm or more, 1.4 nm or more, 1.5 nm or more, 1.6 nm or more, 1.7 nm or more, 1.8 nm or more, 1.9 nm or more, 2.0 nm or more, 2.1 nm or more, 2.2 nm or more, 2.3 nm or more, or 2.4 nm or more. If the sizes of the cerium oxide particles are less than 0.3 nm, crystallinity may be lowered, and the removal rate of a polishing-target layer may be excessively suppressed, so that the polishing efficiency may be reduced, and conversely, if the particle sizes are more than 15 nm, surface defects such as scratches may occur in large quantities. In one embodiment of the present application, the average particle size of the cerium oxide particles, measured by small-angle X-ray scattering method (SAXS) analysis, may be 0.5 to 15 nm, preferably 1 to 12 nm, more preferably 1.5 to 10 nm.

In one embodiment of the present invention, the particle sizes of the cerium oxide particles in a slurry (secondary particles) may be measured by dynamic light scattering (DLS) analysis. The dynamic light scattering analysis may be performed using an analysis instrument well known to those skilled in the art, and preferably, may be performed using an Anton Parr particle size analyzer or Malvern Zetasizer Ultra, without being limited thereto.

In one embodiment of the present invention, the particle sizes of the cerium oxide particles, measured by dynamic light scattering (DLS) analysis, may be 1 to 30 nm. In another embodiment of the present invention, the particle sizes may be 29 nm or less, 27 nm or less, 25 nm or less, 23 nm or less, 22 nm or less, 20.8 nm or less, 20.5 nm or less, 20.2 nm or less, 20 nm or less, 19.8 nm or less, 19.5 nm or less, 19.2 nm or less, 18 nm or less, 17 nm or less, or 15 nm or less, and may be 1.2 nm or more, 1.4 nm or more, 1.5 nm or more, 1.8 nm or more, 2 nm or more, 3 nm or more, or 4 nm or more. If the sizes of the secondary particles are larger than the upper limit of the above range, it means that a large amount of agglomeration of the primary particles in the slurry composition has occurred, and in this case, the slurry composition is hardly regarded as a monodisperse slurry. If the sizes of the secondary particles are smaller than the lower limit of the above range, the removal rate of a polishing-target layer may be excessively suppressed, so that the polishing efficiency may be reduced.

In one embodiment of the present invention, the cerium oxide particles may satisfy the following Equation 2:

$$a \leq 2.2b \qquad \text{[Equation 2]}$$

In this equation, "a" represents the size of the cerium oxide particle, measured by dynamic light scattering (DLS) analysis, and "b" represents the size of the cerium oxide particle, measured by transmission electron microscopy (TEM).

This characteristic will be an indicative of low agglomeration when the cerium oxide particles of the present invention are dispersed in a slurry. When the coefficient "b" is more than 2.2, it means that a large amount of agglomeration occurs in the slurry, which means that the particle size becomes coarse, and thus it is difficult to suppress wafer surface defects during polishing.

In another embodiment of the present invention, the cerium oxide particles may satisfy the following Equation 3:

$$a \leq 2.5b \qquad \text{[Equation 3]}$$

In this equation, "a" represents the size of the cerium oxide particle, measured by dynamic light scattering (DLS) analysis, and "b" represents the size of the cerium oxide particle, measured by small-angle X-ray scattering (SAXS)) analysis.

This characteristic will be an indicative of low agglomeration when the cerium oxide particles of the present invention are dispersed in a slurry. When the coefficient "b" is more than 2.5, it means that a large amount of agglomeration occurs in the slurry, which means that the particle size becomes coarse, and thus it is difficult to suppress wafer surface defects during polishing.

In one embodiment of the present invention, the content of $Ce^{3+}$ on the surfaces of the cerium oxide particles may be analyzed by XPS using, for example, a theta probe base system manufactured by Thermo Fisher Scientific Co. the content of $Ce^{3+}$ on the surfaces of the cerium oxide particles may be calculated by the following Formula 1:

$Ce^{3+}$ content (%)=($Ce^{3+}$ peak area)/[($Ce^{3+}$ peak area)+($Ce^{4+}$ peak area)] [Formula 1]

In one embodiment, when the surfaces of the cerium oxide particles are analyzed by X-ray photoelectron spectrometry (XPS), XPS peaks that represent the Ce—O binding energy representing $Ce^{3+}$ may appear 900.2 to 902.2 eV, 896.4 to 898.4 eV, 885.3 to 887.3 eV, and 880.1 to 882.1 eV. Specifically, when the surfaces of the cerium oxide particles are analyzed by X-ray photoelectron spectrometry (XPS), XPS peaks that represent the Ce—O binding energy representing $Ce^{3+}$ may include a first peak at 900.2 to 902.2 eV, a second peak at 896.4 to 898.4 eV, a third peak at 885.3 to 887.3 eV, and a fourth peak at 880.1 to 882.1 eV.

In one embodiment of the present invention, with the total area of the XPS peaks, the area of the first peak may be 3% or more, or 4% or more, the area of each of the second peak and the fourth peak may be 5% or more, 7% or more, or 10% or more, and the area of the third peak may be 4% or more, 5% or more, or 6% or more.

In one embodiment of the present invention, when the surfaces of the cerium oxide particles are analyzed by X-ray photoelectron spectrometry (XPS), the ratio of the sum of XPS peak areas, which represent the Ce—O binding energy representing $Ce^{3+}$, to the sum of XPS peak areas which represent the Ce—O binding energy on the surfaces, may be 0.29 to 0.70. In another embodiment of the present invention, the ratio of the sum of XPS peak areas, which represent the Ce—O binding energy representing $Ce^{3+}$, to the sum of XPS peak areas which represent the Ce—O binding energy on the surfaces, may be 0.18 or more, 0.19 or more, 0.192 or more, 0.195 or more, 0.198 or more, 0.20 or more, 0.202 or more, 0.205 or more, 0.208 or more, 0.21 or more, 0.22 or more, 0.24 or more, 0.25 or more, 0.27 or more, 0.28 or more, 0.30 or more, 0.32 or more, or 0.35 or more, and may be 0.90 or less, 0.88 or less, 0.85 or less, 0.83 or less, 0.80 or less, 0.77 or less, 0.75 or less, 0.72 or less, 0.71 or less, 0.705 or less, 0.70 or less, 0.695 or less, 0.69 or less, 0.68 or less, 0.67 or less, 0.66 or less, 0.65 or less, 0.64 or less, 0.63 or less, 0.62 or less, 0.61 or less, or 0.60 or less. If the ratio is lower than the lower limit of the above, a sufficient amount of $Ce^{3+}$ does not exist on the surfaces of the cerium oxide particles, and thus it may be difficult to achieve a sufficient increase in the oxide removal rate, and if the ratio is higher than the upper limit of the above, it is hardly considered that the particles exist as cerium oxide particles, in consideration of the oxidation number.

That is, in one embodiment of the present invention, the content of $Ce^{3+}$ on the surfaces of the cerium oxide particles for chemical mechanical polishing, measured by X-ray photoelectron spectrometry (XPS) analysis, may be 18 atomic % or more, 19 atomic % or more, 20 atomic % or more, 22 atomic % or more, 24 atomic % or more, 25 atomic % or more, 27 atomic % or more, 28 atomic % or more, 30 atomic % or more, 32 atomic % or more, or 35 atomic % or more, and may be 90 atomic % or less, 88 atomic % or less, 85 atomic % or less, 83 atomic % or less, 80 atomic % or less, 77 atomic % or less, 75 atomic % or less, 72 atomic % or less, or 70 atomic % or less.

The cerium oxide particles according to one embodiment of the present application are characterized in that the surfaces of the particles have a high $Ce_{3+}$ content. This is believed to be because the wet particle synthesis process in the liquid phase is performed under acidic conditions. When the $Ce^{3+}$ content on the particle surface is relatively high as described above, the oxide removal rate may be increased.

In one embodiment of the present invention, the cerium oxide particles according to one embodiment of the present invention exhibit Raman spectral characteristics suggesting that the particles contain a large amount of $Ce3^+$ component on the particle surface, which distinguishes these particles from conventional abrasive particles. Specifically, the cerium oxide particles may be characterized by having two or more Raman peak spectra.

In one embodiment of the present invention, the cerium oxide particles may have a first Raman peak in a band range of 455 $cm^{-1}$ to 460 $cm^{-1}$. In another embodiment of the present invention, the cerium oxide particles may have a second Raman peak in a band range of 586 $cm^{-1}$ to 627

$cm^{-1}$. In another embodiment of the present invention, the cerium oxide particles may have a third Raman peak in a band range of 712 $cm^{-1}$ to 772 $cm^{-1}$. Here, the band range may mean a Raman shift range that is the X-axis of the Raman spectrum.

In one embodiment of the present invention, in the cerium oxide particles, the ratio (A/B) of the first Raman peak intensity (A) to the second Raman peak intensity (B) may be 35 or less. The A/B ratio may be preferably 30 or less, more preferably 25 or less, even more preferably 20 or less. The lower limit of the A/B ratio range is not particularly limited, but may be 5 or more, 10 or more, or 15 or more. The second Raman peak may be considered as a Raman shift generated as the oxygen vacancy rate due to an increase in the content of $Ce^{3+}$. Thus, it can be seen that, as the intensity ratio (A/B) decrease, the $Ce^{3+}$ content of the cerium oxide particles increase. This increased $Ce^{3+}$ content accelerates the chemical polishing action using the Si—O—Ce bond with an oxide wafer. This suggests that, when the cerium oxide particles according to the embodiment of the present invention are used, the removal rate of the oxide wafer may be increased, even though the cerium oxide particles have a finer particle size than conventional cerium oxide particles.

In one embodiment of the present invention, the ratio (A/C) of the first Raman peak intensity (A) to the third Raman peak intensity (C) may be 50 or less. The A/C ratio may be preferably 45 or less, more preferably 43 or less. The lower limit of the A/C ratio is not particularly limited, but may be 5 or more, 10 or more, or 15 or more.

As described above, the cerium oxide particles according to one embodiment of the present invention have a higher content of $Ce^{3+}$ than conventional cerium oxide particles, and thus even though having a small particle size, they may provide a slurry composition exhibiting an excellent polishing rate even at a low cerium oxide particle content, and also the occurrence of polishing scratches may be controlled.

In one embodiment of the present invention, the $Ce^{3+}$ content on the surface of the cerium oxide particle may be analyzed using an electron energy loss spectroscopy (EELS) spectrum. For example, the spectrum may have an EELS peak representing an oxidation state indicative of two or more $Ce^{4+}$.

The cerium oxide particles (and/or a slurry composition containing the same) may exhibit EELS spectra as shown in FIGS. 23 to 25.

The EELS spectrum of the cerium oxide particles according to one embodiment of the present invention may include a first peak at 876.5 to 886.5 eV and a second peak at 894.5 to 904.5 eV, wherein the maximum intensity of the first peak may be greater than the maximum intensity of the second peak. This aspect may mean that an EELS spectrum similar to that of trivalent cerium oxide is displayed as the content of $Ce^{3+}$ in the cerium oxide particles increases.

In one embodiment of the present invention, the EELS spectrum may further include a third peak at 886.5 to 889.5 eV and a fourth peak at 904.5 to 908.5 eV. The third and fourth peaks may be distinguished according to the oxidation state, and the cerium oxide particle of the present invention may be distinguished from conventional cerium oxide particle by calculating the areas of the corresponding peak regions appearing due to the oxidation state of $Ce^{4+}$.

In one embodiment of the present invention, the ratio ($P_1/P_t$) of the area ($P_1$) of the third peak region to the total area ($P_t$) of the peaks in the spectrum may be 0.025 or less, more preferably 0.024 or less, 0.022 or less, 0.018 or less, 0.015 or less, 0.012 or less, 0.011 or less, or 0.01 or less. On the other hand, conventional cerium oxide particles exhibit a value of at least 0.03 or more, and this characteristic will be described in the experimental examples below.

In one embodiment of the present invention, the ratio (($P_1+P_2$)/$P_t$) of the area ($P_1$) of the third peak region and the area ($P_2$) of the fourth peak region to the total area ($P_t$) of the peaks in the spectrum may be 0.1 or less. In addition, the ratio (($P_1+P_2$)/$P_t$) may be 0.099 or less, 0.098 or less, 0.096 or less, 0.095 or less, 0.094 or less, 0.092 or less, or 0.090 or less. The ratio (($P_1+P_2$)/$P_t$) of the cerium oxide particles according to one embodiment of the present invention may mean an average of values measured n times for the same sample. In another embodiment, the ratio (($P_1+P_2$)/$P_t$) may be 0.01 or more, 0.012 or more, 0.014 or more, 0.016 or more, or 0.018 or more. When the ratio (($P_1+P_2$)/$P_t$) is 0.1 or less, it may mean that the content of $Ce^{3+}$ relative to the total cerium oxide content on the surface of the cerium oxide particle is high. A higher $Ce^{3+}$ content may accelerate the chemical polishing action through Si—O—Ce bonding to a silicon oxide, thereby increasing the removal rate of the silicon oxide.

The cerium oxide particles according to one embodiment of the present application exhibit X-ray absorption fine structure (XAFS) spectral characteristics suggesting that the particle surface contains a large amount of $Ce^{3+}$ component, which distinguishes the cerium oxide particles from conventional abrasive particles. Specifically, the cerium oxide particles may be characterized by having two or more peaks in the XAFS spectrum.

In one embodiment of the present application, the cerium oxide particles (and/or a slurry composition containing the same) may exhibit XAFS spectra as shown in FIGS. 9 and 10.

In one embodiment, the cerium oxide particles may have a maximum light absorbance coefficient of a first peak in the range of 5,730 eV or more to less than 5,740 eV, as determined by the XAFS spectrum, wherein the first peak may be indicative of the oxidation state of $Ce^{3+}$.

In another embodiment, the cerium oxide particles may have a maximum light absorbance coefficient of a second peak in the range of 5,740 eV or more to less than 5,760 eV, as determined by the XAFS spectrum, wherein the second peak may be indicative of the oxidation state of $Ce^{4+}$.

In one embodiment of the present invention, the maximum light absorption coefficient of the first peak (maximum value of the peak) may be 0.1 to 0.4. In another embodiment of the present invention, the maximum light absorption coefficient of the first peak may be 0.11 or more, 0.12 or more, 0.13 or more, 0.14 or more, 0.15 or more, 0.2 or more, or 0.25 or more, and may be 0.38 or less, 0.35 or less, 0.32 or less, or 0.30 or less.

In one embodiment of the present invention, the maximum light absorption coefficient of the second peak (maximum value of the peak) may be less than 0.6. In another embodiment of the present application, the maximum optical absorption coefficient of the second peak may be 0.11 or more, 0.12 or more, 0.13 or more, 0.14 or more, 0.15 or more, 0.2 or more, or 0.25 or more, and may be 0.58 or less, 0.55 or less, 0.52 or less, or 0.50 or less.

If the light absorption coefficient of the first peak is less than 0.1 and if the light absorption coefficient of the second peak exceeds 0.6, it means that the weight of $Ce^{3+}$ decreases relative to the total weight of the cerium oxide surface, which may mean that the removal rate may be reduced.

In one embodiment of the present invention, the ratio ($A_1/A_2$) of the area ($A_1$) of the first peak area to the area ($A_2$) of the second peak in the XAFS spectrum may be 0.03 or more, 0.05 or more, 0.07 or more, 0.09 or more, or 0.1 or more, preferably 0.11 or more, more preferably 0.12 or more. That is, the ratio $(A_3/(A_3+A_4))$ of the area $(A_3)$ of the peak indicative of $Ce^{3+}$ to the sum of the area $(A_3)$ of the peak indicative of $Ce^{3+}$ and the area of the peak $(A_4)$ indicative of $Ce^{4+}$ in the XAFS (X-ray absorption fine structure) spectrum may be 0.1 or more (10% or more). If the ratio $(A_1/A_2)$ is less than 0.03, the removal rate may be lowered because the $Ce^{3+}$ content relative to the $Ce^{4+}$ content on the surface of the cerium oxide particle is not sufficient.

In one embodiment of the present invention, photoelectron spectroscopy analysis may be performed on the cerium oxide particles, and specifically, UV photoelectron spectroscopy (UPS) analysis using light in the UV region may be performed. Photoelectron spectroscopy techniques may be classified into been X-ray photoelectron spectroscopy (XPS) that uses single-wavelength light in the X-ray region, and UV photoelectron spectroscopy (UPS) that uses light in the UV region. XPS is a technique that finds out the type, chemical state, concentration, etc. of elements in a sample by analyzing electrons mainly emitted from the core levels of atoms in the sample by using X-rays having energy of about 1,000 to 1,500 eV, and for XPS, many commercial instruments are sold and analysis methods and usage methods are widely known. On the other hand, UPS is a technique that examines the various states of electrons, which directly participate in chemical bonding, in solids, by emitting electrons in the valence electron region of a sample using light in the extreme ultraviolet region of about 10 to 20 eV. In particular, so-called angle-resolved UPS (ARUPS/ARPES) can directly measure the band structure of a single crystal sample, and thus this measurement may be used to determine the physical properties of high-temperature superconductors or large magnetoresistive materials, which are important factors in understanding the unique properties of materials. When a solid sample is irradiated with light having an energy of hv, electrons obtain kinetic energy while satisfying the law of conservation of energy and momentum. In this case, the value of the kinetic energy of the electron emitted from the sample and is given as follows:

$$E_{kin}=hv-\phi-|E_b|$$

Ekin is the kinetic energy of the emitted electron, $\phi$ is the work function of the sample, and Eb is the binding energy of the emitted bound to the sample. By measuring the intensity according to the kinetic energy of the emitted electrons using an electron energy analyzer, the density of state according to the binding energy of the electrons in the sample can be determined.

Therefore, referring to the above equation, the binding energy can be obtained through the measured kinetic energy. In this case, the work function $\phi$ of the sample may be expressed using the hv value of the source energy, the Fermi energy level $(E_F)$, and the vacuum level $(E_{cutoff})$.

$$\phi=hv-|E_f-E_{cutoff}|$$

When the UPS result values are plotted on a graph, zero on the x-axis represents the Fermi energy level $(E_F)$ of the sample, and $E_{cutoff}$ is a value represented by the vacuum level. hv is source energy used when emitting ultraviolet rays, and represents the energy of incident light, and helium (He) may generally be used as a source.

In one embodiment of the present invention, the band structure of the cerium oxide particle may differ depending on the size of the particle. As the size of the particle decreases, the energy level difference between orbitals of the sample gradually increases, resulting in a high energy band gap. On the other hand, as the particle size increases, the energy level difference gradually decreases, resulting in a low energy band gap. Therefore, as described above, as the size of the particle becomes smaller, the energy gap between the valence band and the conduction band increases, and the values of the Fermi level $(E_F)$ and the vacuum level may be changed, resulting in an increase in the energy (eV) of the work function.

When the cerium oxide particles are analyzed by ultraviolet photoelectron spectroscopy (UPS), the maximum value of the number of photoelectrons (counts) emitted per second may be in a kinetic energy range of 10 eV or less. This characteristic is in contrast to conventional ceria particles. The maximum value of the number of photoelectrons (counts) emitted per second may be in a kinetic energy range of 6 to 10 eV, or 7 to 10 eV, preferably 8 to 10 eV.

In one embodiment of the present invention, a work function value measured by the UPS of the cerium oxide particles may be in the range of 2.5 eV or more. The work function value may preferably be in the range of 2.7 eV or more, or more preferably 3.0 eV or more. The upper limit of the work function value is not particularly limited and may be less than 10 eV, 9 eV or less, or 8 eV or less. The fact that the work function value satisfies the above-described range is a feature that is in contrast to conventional cerium oxide particles, which means that the sizes of the cerium oxide particles dispersed in a slurry is small, which indicates that the degree of particle agglomeration is very low. By having a low degree of agglomeration and monodisperse characteristics as described above, the cerium oxide particles according to one embodiment of the present application, when contained in a slurry for chemical mechanical polishing and used, can maximize the number of particles in contact with a wafer, increase the oxide removal rate, and at the same time, minimize the occurrence of defects on the wafer surface because the particle size itself is fine.

In one embodiment of the present invention, when the specific surface area of 1 g of powder consisting of the cerium oxide particles is measured, the BET surface area of the cerium oxide particles may be 50 m²/g or less. In another embodiment, the BET surface area may be 49 m²/g or less, 48 m²/g or less, 47 m²/g or less, 46 m²/g or less, 45 m²/g or less, 44 m²/g or less, or 43 m²/g or less, more preferably 42 m²/g or less. These cerium oxide particles show a tendency different from conventional cerium oxide particles having a larger BET surface area value as the particle size decreases. This is believed to be because cerium oxide particles synthesized by a self-assembly synthesis method such as a sol-gel method or a bottom-up method have a smaller BET surface area and pore volume than cerium oxide particles synthesized by other synthesis methods, an in particular, the proportion of —OH functional groups present on the surface of the cerium oxide particles are low. In addition, it can be anticipated that, when 1.0 g of powder consisting of particles having a finer particle size than the conventional cerium oxide particles is analyzed by BET under the same conditions, the powder sample is aligned at a higher density than the conventional cerium oxide particles according to Comparative Example 1, and has a lower BET surface. Therefore, it can be confirmed that, although the cerium oxide particles according to the embodiment of the present invention have a finer particle size than the conventional 10-nm cerium oxide particles according to Comparative Example 1, the BET surface area thereof is smaller than that of the cerium oxide particles according to Comparative Example 1. The above results may be in the same context as the fact that the cerium oxide particles according to the embodiment of the present invention have a finer particle size than conventional cerium oxide particles, and at the same time, exhibit surface chemical characteristics in that the $Ce^{3+}$ content on the particle surface is higher than the content of $Ce^{3+}$ and —OH functional groups.

In one embodiment of the present invention, the apparent density of the cerium oxide particles, measured by a stationary method, may be 2.00 to 5.00 g/ml, preferably 2.00 to 4.00 g/ml, more preferably 2.00 to 3.00 g/ml.

In one embodiment of the present invention, the tap density of the cerium oxide particles may be 2.90 to 5.00 g/ml, preferably 3.00 to 5.00 g/ml, more preferably 3.20 to 5.00 g/ml.

When a slurry obtained by dispersing cerium oxide particles having an apparent density of more than 5.00 g/ml in water is used for polishing, it may scratch a polishing-target surface the coarse primary and secondary particle sizes. In addition, if cerium oxide particles having an apparent density of less than 2.00 g/ml are used, a sufficient polishing effect may not be obtained while the removal rate extremely decreases together with a decrease in the primary particle size. For this reason, in one embodiment of the present invention, it may be desirable to maintain an apparent density of 2.00 g/ml or more even at a small particle size of 10 nm or less. Therefore, it can be seen that the cerium oxide particles according to one embodiment of the present invention differ from conventional cerium oxide particles in that they have a relatively high apparent density, despite their fine particle size. It can be expected that this characteristic may also partially affect the oxide removal rate.

In one embodiment of the present invention, when the photoluminescence (PL) intensity of the cerium oxide particles at a wavelength of 325 nm is measured for an aqueous dispersion containing 1.0 wt % of the cerium oxide particles, the maximum intensity of a first peak ($\lambda_1$) at a wavelength of 435 to 465 nm may be in the range of 0.1 to 30, 0.2 to 20, 0.3 to 10, or 0.5 to 7. In the case of conventional commercially available coarse cerium oxide particles, the maximum peak intensity is measured to be more than 30 under the same conditions, which may mean that the degree of agglomeration in a slurry is high and thus photoluminescence occurs more strongly than transmission.

In one embodiment of the present invention, when the photoluminescence (PL) intensity of the cerium oxide particles at a wavelength of 325 nm is measured for an aqueous dispersion containing 1.0 wt % of the cerium oxide particles, the maximum intensity of a second peak ($\lambda_2$) at a wavelength of 510 to 540 nm may be in the range of 0.1 to 10, 0.1 to 7.5, 0.1 to 5, or 0.1 to 3. In the case of conventional commercially available coarse cerium oxide particles, the maximum peak intensity is measured to be more than 10 under the same conditions, which may mean that the degree of agglomeration in a slurry is high and thus photoluminescence occurs more strongly than transmission.

In one embodiment of the present invention, the characteristics of the cesium oxide particles may be determined by measuring the photoluminescence (PL) intensity at a wavelength of 325 nm for an aqueous dispersion containing 1.0 wt % of the cerium oxide particles. Specifically, in one embodiment of the present invention, when fluorescence spectrometric analysis is performed at a wavelength of 325 nm, the cesium oxide particles may exhibit an excitation peak at a wavelength ($\lambda_{exc}$) of 310 to 335 nm, a first peak ($\lambda_1$) at a wavelength of 435 to 465 nm, and a second peak ($\lambda_2$) at a wavelength of 510 to 540 nm. It can be interpreted that the excitation peak represents a peak for an excitation wavelength, the first peak represents $Ce^{3+}$, and the second peak represents $Ce^{4+}$.

In one embodiment of the present invention, when the photoluminescence (PL) intensity at a wavelength of 325 nm is measured for an aqueous solution containing 1.0 wt % of the cesium oxide particles, the intensity ratio ($\lambda_1/\lambda_{exc}$) of the first peak ($\lambda_1$) at a wavelength of 435 to 465 nm to the excitation ($\lambda_{exc}$) at a wavelength of 310 to 335 nm may be less than 30, preferably 27 or less, 25 or less, more preferably 23 or less, 20 or less, more preferably 18 or less, 15 or less, even more preferably 10 or less.

In one embodiment of the present invention, the intensity ratio ($\lambda_1/\lambda_2$) of the first peak ($\lambda_1$) to the second peak ($\lambda_2$) at a wavelength of 510 to 540 nm may be 4 or more, preferably 5 or more, more preferably 5.5 or more, more preferably 6 or more, and may be 20 or less, preferably 18 or less, more preferably 15 or less, still more preferably 12 or less, even more preferably 10 or less.

Since the cerium oxide particles according to one embodiment of the present invention satisfy the intensity ratio ($\lambda_1/\lambda_{exc}$) of the first peak ($\lambda_1$) to the excitation peak ($\lambda_{exc}$) and the intensity ratio ($\lambda_1/\lambda_2$) of the first peak ($\lambda_1$) to the second peak ($\lambda_2$) within the above-described ranges, it can be seen that, although the cerium oxide particles has a high content of $Ce^{3+}$ on the surfaces, their aggregation into secondary particles in a dispersion is very low, resulting in good light transmittance, and at the same time, have a relatively high content of $Ce^{3+}$ on the surfaces of the particles. The cerium oxide particles of the present invention have a high $Ce_{3+}$ content on the particle surface and are fine, and thus when they are used in a slurry for chemical mechanical polishing, their agglomeration in the slurry is very low. Thus, it can be seen that the chemical polishing rate is increased due to the Si—O—Ce bond between cerium oxide particles and the oxide substrate, and thus the oxide removal rate is increased.

In one embodiment of the present invention, the yellowness of a dispersion containing the cerium oxide particles may be evaluated by the L*a*b* color system, wherein L*a*b is defined by the CIE1976 L*a*b* color space defined by the Commission Internationable de Eclairage (CIE) in 1976. This color space is a color space having the quantities L*, a* and b* determined by the following equations in an orthogonal coordinate system.

$$L^*=116(Y/Y_0)^{1/3}-16$$

$$a^*=500[(X/X_0)^{1/3}-(Y/Y_0)^{1/3}]$$

$$b^*=200[(Y/Y_0)^{1/3}-(Z/Z_0)^{1/3}]$$

(wherein $X/X_0$, $Y/Y_0$, $Z/Z_0$>0.008856, X, Y, Z are the tristimulus values of object color, $X_0$, $Y_0$, and $Z_0$ are the tristimulus values of the light source illuminating the object color, and $Y_0$=100)

L* represents lightness and is also called "brightness index". In addition, a* and b* represent hue and chroma, and are also called "chromaticness index". In the L*a*b* color system, a larger L* value indicates a color closer to white, and a smaller L* value indicates a color closer to black. Further, as the value of a* increases toward "+", red color becomes stronger, and as the value of a* decreases (increases toward "−"), green color becomes stronger. In addition, as the value of b* increases toward "+", the yellow color becomes stronger, and as the b* value decreases (increases toward "−"), the blue color becomes stronger. In addition, when both a* value and b* value are 0, it means that the color is achromatic.

In one embodiment of the present invention, when the color of an aqueous solution containing 1.0 wt % of the cerium oxide particles is expressed in the L*a*b* color system, the L* value may be 80 or more, preferably 85 or more, more preferably 90 or more, even more preferably 95 or more, still more preferably 98 or more. When the L* value is smaller than the lower limit of the above range, it means that the grain growth of the cerium oxide abrasive particles has progressed too much, and that there are many coarse particles that cause defects on a wafer during polishing. In addition, the L* value may be 100 or less, more preferably 99.9 or less.

In one embodiment of the present application, the b* value may be 8 or more, preferably 10 or more, more preferably 11 or more, and may be less than 30, preferably 25 or less, more preferably 20 or less, more preferably 15 or less. If the value of b* is smaller than the lower limit of the above range, a chemical reaction necessary for polishing may not be obtained, and fine irregularities of the polishing-target surface may not be polished smoothly.

In one embodiment of the present application, the a* value may be less than −3, preferably −4 or less, more preferably −5 or less, and may be −8 or more, more preferably −7 or more.

Thus, when the color of an aqueous solution containing 1.0 wt % of the cerium oxide particles is expressed in the L*a*b* color system, if each value is within the above-described range, the dispersion may be observed to be yellow transparent, and it is considered that the removal rate can increase as the yellowness of the dispersion increases. In particular, when the cerium oxide particles according to one embodiment of the present invention are contained in a slurry for chemical mechanical polishing despite their fine particle size, the oxide removal rate may be remarkably high because the proportion of $Ce^{3+}$ on the surface of the cerium oxide particle is high, and defects on the wafer surface can be minimized due to the fine particles. When each value expressed by the L*a*b* color system is within the above range, or in particular, the yellowness is high, it may mean that the proportion of $Ce^{3+}$ on the surface of the cerium oxide particle is higher than to that of conventional cerium oxide particle.

In one embodiment of the present invention, when an aqueous dispersion containing 1.0 wt % of the cerium oxide particles is centrifuged at a centrifugal force of 4,265 G (6,000 rpm) for 30 minutes, the sedimentation rate of the cerium oxide particles may be 25 wt % or less. In another embodiment, the sedimentation rate may be 20 wt % or less, 15 wt % or less, 10 wt % or less, more preferably 5 wt % or less.

In one embodiment of the present invention, when an aqueous dispersion containing 1.0 wt % of the cerium oxide particles is centrifuged at a centrifugal force of 2,100 G (3,200 rpm) for 10 minutes, the sedimentation rate of the cerium oxide particles may be 0.6 wt % or less. In another embodiment, the sedimentation rate may be 0.55 wt % or less, 0.5 wt % or less, 0.45 wt % or less, more preferably 0.4 wt % or less.

In one embodiment of the present invention, when an aqueous dispersion containing 1.0 wt % of the cerium oxide particles is centrifuged at a centrifugal force of 3,300 G (4,000 rpm) for 30 minutes, the sedimentation rate of the cerium oxide particles may be 5.0 wt % or less. In another embodiment, the sedimentation rate may be 4.8 wt % or less, 4.5 wt % or less, 4.2 wt % or less, more preferably 4.0 wt % or less.

In one embodiment of the present invention, when an aqueous dispersion containing 1.0 wt % of the cerium oxide particles is centrifuged at a centrifugal force of 26,188 G (12,000 rpm) for 30 minutes, the sedimentation rate of the cerium oxide particles may be 45.0 wt % or less. In another embodiment, the sedimentation rate may be 42 wt % or less, 40 wt % or less, 38 wt % or less, more preferably 35 wt % or less.

In one embodiment of the present invention, when an aqueous dispersion containing 1.0 wt % of the cerium oxide particles is centrifuged at a centrifugal force of 39,282 G (18,000 rpm) for 30 minutes, the sedimentation rate of the cerium oxide particles may be 90.0 wt % or less. In another embodiment, the sedimentation rate may be 80 wt % or less, 70 wt % or less, 65 wt % or less, more preferably 60 wt % or less.

In one embodiment of the present application, the liquid viscosity of the aqueous dispersion may be 0.3 to 2.0 mPa·s, 0.5 to 1.8 mPa s, 0.55 to 1.5 mPa s, or 0.6 to 1.2 mPa·s. In a preferred embodiment, centrifugation may be performed under conditions of 0.65 to 1.2 mPa·s.

When the sedimentation rate of the cerium oxide particles is lower than or equal to the lower limit of the above range after centrifuged under conditions ranging from the weak centrifugal force to the severe centrifugal force as described above, it may mean that the cerium oxide particles according to one embodiment of the present invention have a finer particle size than conventional cerium oxide particles and are monodisperse. Therefore, it can be seen that, since the monodisperse particles will come into contact with a wafer in a chemical mechanical polishing process, the number of particles contacting the wafer may increase, resulting in an increase in the oxide removal rate. In addition, it can be seen that, when polishing is performed using the fine cerium oxide particles of the embodiment of the present invention, the probability of occurrence of polishing defects may be reduced.

In one embodiment of the present application, the cerium oxide primary particles may have at least one shape selected from the group consisting of spherical, cubic, tetragonal, orthorhombic, rhombohedral, monoclinic, hexagonal, triclinic, and cuboctahedron shapes, but preferably may be spherical particles.

In one embodiment of the present invention, the cerium oxide particles may be produced by a method of growing particles through chemical synthesis, preferably a bottom-up method. As a method for synthesizing the cerium oxide particles, a sol-gel method, a supercritical reaction, a hydrothermal reaction, or a co-precipitation method may be used, without being limited thereto. The bottom-up method is a type of chemical synthesis method that has recently attracted attention, and is a method of growing a starting material of atoms or molecules into nanometer-sized particles through a chemical reaction.

In one embodiment of the present invention, the polishing composition contains wet-process cerium oxide particles. The wet-process cerium oxide particles may be any suitable wet-process cerium oxide particles. For example, the wet-process cerium oxide particles may be precipitated cerium oxide particles or condensation-polymerized cerium oxide particles, including colloidal cerium oxide particles.

In one embodiment of the present invention, the wet-process cerium oxide particles also preferably have defects on the surfaces of the particles. Without wishing to be bound by any particular theory, it is believed that milling cerium oxide particles can result in defects on the surfaces of the ceria particles, and these defects also impact the performance of cerium oxide particles in chemical-mechanical polishing compositions. In particular, cerium oxide particles can be fractured as they are milled, which can expose less favored surface states. This process, known as relaxation, results in atoms near the surface of the ceria particles that have a limited ability to reorganize and return to a more favored state, leading to the formation of defects on the particle surface.

In one embodiment of the present invention, in the generation of secondary particles of the abrasive, each solvent has a unique dielectric constant, and the dielectric constant of a solvent causes variations in surface energy, surface charge, etc., in a nucleation step and a crystal growth step during the synthesis of powder, thereby affecting the agglomeration and growth of nuclei, and thus affecting the size and shape of the resultant powder. The dielectric constant of a solvent is in proportion to the surface potential (zeta potential) of particles dispersed in the solvent, and a low zeta potential may cause very rapid agglomeration between particulates or nuclei because the particulates or the nuclei resulting from nucleation are in an unstable state due to low surface repellency therebetween. With regard to this, the magnitude of surface repellency between the particulates or the nuclei is almost the same with one another, and thus the particulates or the nuclei may be agglomerated into uniform sized particles. The so-agglomerated secondary particles grow into relatively large sized particles because the primary particles or the nuclei experience a particle merger process, such as strong agglomeration action or Ostwald ripening, according to reaction conditions including temperature, concentration, etc.

A second aspect of the present invention provides
a slurry composition for chemical mechanical polishing containing: cerium oxide particles; and a solvent, wherein the cerium oxide particles have a light transmittance of 50% or more for light having a wavelength of 500 nm, as measured for an aqueous dispersion containing 1.0 wt % of the cerium oxide particles.

Detailed description of portions overlapping with those in the first aspect of the present invention has been omitted, but the contents described with respect to the first aspect of the present invention are likewise applicable to the second aspect even if the description thereof is omitted in the second aspect.

Hereinafter, the slurry composition for chemical mechanical polishing according to the second aspect of the present disclosure will be described in detail.

A slurry composition for chemical mechanical polishing according to one embodiment of the present disclosure contains cerium oxide particles and a solvent.

In one embodiment of the present invention, the cerium oxide particles contained as abrasive particles in the slurry may have a positive zeta potential value, and preferably have a zeta potential value of 1 to 80 mV, 5 to 60 mV, or 10 to 50 mV, in the range of pH 2 to 8. As the cerium oxide particles have a positive zeta potential value, the polishing efficiency may be increased by the attractive force between the cerium oxide particles and the surface of a silicon oxide layer as the polarity of the surface of the silicon oxide layer shows a negative value.

In one embodiment of the present invention, the cerium oxide particles have a lower hardness than silica particles or alumina particles, but very rapidly polish silicon-containing surfaces such as glass or semiconductor substrates by a chemical polishing mechanism in which a Si—O—Ce bond is formed between silica and cerium, indicating that the cerium oxide particles are advantageous for polishing semiconductor substrates.

In one embodiment of the present invention, the content of the precursor material contained in the slurry composition may be 300 ppm or less on a weight basis. In another embodiment of the present invention, the content of the precursor material contained in the slurry composition may be 200 ppm or less, 150 ppm or less, 100 ppm or less, 75 ppm or less, 50 ppm or less, 25 ppm or less, 15 ppm or less, 10 ppm or less, 7.5 ppm or less, 5 ppm or less, 2.5 ppm or less, 2 ppm or less, 1.75 ppm or less, 1.5 ppm or less, 1.25 ppm or less, 1 ppm or less, 0.75 ppm or less, or 0.5 ppm or less on a weight basis. The slurry composition may be substantially free of the precursor material. Here, the term "precursor material" is meant to include precursor materials that may be used and generated in the process of preparing cerium oxide particles through a wet process, such as a cerium precursor material, a basic material, a solvent, and ammonia.

In one embodiment of the present invention, the slurry composition for chemical mechanical polishing may contains the cerium oxide particles in an amount of 5 wt % or less based on the total weight of the composition. In another embodiment of the present invention, the content of the slurry composition for chemical mechanical polishing based on the total weight of the composition may be 4 wt % or less, 3 wt % or less, 2 wt % or less, 1.5 wt % or less, 1 wt % or less, 0.8 wt % or less, 0.5 wt % or less, 0.4 wt % or less, 0.3 wt % or less, 0.2 wt % or less, 0.2 wt % or less, 0.19 wt % or less, 0.15 wt % or less, 0.12 wt % or less, 0.10 wt % or less, 0.09 wt % or less, or 0.07 wt % or less, and may be 0.0001 wt % or more, or 0.001 wt % or more. Although the slurry composition for chemical mechanical polishing according to the present invention uses a slurry having the same removal rate, it may achieve high oxide removal efficiency even when it contains the cerium oxide particles in small amounts based on the total weight of the slurry composition for chemical mechanical polishing.

In one embodiment of the present invention, the cerium oxide particles may have an average light transmittance of 50% or more, or 60% or more for light having a wavelength of 450 to 800 nm, as measured for an aqueous dispersion containing 1.0 wt % of the cerium oxide particles. Preferably, the average light transmittance may be 70% or more, more preferably 80% or more, and still more preferably 90% or more. In another embodiment of the present invention, the average light transmittance for light having a wavelength of 500 nm may be 0% or more, 55% or more, 60% or more, 65% or more, 70% or more, 75% or more, or 80% or more. In addition, the average light transmittance for light having a wavelength of 600 nm may be 75% or more, 80% or more, 85% or more, or 90% or more. In addition, the average light transmittance for light having a wavelength of 700 nm may be 87% or more, 90% or more, 93% or more, or 95% or more. The fact that the light transmittance value of the slurry composition satisfies the above range means that the primary particle sizes of the cerium oxide particles according to one embodiment of the present invention are small, and their agglomeration into secondary particles is less than conventional ceria particles. When the degree of agglomeration is low as described above, the particles may be uniformly distributed due to their high dispersion stability, and the oxide removal rate can be excellent because the number of particles in contact with a wafer increases. In addition, it can be seen that the particles themselves are fine, and thus a polishing-target layer is polished using a slurry composition containing the particles, the probability of occurrence of defects such as scratches on the surface will be reduced. That is, it can be seen that, in the case of cerium oxide particles having a primary particle size of 10 nm or less, the higher the light transmittance in the visible wavelength region, the better the silicon oxide removal rate.

In one embodiment of the present invention, when Fourier-transform infrared (FT-IR) spectrometry is performed on powder consisting of the cerium oxide particles, the powder consisting of the cerium oxide particles may have an infrared transmittance of 90% or more, or 100% or less, 97% or less, or 95% or less in the range of 3,000 cm$^{-1}$ to 3,600 cm$^{-1}$ in the spectrum measured by the FT-IR spectrometry. In another embodiment of the present invention, the infrared transmittance of the powder in the range of 720 cm$^{-1}$ to 770 cm$^{-1}$ may be 96% or less, and may be 85% or more, 88% or more, more preferably 90% or more, even more preferably 92% or more. The fact that the infrared transmittance in the range of 3,000 cm$^{-1}$ to 3,600 cm$^{-1}$ in the FT-IR spectrum is within the above range may mean that the band by the O—H group is relatively weak, which differs from the FT-IR spectrum of powder consisting of cerium hydroxide particles. In addition, the presence of the peak indicative of the infrared transmittance in the above range at 720 cm$^{-1}$ to 770 cm$^{-1}$ in the FT-IR spectrum of the powder consisting of the cerium oxide particles according to one embodiment of the present invention may mean that Ce—O stretching appears in the above range, which may mean that the particles produced according to one embodiment of the present invention exhibit characteristics of cerium oxide particles.

In one embodiment of the present invention, the slurry composition for chemical mechanical polishing may have a pH of 10 or less, preferably 1 to 9, 1 to 8, or 2 to 7, in consideration of dispersion stability and polishing efficiency. More specifically, if the pH is less than 1, the silicon oxide removal rate may be rapidly lowered and undesirable polishing characteristics may appear, and if the pH is more than 10, undesirable polishing characteristics may appear, or pH stability and dispersion stability may be reduced and agglomeration may occur, which may cause micro-scratches and defects.

In one embodiment of the present invention, the slurry composition for chemical mechanical polishing may contain one or more acidic or basic pH-adjusting agents and buffers capable of adjusting the pH, in consideration of the final pH of the composition, removal rate, removal selectivity, etc. As the pH adjusting agent for adjusting the pH, one capable of adjusting the pH without affecting the properties of the slurry composition chemical mechanical polishing may be used. In one embodiment of the present invention, the pH adjusting agent may be an acidic pH adjusting agent or a basic pH adjusting agent to achieve an appropriate pH.

In one embodiment of the present invention, examples of the pH adjusting agent include at least one selected from among at least one inorganic acid selected from the group consisting of sulfuric acid, hydrochloric acid, nitric acid, and phosphoric acid, at least one organic acid selected from the group consisting of acetic acid, citric acid, glutaric acid, glycolic acid, formic acid, lactic acid, malic acid, malonic acid, maleic acid, oxalic acid, phthalic acid, succinic acid, and tartaric acid, at least one amino acid selected from the group consisting of lysine, glycine, alanine, arginine, valine, leucine, isoleucine, methionine, cysteine, proline, histidine, phenylalanine, serine, tricine, tyrosine, aspartic acid, tryptophan, and aminobutyric acid, imidazole, alkyl amines, alcohol amines, quaternary amine hydroxides, ammonia, or combinations thereof. In particular, the pH adjusting agent may be triethanolamine, tetramethylammonium hydroxide (TMAH or TMAOH), or tetraethylammonium hydroxide (TEAH or TEA-OH). In addition, the pH adjusting agent may be, for example, at least one selected from the group consisting of ammonium methyl propanol (AMP), tetramethyl ammonium hydroxide (TMAH), potassium hydroxide, sodium hydroxide, magnesium hydroxide, rubidium hydroxide, cesium hydroxide, sodium hydrogen carbonate, sodium carbonate, triethanolamine, tromethamine, and niacinamide. Preferably, the pH adjusting agent may be triethanolamine or aminobutyric acid.

In one embodiment of the present invention, the solvent may be any solvent that is used in a slurry composition for chemical mechanical polishing, and for example, deionized water may be used, but the present invention is not limited thereto. In addition, preferably, ultrapure water may also be used. The content of the solvent may be the amount remaining after excluding the amount of the cerium oxide particles and other additional additives from the total amount of the slurry composition for chemical mechanical polishing. In one embodiment of the present invention, the solvent may include water (e.g., deionized water) as an aqueous carrier and may include at least one water-miscible organic solvent. Examples of organic solvents that may be used include alcohols such as propenyl alcohol, isopropyl alcohol, ethanol, 1-propanol, methanol, 1-hexanol and the like; aldehydes such as acetylaldehyde and the like; ketones such as acetone, diacetone alcohol, methyl ethyl ketone and the like; esters such as ethyl formate, propyl formate, ethyl acetate, methyl acetate, methyl lactate, butyl lactate, ethyl lactate and the like; ethers including sulfoxides such as dimethyl sulfoxide (DMSO), tetrahydrofuran, dioxane, diglyme, and the like; amides such as N,N-dimethylformamide, dimethylimidazolidinone, N-methylpyrrolidone and the like; polyhydric alcohols and their derivatives such as ethylene glycol, glycerol, diethylene glycol, diethylene glycol monomethyl ether and the like; and nitrogen-containing organic compounds such as acetonitrile, amylamine, isopropylamine, dimethylamine and the like.

In one embodiment of the present invention, the polishing composition optionally further contains one or more other additives. The polishing composition may contain surfactants and/or rheology modifiers including viscosity enhancers and coagulants (e.g., polymer rheology modifiers such as urethane polymers), biocides (e.g., KATHON™ LX), and the like. Suitable surfactants include, for example, cationic surfactants, anionic surfactants, anionic polyelectrolytes, nonionic surfactants, amphoteric surfactants, fluorinated surfactants, mixtures thereof, and the like.

In one embodiment of the present invention, the slurry composition for chemical mechanical polishing is characterized by having excellent dispersion stability and, in particular, a high removal rate for silicon oxide.

The slurry composition for chemical mechanical polishing may be provided in the form of a one-component slurry composition containing all components such as cerium oxide particles, a solvent, and other additives, and, if necessary, may also be provided in the form of a two-component or three-component slurry composition, wherein the above components are stored separately in two containers or three or more containers and then mixed at or near the time of use. The selection of such presentation forms and storage component combinations are within the knowledge of those skilled in the art, and the overall polishing characteristics and removal rate can be adjusted by varying the mixing ratio.

In one embodiment of the present invention, the slurry composition for chemical mechanical polishing has a silicon oxide removal rate of 1,000 Å/min or more, preferably 2,000 Å/min or more, more preferably 3,000 Å/min or more. Basically, a higher oxide removal rate is better, and the upper limit of the silicon oxide removal rate is not limited, but may preferably be 10,000 Å/min or less, 9,000 Å/min or less, 8,000 Å/min or less, 7,000 Å/min or less, 6,000 Å/min or less, or 5,000 Å/min. In particular, in the case of the slurry composition for chemical mechanical polishing containing cerium oxide particles according to one embodiment of the present invention, the number of particles contained in the composition is larger than that in a slurry composition containing conventional cerium oxide particles because the particle size is small even in the low content range of the cerium oxide particles, and the silicon oxide removal rate may be remarkably increased because Si—O—Ce bonds increase due to a high $Ce^{3+}$ content on the particle surface.

In one embodiment of the present invention, the slurry composition for chemical mechanical polishing may have an oxide-to-polysilicon selectivity of 50 or more, 100 or more, 150 or more, or 200 or more, and may have an oxide-to-polysilicon selectivity of 3,000 or less, 2,000 or less, 1,500 or less, 1,000 or less, 900 or less, or 800 or less. In the case of the oxide-to-polysilicon selectivity, it cannot be ruled out that a selectivity of 3,000 or more can be achieved by appropriately adjusting the content of the cationic polymer.

When the cerium oxide particles are used as an abrasive, chemical bonding of Si—O—Ce occurs due to the high reactivity of cerium oxide with silicon oxide, and thus the cerium oxide removes the silicon oxide lumps from the surface of the silicon oxide layer like peeling, thereby polishing the silicon oxide, unlike mechanical polishing in which only a hydroxide layer formed on a surface is removed. In addition, the cerium oxide powder according to an embodiment of the present invention has low strength due to its small particle size, and thus it may exhibit excellent global planarity during polishing and, at the same time, can solve problems associated with micro-scratches formed by large particles.

Another aspect of the present invention provides
a slurry composition for chemical mechanical polishing containing: cerium oxide particles; a solvent; and a cationic polymer.

In one embodiment of the present invention, the oxide removal rate may increase depending on the content of the cationic polymer. This characteristic is a major technical feature that distinguishes the slurry composition for chemical mechanical polishing according to the present application from a conventional art, and thus will be described in detail below.

In one embodiment of the present application, the cationic polymer may perform two roles in the slurry composition for chemical mechanical polishing according to the present invention. First, the cationic polymer may serve as a stabilizer for the slurry composition, and serve as a pH buffer to ensure particle dispersibility and dispersion stability. In addition, the cationic polymer of the present invention may serve as a polishing accelerator for an oxide layer. In conventional polishing slurries, cationic polymers were added to increase dispersion stability or used for the purpose of protecting field oxides when removing steps, and the oxide removal rate had to be sacrificed in part in order to obtain these characteristics. On the other hand, the cationic polymer added to the polishing slurry of the present invention may not only increase dispersion stability, but also increase the overall removal rate for oxide as the amount of cationic polymer added increases.

In one embodiment of the present application, the content of the cationic polymer may be 0.001 wt % or more, 0.002 wt % or more, 0.003 wt % or more, 0.004 wt % or more, or 0.005 wt % or more, 1 wt % or less, 0.5 wt % or less, 0.1 wt % or less, 0.05 wt % or less, 0.03 wt % or less, or 0.01 wt % or less, based on the total weight of the slurry composition for chemical mechanical polishing. If the content of the cationic polymer is less than 0.001 wt % based on the total weight of the slurry composition for chemical mechanical polishing, it cannot sufficiently function as a polishing accelerator due to its excessively low content, and thus cannot affect the removal rate. If the content is more than 1%, the added cationic polymer may interfere with the process of polishing using cerium oxide, thus reducing the removal rate.

In one embodiment of the present invention, the cationic polymer may be a polymer or copolymer containing an amine group or an ammonium group. In one embodiment of the present invention, for example, the cationic polymer may be selected from among polydiallyldimethyl ammonium chloride, polyallylamine, polyehthyleneimine, polydiallylamine, polypropyleneimine, polyacrylamide-co-diallydimethyl ammonium chloride, polyacrylamide, or combinations thereof. Preferably, the cationic polymer may be selected from among polydiallyldimethyl ammonium chloride, polyallylamine, polyehthyleneimine, polyacrylamide-co-diallydimethyl ammonium chloride, polyacrylamide, poly(trimethylammonioethyl)methacrylate, a dicyandiamide-diethylenetriamine copolymer, a diallyldimethylamine/hydrochloride-acrylamide copolymer, a dicyandiamide-formaldehyde copolymer, or combinations thereof.

A third aspect of the present invention provides
a method for fabricating a semiconductor device, the method comprising a step of polishing using the slurry composition for chemical mechanical polishing.

Detailed description of portions overlapping with those in the first aspect and second aspect of the present invention has been omitted, but the contents described with respect to the first aspect and second aspect of the present invention are likewise applicable to the third aspect even if the description thereof is omitted in the third aspect.

Hereinafter, a method of fabricating a semiconductor device according to a third aspect of the present disclosure will be described in detail.

First, regarding a routine process for shallow trench isolation (STI), photolithography, etching and polishing among processes for planarization of dielectric layers can be classified as commonly applied basic processes.

Isolation between devices may start with a photolithography process, which is a first step. The photolithography process is performed in an auxiliary system called a track and an exposure machine that exposes light to copy a circuit pattern (mask) onto a wafer. First, a photoresist is applied. Since the photoresist has a high viscosity, it is applied thinly onto the dielectric layer while rotating the wafer. The applied photoresist should be of uniform height so that the exposure depth is adequate. If the exposure depth is insufficient during exposure, photoresist residue remains after development and the underlying layer (dielectric layer) is not well removed in the subsequent etching process. After exposure, the wafer is moved back to the track system and a developing process of removing the exposed portion is performed.

As a second step, the etching of STI is a process of removing a portion of the substrate and a dielectric layer (oxide layer+nitride layer) immediately below the developed portion (from which the photoresist has been removed). The etching process may be a dry process or a wet process. The dry etching process is usually a method of etching using a plasma state. Compared to the wet (liquid) etching process, the dry etching process may be advantageous in forming a trench by only etching downward without etching sidewalls (anisotropic etching). In this case, since over-etching may occur, it will be necessary to accurately calculate the etch end point before proceeding. Residues remain after etching, so they can be treated.

Since the photoresist layer is no longer useful after etching the trench by etching, it can be removed through ashing. The ashing process may be preferably performed using plasma, and more accurate ashing may be possible. The shape of the semiconductor device immediately after the ashing process is shown in FIG. 2.

A method of fabricating a semiconductor device according to one embodiment of the present invention may comprise simultaneously polishing a silicon oxide layer, a silicon nitride layer, and a polysilicon layer using the slurry composition for chemical mechanical polishing.

FIGS. 2 to 6 are cross-sectional views illustrating a method of fabricating a semiconductor device according to one embodiment of the present invention.

Figure 2:
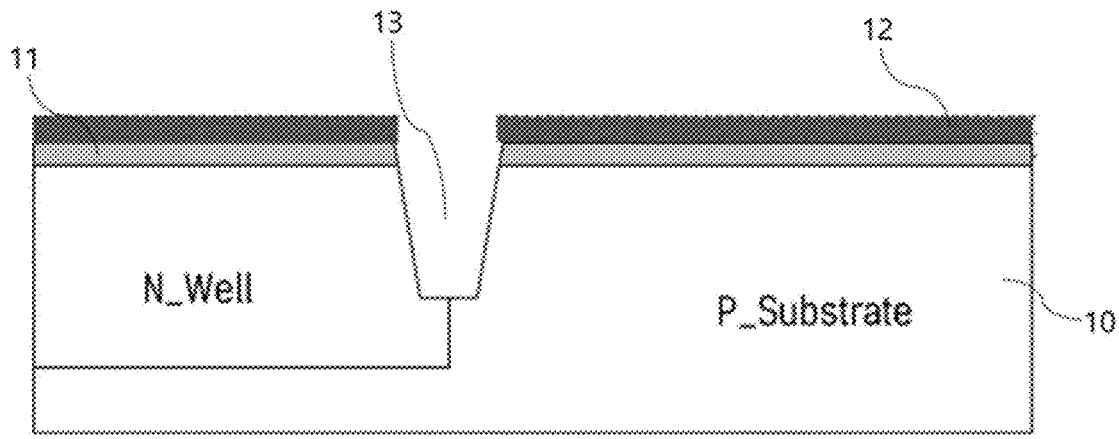
FIGS. 2 to 6 are cross-sectional views illustrating a method of fabricating a semiconductor device according to one embodiment of the present invention.

Referring to FIG. 2, a trench 13 may be formed in an upper layer 11 on an underlying layer 10. For example, the upper layer 11 may be formed on the underlying layer 10 and a nitride layer (polishing stop layer) 12 may be formed on the upper layer 11. The underlying layer 10 may include any material layer. For example, the underlying layer 10 may be a dielectric layer, a conductive layer, a semiconductor layer, or a semiconductor wafer (substrate). The upper layer 11 may include a dielectric layer (oxide layer), a conductive layer, a semiconductor layer, or a combination thereof.

When the upper layer 11 includes a plurality of stacked dielectric layers, the dielectric layers may be of the same type or different types. For example, the upper layer 11 may include alternately and repeatedly stacked silicon oxide layers and silicon nitride layers. The upper layer 11 may further include a semiconductor layer and a lower dielectric layer under the silicon oxide layers and the silicon nitride layers. For example, the lower dielectric layer may be disposed below the semiconductor layer.

The nitride layer (polishing stop layer) 12 may be formed to have a relatively large thickness (e.g., 100 Å to 4,000 Å) by depositing, for example, silicon nitride (e.g., SiN), polysilicon, metal nitride (e.g., TiN), metal, or the like. A trench 13 may be formed through an etching process or a drilling process. The trench 13 may have a depth that penetrates the nitride layer (polishing stop layer) 12 and the upper layer 11 to reach the underlying layer 10. For example, the trench 13 may have a sufficient depth to expose the underlying layer 10.

Figure 3:
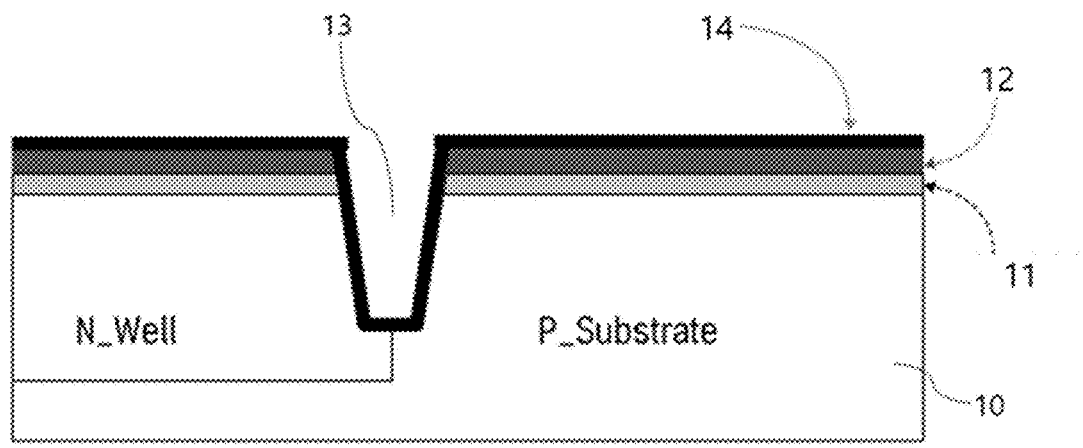

Referring to FIG. 3, STI may be formed of a double oxide layer. First, before the trench 13 is filled with a dielectric material, it is coated thinly with a liner oxide layer as a first dielectric layer 14 by a diffusion method. It may be considered that the first dielectric layer facilitates forming a second dielectric layer on the silicon substrate using CVD deposition in a subsequent step. When the trench 13 is filled by high-density plasma CVD (HDPCVD) according to another embodiment of the present invention, it can also function to prevent damage from plasma containing high energy. According to one embodiment of the present invention, as the first dielectric layer (liner oxide layer, a thin layer such as a gate oxide layer may be formed by injecting oxygen gas into a furnace for diffusion and heating to a high temperature. According to another embodiment of the present invention, a nitride layer may be used instead of an oxide layer.

Figure 4:
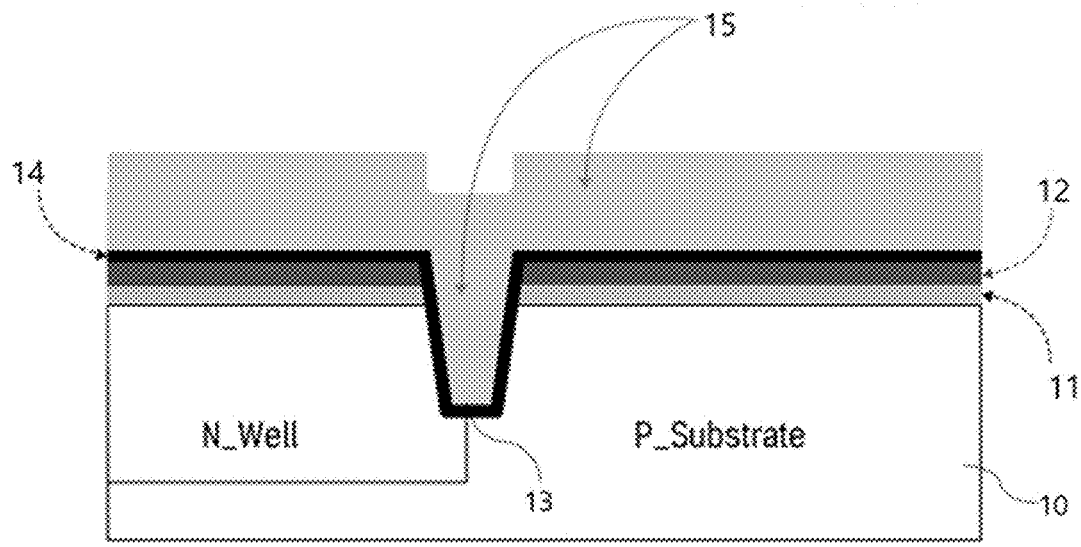

Referring to FIG. 4, a first dielectric layer 14 and a second dielectric layer 15 filling the trench 13 may be formed by depositing a plurality of dielectric materials. The first dielectric layer 14 and the second dielectric layer 15 may have different densities and different deposition rates. According to embodiments of the present invention, the first dielectric layer 14 may be formed by depositing a high-density dielectric material, and the second dielectric layer 15 may be formed by depositing a low-density dielectric material. For example, the first dielectric layer 14 may be formed by depositing and patterning a high-density plasma (HDP) oxide. The first dielectric layer 14 may be formed to extend along the inner surface of the trench 13. For example, the first dielectric layer 14 may have a U or pipe shape opening upward.

Since the first dielectric layer 14 has a high density, voids are hardly generated in the first dielectric layer 14, and accordingly, cracks originating from voids are eliminated or significantly reduced during the subsequent heat treatment process. The second dielectric layer 15 may be formed, for example, by depositing tetraethylorthosilicate (TEOS) oxide to a thickness sufficient to cover the polishing stop layer 12 while filling the trench 13 on which the first dielectric layer 14 is formed. The second dielectric layer 15 may be formed at a higher deposition rate than that of the first dielectric layer 14. Due to the high deposition rate of the second dielectric layer 15, the trench 13 may be filled with the second dielectric layer 15 relatively quickly.

According to another embodiment of the present invention, although not shown, the second dielectric layer 15 may be partially removed to leave the second dielectric layer 15 on the trench 13. For example, the second dielectric layer 15 may be selectively removed to define or open a specific region such as a cell memory region of a semiconductor device through a photolithography process and an etching process. Accordingly, part or all of the second dielectric layer 15 on the polishing stop layer 12 may be removed, and the second dielectric layer 15 may remain on the trench 13. The opening process for the specific region may be selectively performed, and may not necessarily be performed.

Figure 5:
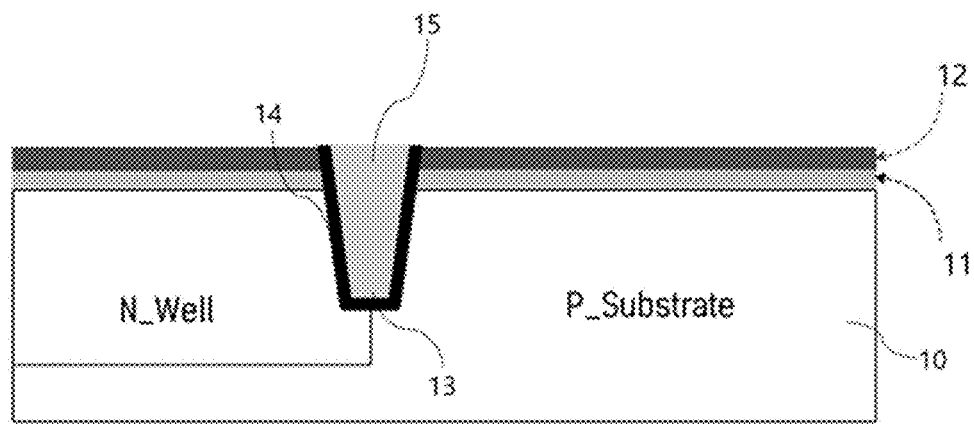

Referring to FIG. 5, a planarization process may be performed on the second dielectric layer 15. For example, the second dielectric layer 15 may be planarized using a chemical mechanical polishing (CMP) process. The chemical mechanical polishing process may continue until the nitride layer (polishing stop layer 12) is exposed. The chemical mechanical polishing process may be performed after the formation of the second dielectric layer 15 of FIG. 4. In this case, since the surface of the nitride layer (polishing stop layer 12) is relatively flat or is not flat but the non-flatness thereof is severe, the chemical mechanical polishing process can be easily performed.

Figure 6:
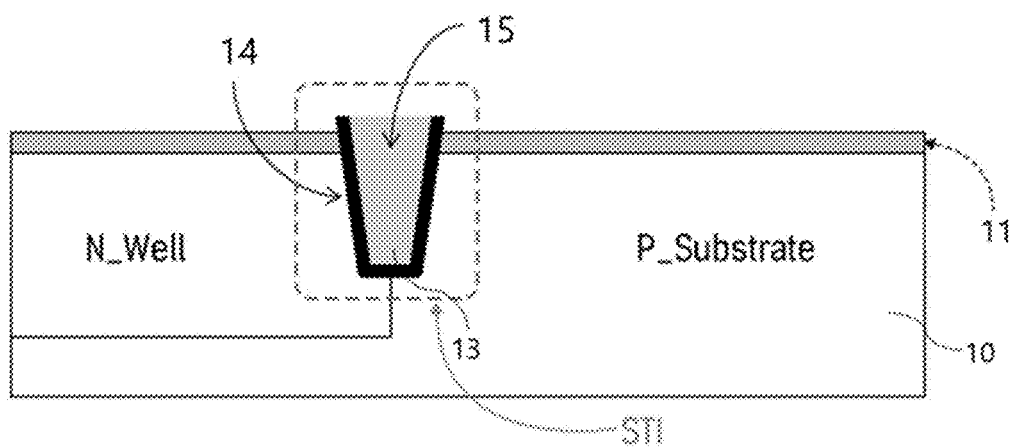

Next, referring to FIG. 6, the nitride layer may be removed, thus forming an STI. The purpose of the nitride layer is to protect the upper layer 11 so that the upper layer 11 is not affected by the first dielectric layer 14. Since the upper layer 11 may be a gate oxide layer that is thin and requires high reliability, it needs to be handled carefully. When the nitride layer is removed by an etching process (wet process), the wafer may be immersed in a chemical solution so that the oxide layer is not etched and only the nitride layer is etched. To this end, a solution having a high selectivity (etch rate) to the nitride layer may be used. In another embodiment of the present invention, even the nitride layer may be removed by CMP. In this case, it may not be necessary to etch the nitride layer, but since there is a possibility of physically damaging the oxide layer, it is preferable to chemically treat the nitride layer by etching to protect the oxide layer.

Figure 7:
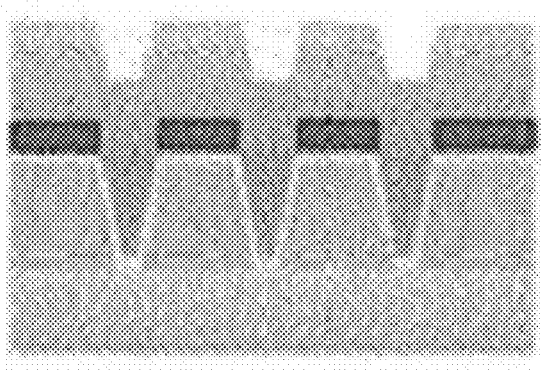
FIGS. 7 and 8 show sequential steps of chemical mechanical polishing and the structure of a chemical mechanical polishing (CMP) system, according to another embodiment of the present invention.
Figure 7:
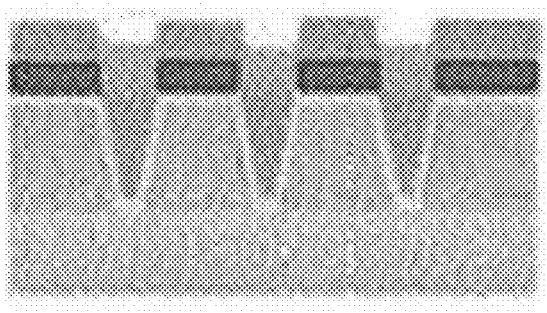
Figure 7:
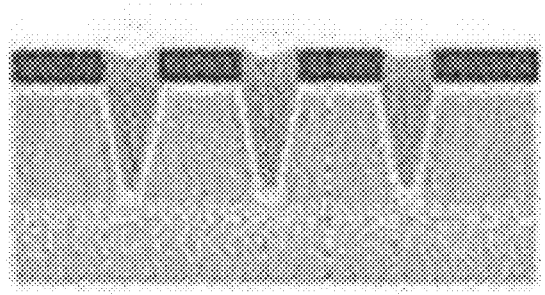
Figure 7:
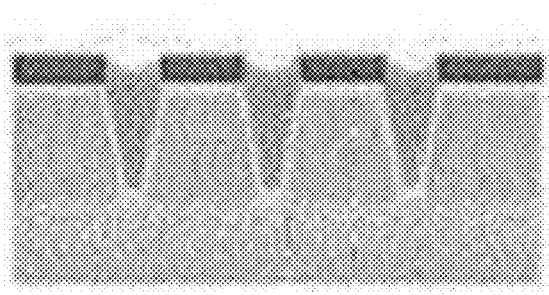

According to another embodiment of the present invention, the chemical mechanical polishing (CMP) process completely removes the first dielectric layer 14 and the second dielectric layer 15 on the nitride layer (polishing stop film, 12) after gap filling, thereby isolating the active region and the field region from each other, and the process may be broadly divided into three steps as shown in FIG. 7.

In the first step, local planarization is performed while performing bulk CMP of the second dielectric layer 15 in a platen. In the second step, the second dielectric layer 15, the step of which has been alleviated in the platen, is cleaned or polished, and the polishing is stopped at the point where the nitride layer (polishing stop layer 12) is exposed. At this time, end point detection (EPD) is used to detect the time point at which the nitride layer is exposed. In the third step, targeting may be performed by removing residues of the second dielectric layer film 15 that may remain on the nitride layer (polishing stop layer) 12 in the platen and polishing the nitride layer and oxide layer.

Figure 8:
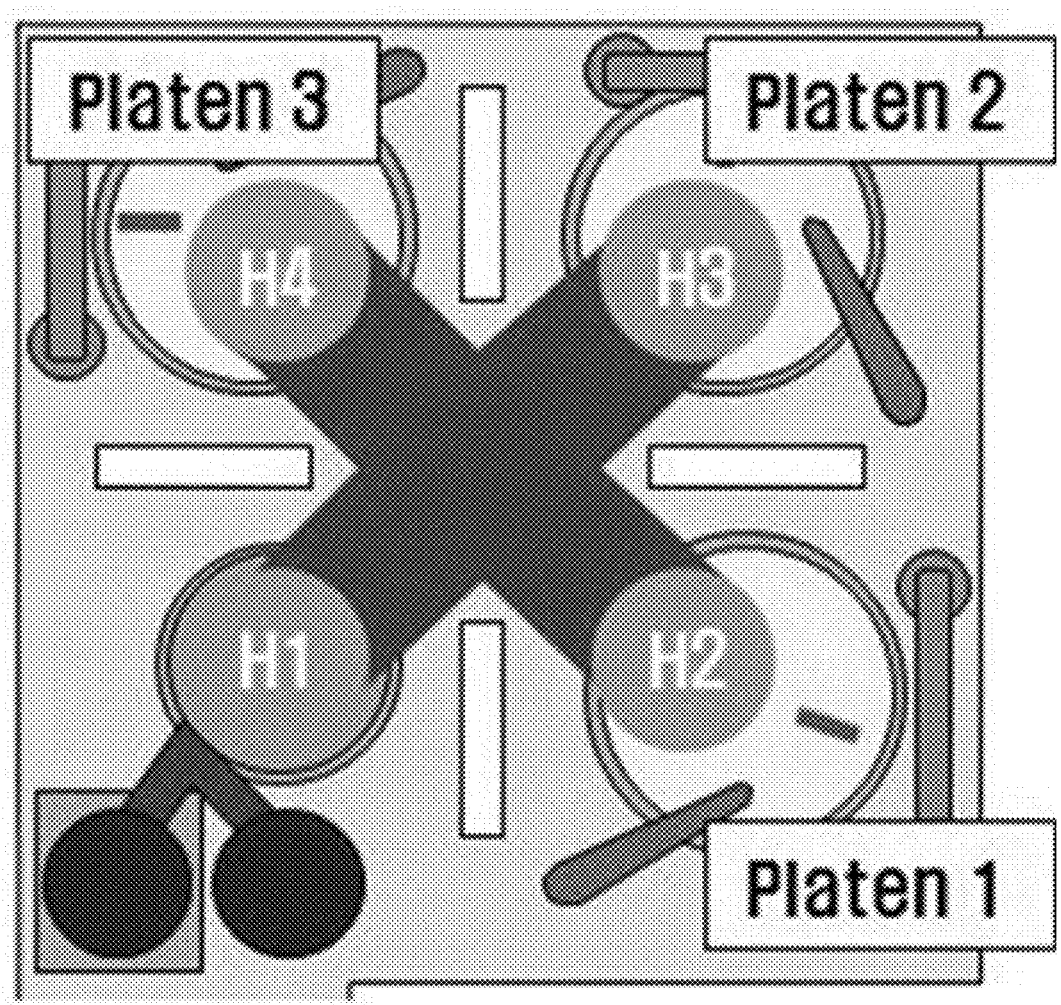

FIG. 8 shows the structure of a chemical mechanical polishing (CMP) system according to one embodiment of the present invention. This system is characterized in that it consists of three platens, and as described above, it may be a structure in which sequential STI CMP polishing steps are performed through platens 1, 2, and 3, respectively. After completion of the polishing, the wafer moves to a cleaning unit, and after completion of cleaning, the process is ended.

In addition, in the method for fabricating a semiconductor device according to one embodiment of the present invention, a method of simultaneously polishing a silicon oxide layer, a silicon nitride layer and a polysilicon layer using the slurry composition for chemical mechanical polishing may be performed using any polishing method and conditions that are commonly used in a conventional art, and this method is not particularly limited in the present invention.

The slurry composition for chemical mechanical polishing according to one embodiment of the present invention has high dispersion stability, and the $Ce^{3+}$ content on the surfaces of the cerium oxide particles contained in the slurry composition is high. Thus, the removal rate for a silicon-containing substrate may be increased by a mechanism that forms Si—O—Ce between silica and cerium. Accordingly, the slurry composition may be effectively used to remove a silicon oxide layer from the surface of a semiconductor device in a CMP process even when it has a low content of ceria.

A fifth aspect of the present invention provides
a semiconductor device comprising: a substrate; and a trench filled with a dielectric material on the substrate, wherein the trench is formed by polishing at least one layer, selected from the group consisting of a silicon oxide layer, a silicon nitride layer and a polysilicon layer, by using the slurry composition for chemical mechanical polishing, the slurry composition for chemical mechanical polishing contains cerium oxide particles and a solvent, and the cerium oxide particles have a light transmittance of 50% or more for light having a wavelength of 500 nm, as measured for an aqueous dispersion containing 1.0 wt % of the cerium oxide particles.

Detailed description of portions overlapping with those in the first to third aspects of the present invention has been omitted, but the contents described with respect to the first to third aspects of the present invention are likewise applicable to the fourth aspect even if the description thereof is omitted in the fourth aspect.

A fifth aspect of the present invention provides
a method for producing cerium oxide particles for chemical mechanical polishing, the method comprising steps of: preparing a raw material precursor; and milling or precipitating cerium oxide particles in a solution containing the raw material precursor to obtain a dispersion of cerium oxide particles for chemical mechanical polishing, wherein the cerium oxide particles have a light transmittance of 50% or more for light having a wavelength of 500 nm, as measured for an aqueous dispersion containing 1.0 wt % of the cerium oxide particles.

Detailed description of portions overlapping with those in the first to fourth aspects of the present invention has been omitted, but the contents described with respect to the first to fourth aspects of the present invention are likewise applicable to the fifth aspect even if the description thereof is omitted in the fifth aspect.

In one embodiment of the present invention, the method may comprise a step of preparing a raw material precursor. As the raw material precursor, any precursor material may be used without limitation as long as it is a precursor material capable of producing cerium oxide particles as a product.

In one embodiment of the present invention, the method may comprise a step of milling or precipitating cerium oxide particles in a solution containing the raw material precursor to obtain a dispersion of cerium oxide particles for chemical mechanical polishing. The step of milling cerium oxide particles in a solution containing the raw material precursor may be may be performed using, for example, a milling process, and the milling method may be determined within the common knowledge of a person skilled in the art without limitation. When the method comprises a step of precipitating cerium oxide particles in a solution containing the raw material precursor to obtain a dispersion of cerium oxide particles, it may further comprises a step of removing the supernatant or a filtering step.

In one embodiment of the present invention, the cerium precursor may be at least one selected from the group consisting of cerium ammonium nitrate, cerium nitrate, cerium ammonium sulfate, cerium acetate, cerium chloride, cerium hydroxide, and cerium oxide.

In one embodiment of the present invention, the filtering step may be performed using a non-limiting filtration device, more preferably a filtration device equipped with a membrane. In the case of cerium oxide particles produced by the method according to one embodiment of the present invention, it can be understood that the cerium oxide particles are synthesized in high yield and the cerium precursor material is almost removed through an additional filtration step.

The above description of the present invention is exemplary, and those of ordinary skill in the art will appreciate that the present invention can be easily modified into other specific forms without departing from the technical spirit or essential characteristics of the present invention. Therefore, it should be understood that the exemplary embodiments described above are exemplary in all aspects and are not restrictive. For example, each component described to be of a single type can be implemented in a distributed manner. Likewise, components described to be distributed can be implemented in a combined manner.

The scope of the present invention is defined by the following claims rather than by the detailed description of the invention. It shall be understood that all modifications and embodiments conceived from the meaning and scope of the claims and their equivalents are included in the scope of the present invention.

INDUSTRIAL APPLICABILITY

The cerium oxide particles according to one embodiment of the present invention, when contained in a slurry for chemical mechanical polishing, may exhibit a high oxide removal rate even at a low cerium oxide particle content despite their small particle size as a result of increasing the proportion of $Ce^{3+}$ on the cerium oxide surface.

According to one embodiment of the present invention, it is possible to provide cerium oxide particles for chemical mechanical polishing and a slurry composition for chemical mechanical polishing, which may minimize wafer surface defects and exhibit a maximized oxide removal rate while minimizing surface defects, unlike the correlation between surface defects and oxide removal rate, which is considered a trade-off relationship in a conventional art.

In addition, according to one embodiment of the present invention, it can be confirmed that, when a cationic polymer is added, the oxide removal rate is further increased and, at the same time, the oxide-to-polysilicon selectivity is increased. Considering that it is common knowledge in the prior art that a cationic polymer is added in order to ensure other properties while sacrificing the removal rate, these effects exhibited by the addition of the cationic polymer may be regarded as unique effects of the present invention.

Effects of the present invention are not limited to the above-described effects, and should be understood to include all effects that may be deduced from the features of the present invention, described in the detailed description of the present invention or the appended claims.

The invention claimed is:

1. Cerium oxide particles for chemical mechanical polishing,
    wherein when the cerium oxide particles are contained in a polishing slurry for chemical mechanical polishing, they may be monodispersed,
    wherein an electron 20 energy loss spectroscopy (EELS) spectrum of the cerium oxide particles includes a first peak at 876.5 to 886.5 eV and a second peak at 894.5 to 904.5 eV, wherein a maximum intensity of the first peak is greater than a maximum intensity of the second peak,
    wherein the electron energy loss spectroscopy (EELS) spectrum further includes a third peak at 886.5 to 889.5 eV and a fourth peak at 904.5 to 908.5 eV, wherein a ratio ((P1+P2)/Pt) of a sum of an area (P1) of the third peak and an area (P2) of the fourth peak to a total area (Pt) of the peaks in the spectrum is 0.1 or less, and
    wherein the cerium oxide particles have a light transmittance of 50% or more for light having a wavelength of 500 nm, as measured for an aqueous dispersion containing 10 wt % of the cerium oxide particles.

2. The cerium oxide particles according to claim 1, which have a light transmittance of 50% or more for light having a wavelength of 450 to 800 nm, as measured for the aqueous dispersion containing 1.0 wt % of the cerium oxide particles.

3. The cerium oxide particles according to claim 1, which have a secondary particle size of 1 to 30 nm, as measured by a dynamic light scattering (DLS) particle size analyzer.

4. The cerium oxide particles according to claim 1, which have a secondary particle size of 1 to 20 nm, as measured by a dynamic light scattering (DLS) particle size analyzer.

5. The cerium oxide particles according to claim 1, which have a primary particle size of 0.5 to 15 nm, as measured by X-ray diffraction (XRD) analysis.

6. Cerium oxide particles for chemical mechanical polishing,
    wherein when the cerium oxide particles are contained in a polishing slurry for chemical mechanical polishing, they may be monodispersed,
    wherein, when surfaces of the cerium oxide particles are analyzed by X-ray photoelectron spectrometry (XPS), XPS peaks that represent Ce—O binding energy representing Ce3+ on the surfaces include a first peak at 900.2 to 902.2 eV, a second peak at 896.4 to 898.4 eV, a third peak at 885.3 to 887.3 eV, and a fourth peak at 880.1 to 882.1 eV,
    wherein, when the surfaces of the cerium oxide particles are analyzed by X-ray photoelectron spectrometry (XPS), a ratio of a sum of XPS peak areas, which represent the Ce—O binding energy representing $Ce^{3+}$ on the surfaces, to a sum of XPS peak areas which represent the Ce—O binding energy on the surfaces, is 0.29 to 0.70, and
    wherein the cerium oxide particles have a light transmittance of 50% or more for light having a wavelength of 500 nm, as measured for an aqueous dispersion containing 1.0 wt % of the cerium oxide particles.

7. A slurry composition for chemical mechanical polishing containing:
    cerium oxide particles according to claim 1; and a solvent,
    wherein the cerium oxide particles have a light transmittance of 50% or more for light having a wavelength of 500 nm, as measured for an aqueous dispersion containing 1.0 wt % of the cerium oxide particles.

8. The slurry composition according to claim 7, wherein the cerium oxide particles are contained in an amount of 0.01 to 5 parts by weight based on 100 parts by weight of the slurry composition.

9. The slurry composition according to claim 7, wherein the composition has a pH of 2 to 10.

10. The slurry composition according to claim 7, wherein the slurry composition further contains at least one selected from among at least one inorganic acid selected from the group consisting of sulfuric acid, hydrochloric acid, nitric acid, and phosphoric acid, at least one organic acid selected from the group consisting of acetic acid, citric acid, glutaric acid, glycolic acid, formic acid, lactic acid, malic acid, malonic acid, maleic acid, oxalic acid, phthalic acid, succinic acid, and tartaric acid, at least one amino acid selected from the group consisting of lysine, glycine, alanine, arginine, valine, leucine, isoleucine, methionine, cysteine, proline, histidine, phenylalanine, serine, tricine, tyrosine, aspartic acid, tryptophan, and aminobutyric acid, imidazole, alkyl amines, alcohol amines, quaternary amine hydroxides, ammonia, or combinations thereof.

11. The slurry composition according to claim 7, wherein the solvent is deionized water.

12. The slurry composition according to claim 7, wherein the slurry composition has a silicon oxide removal rate of 1,000 to 5,000 Å/min.

13. A method for fabricating a semiconductor device, the method comprising a step of polishing using the slurry composition for chemical mechanical polishing according to claim 7.

* * * * *